(12) United States Patent
Iwaki et al.

(10) Patent No.: US 10,984,703 B2
(45) Date of Patent: Apr. 20, 2021

(54) SEMICONDUCTOR DEVICE, DISPLAY SYSTEM WHICH CORRECTS IMAGE DATA, AND ELECTRONIC DEVICE

(71) Applicant: SEMICONDUCTOR ENERGY LABORATORY CO., LTD., Atsugi (JP)

(72) Inventors: Yuji Iwaki, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/485,938

(22) PCT Filed: Mar. 13, 2018

(86) PCT No.: PCT/IB2018/051632
§ 371 (c)(1),
(2) Date: Aug. 14, 2019

(87) PCT Pub. No.: WO2018/172881
PCT Pub. Date: Sep. 27, 2018

(65) Prior Publication Data
US 2020/0027388 A1 Jan. 23, 2020

(30) Foreign Application Priority Data
Mar. 24, 2017 (JP) .............................. JP2017-058778
Apr. 4, 2017 (JP) .............................. JP2017-074244

(51) Int. Cl.
G06F 3/038 (2013.01)
G09G 5/00 (2006.01)
(Continued)

(52) U.S. Cl.
CPC ............. *G09G 3/32* (2013.01); *G06N 3/0454* (2013.01); *G06N 3/08* (2013.01); *H01L 27/1052* (2013.01);
(Continued)

(58) Field of Classification Search
None
See application file for complete search history.

(56) References Cited

U.S. PATENT DOCUMENTS 8,411,932 B2 4/2013 Liu et al.
8,872,900 B2 10/2014 Park
(Continued)

FOREIGN PATENT DOCUMENTS

CN 101938670 A 1/2011
CN 102812715 A 12/2012
(Continued)

OTHER PUBLICATIONS

International Search Report (Application No. PCT/IB2018/051632) dated Jun. 26, 2018.
(Continued)

Primary Examiner — Kirk W Hermann
(74) Attorney, Agent, or Firm — Nixon Peabody LLP; Jeffrey L. Costellia

(57) ABSTRACT

To provide a semiconductor device or display system. To provide a semiconductor device or display system that can display stereoscopic images. A signal generation unit has a function of, with the use of artificial intelligence, obtaining information on a scene of an image and information on a depth of the image and correcting image data on the basis of the information so that a stereoscopic effect is emphasized. An image signal obtained by the correction of the image data is supplied to a display unit, so that a stereoscopic image can be displayed on a display region.

15 Claims, 30 Drawing Sheets

(51) Int. Cl.
*G09G 3/32* (2016.01)
*H01L 27/105* (2006.01)
*H01L 27/12* (2006.01)
*H01L 29/786* (2006.01)
*G06N 3/04* (2006.01)
*G06N 3/08* (2006.01)

(52) U.S. Cl.
CPC ........ *H01L 27/124* (2013.01); *H01L 27/1207* (2013.01); *H01L 27/1225* (2013.01); *H01L 27/1255* (2013.01); *H01L 29/7869* (2013.01); *H01L 29/78648* (2013.01); *G09G 2354/00* (2013.01)

(56) References Cited

U.S. PATENT DOCUMENTS

| | | |
|---|---|---|
| 9,065,077 B2 | 6/2015 | Hung et al. |
| 9,153,171 B2 | 10/2015 | Sakariya et al. |
| 9,317,957 B2 | 4/2016 | Okada et al. |
| 9,626,908 B2 | 4/2017 | Sakariya et al. |
| 9,773,832 B2 | 9/2017 | Kurokawa |
| 9,959,815 B2 | 5/2018 | Sakariya et al. |
| 10,031,554 B2 | 7/2018 | Yanagisawa |
| 10,074,687 B2 | 9/2018 | Kurokawa |
| 10,380,952 B2 | 8/2019 | Sakariya et al. |
| 2004/0032980 A1* | 2/2004 | Harman ............... H04N 19/597 382/154 |
| 2010/0014781 A1 | 1/2010 | Liu et al. |
| 2013/0010077 A1 | 1/2013 | Nguyen et al. |
| 2013/0195347 A1* | 8/2013 | Okada ................. H04N 13/128 382/154 |
| 2013/0337596 A1 | 12/2013 | Hung et al. |
| 2014/0151686 A1* | 6/2014 | Yamazaki ........... H01L 27/1225 257/43 |
| 2014/0168037 A1 | 6/2014 | Sakariya et al. |
| 2015/0294626 A1* | 10/2015 | Bi ....................... G09G 3/3233 345/211 |
| 2016/0350930 A1* | 12/2016 | Lin ........................ G06K 9/66 |
| 2017/0103688 A1* | 4/2017 | Bi ........................ G09G 3/3291 |
| 2017/0142394 A1* | 5/2017 | Peterson ............... H04N 13/261 |
| 2018/0053466 A1* | 2/2018 | Zhang ................... G01L 1/2281 |

FOREIGN PATENT DOCUMENTS

| | | |
|---|---|---|
| CN | 103226810 A | 7/2013 |
| CN | 103515544 A | 1/2014 |
| CN | 104919900 A | 9/2015 |
| EP | 2268045 A | 12/2010 |
| EP | 2670148 A | 12/2013 |
| JP | 2012-122816 A | 6/2012 |
| JP | 2012-253644 A | 12/2012 |
| JP | 2013-157671 A | 8/2013 |
| JP | 2013-172214 A | 9/2013 |
| JP | 2016-508231 | 3/2016 |
| JP | 2016-110117 A | 6/2016 |
| KR | 2015-0085046 A | 7/2015 |
| TW | 201005673 | 2/2010 |
| WO | WO-2014/099499 | 6/2014 |

OTHER PUBLICATIONS

Written Opinion (Application No. PCT/IB2018/051632) dated Jun. 26, 2018.
Hao.W et al., "A 2D-to-3D chip and its application to TV systems", 2011 International Conference on 3D Imaging (IC3D), Dec. 7, 2011, pp. 1-5.
Lin,C et al., "A sum-of-product neural network (SOPNN)", Neurocomputing, 2000, vol. 30, No. 1-4, pp. 273-291.
Liu. Y et al., "Highly Flexible Electronics from Scalable Vertical Thin Film Transistors", NANO LETTERS, Feb. 6, 2014, vol. 14, No. 3, pp. 1413-1418.
European Search Report (Application No. 18771624.6) dated Nov. 10, 2020.
Chinese Office Action (Application No. 201660015034.4) dated Feb. 1, 2021.

* cited by examiner

FIG. 7A
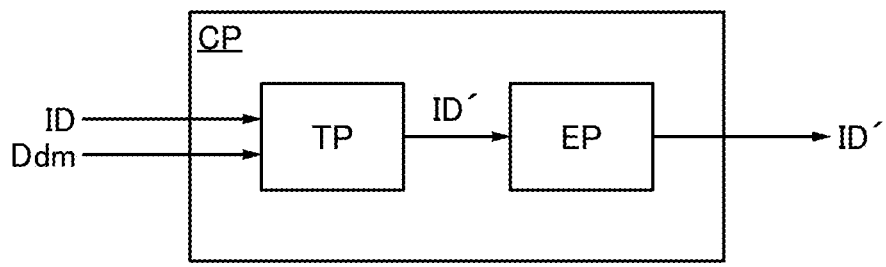
FIG. 7B1
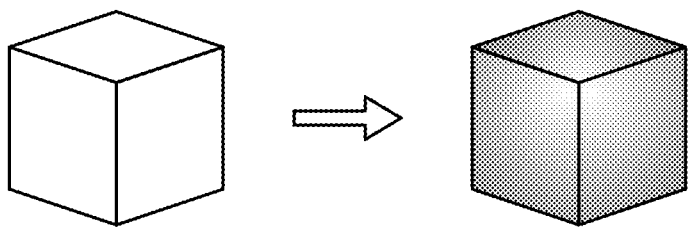
FIG. 7B2
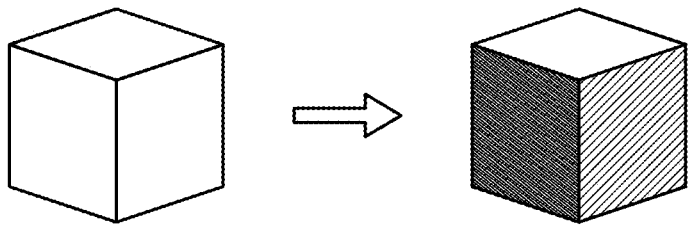
FIG. 7B3
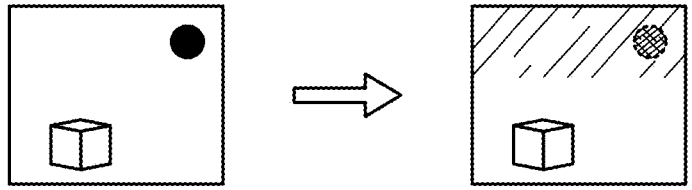
FIG. 7B4
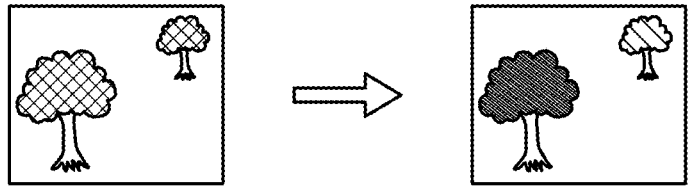

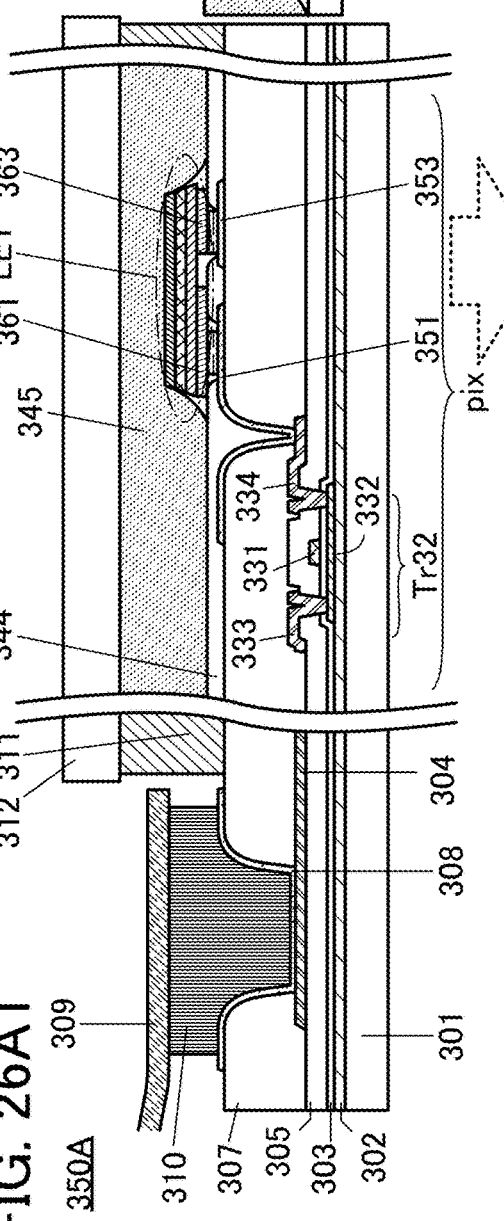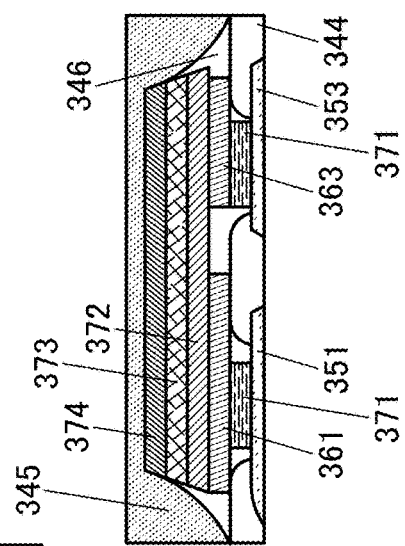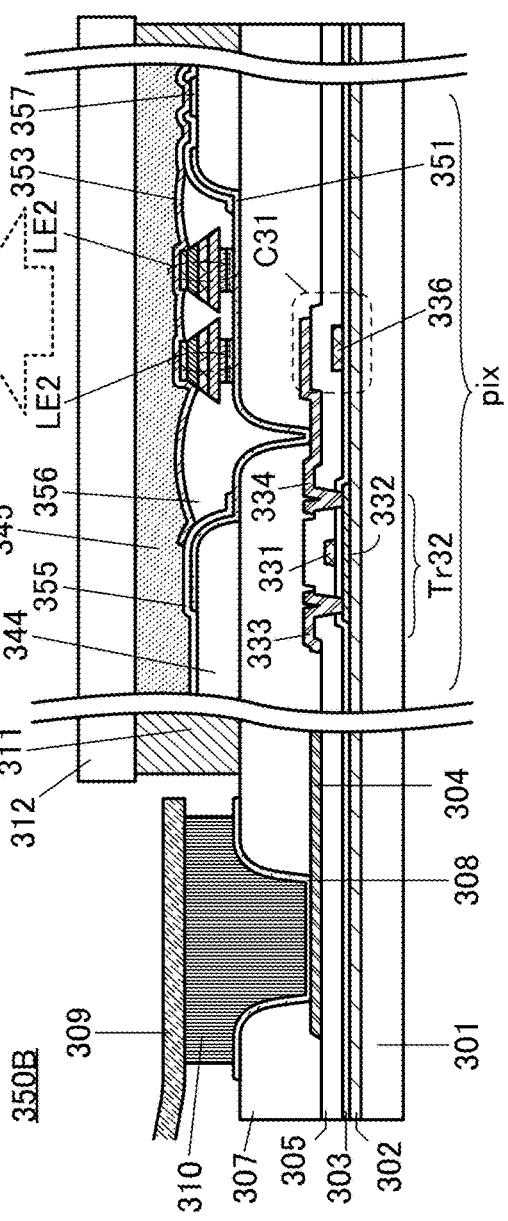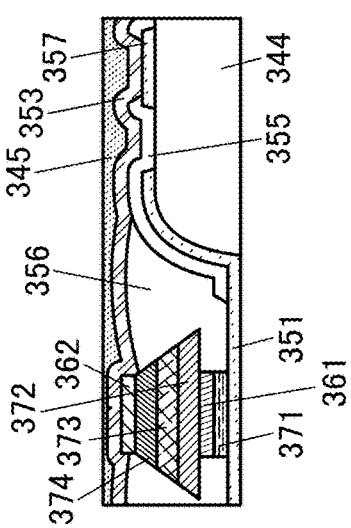

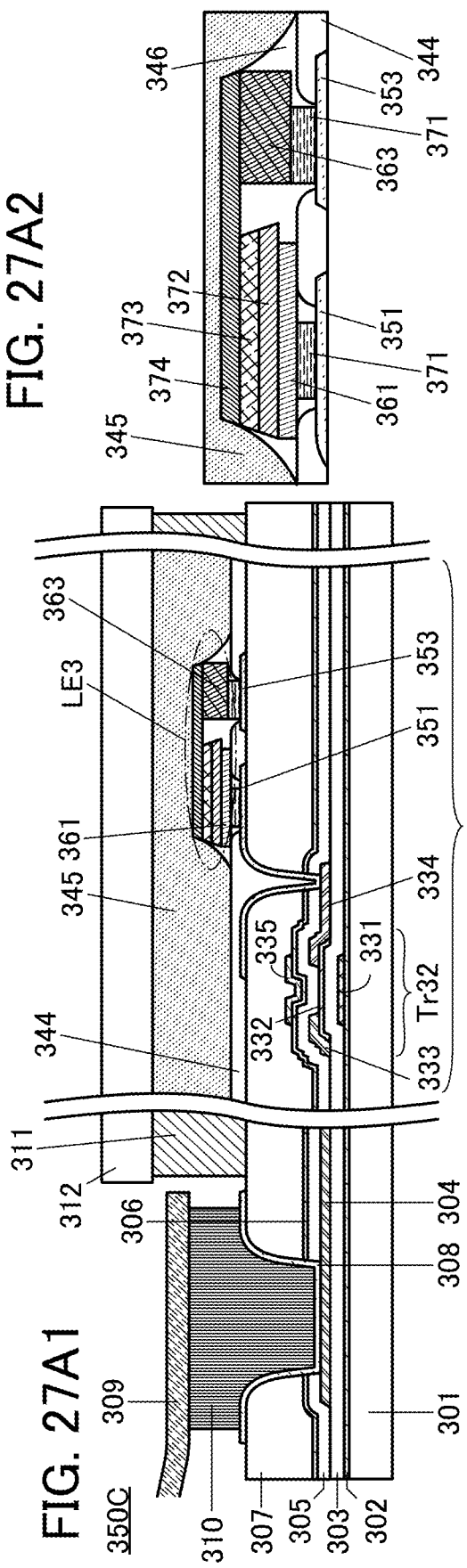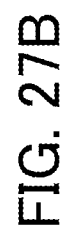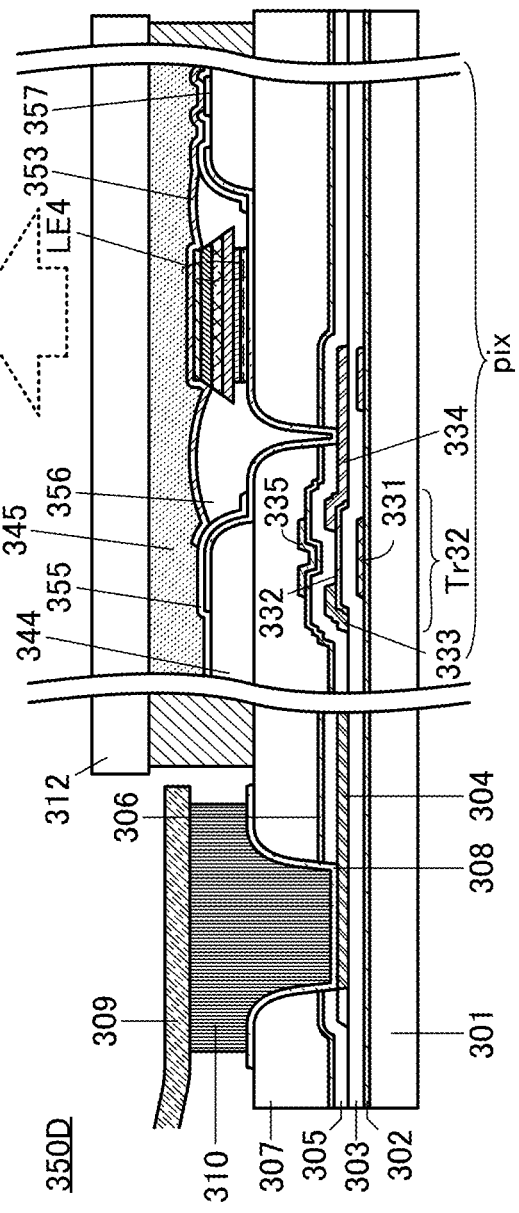

# SEMICONDUCTOR DEVICE, DISPLAY SYSTEM WHICH CORRECTS IMAGE DATA, AND ELECTRONIC DEVICE

TECHNICAL FIELD

One embodiment of the present invention relates to a semiconductor device, a display system, and an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are embodiments of the semiconductor device. In addition, a display device, an imaging device, an electro-optical device, a power generation device (including a thin film solar cell, an organic thin film solar cell, and the like), and an electronic device may include a semiconductor device.

BACKGROUND ART

Uses for a display device are diversified in recent years, and for example, the display device is used for a portable information terminal, a television device for home use (also referred to as a TV or a television receiver), digital signage, a PID (Public Information Display), and the like.

Examples of the display device include, typically, a light-emitting device including a light-emitting element such as an organic EL (Electro Luminescence) element or a light-emitting diode (LED), a liquid crystal display device, and electronic paper performing display by an electrophoretic method or the like. Patent Document 1 discloses a display device that can provide a stereoscopic effect or a sense of depth by using a display unit having a curved surface.

PRIOR ART DOCUMENT

Patent Document

[Patent Document 1] Japanese Published Patent Application No. 2016-110117

SUMMARY OF THE INVENTION

Problems to be Solved by the Invention

An object of one embodiment of the present invention is to provide a novel semiconductor device or display system. Another object of one embodiment of the present invention is to provide a semiconductor device or display system that can display stereoscopic images. Another object of one embodiment of the present invention is to provide a versatile semiconductor device or display system. Another object of one embodiment of the present invention is to provide a semiconductor device or display system with a simplified structure. Another object of one embodiment of the present invention is to provide a semiconductor device or display system with low power consumption.

Note that one embodiment of the present invention does not necessarily achieve all the above objects and only needs to achieve at least one of the objects. The description of the above objects does not preclude the existence of other objects. Objects other than the above will be apparent from the description of the specification, the claims, the drawings, and the like, and objects other than the above can be derived from the description of the specification, the claims, the drawings, and the like.

Means for Solving the Problems

A semiconductor device of one embodiment of the present invention includes a first obtaining unit, a second obtaining unit, a selection unit, and a correction unit. The first obtaining unit has a function of obtaining first information on a scene of an image. The second obtaining unit has a function of obtaining second information on a depth of an image. The selection unit has a function of selecting a depth map suitable for an emphasis of a stereoscopic effect of an image on the basis of the first information and the second information. The correction unit has a function of correcting image data on the basis of the depth map. The selection unit includes a neural network. The second information is input to an input layer of the neural network. A selection result of the depth map is output from an output layer of the neural network.

In the semiconductor device of one embodiment of the present invention, the first obtaining unit may have a function of obtaining the first information using machine learning, and the second obtaining unit may have a function of obtaining the second information using machine learning.

In the semiconductor device of one embodiment of the present invention, the correction unit may include a conversion unit and an emphasis unit, the correction unit has a function of correcting image data, and the emphasis unit may have a function of performing processing for emphasizing a stereoscopic effect on the image data corrected by the correction unit.

In the semiconductor device of one embodiment of the present invention, the neural network may include a product-sum operation element, the product-sum operation element may include a memory circuit including a first transistor, a second transistor, and a capacitor, one of a source and a drain of the first transistor may be electrically connected to a gate of the second transistor and the capacitor, and the first transistor may include a metal oxide in a channel formation region.

A display system of one embodiment of the present invention includes a signal generation unit and a display unit each including the above semiconductor device. The signal generation unit has a function of generating an image signal using the corrected image data. The display unit has a function of displaying an image on the basis of the image signal.

In the display system of one embodiment of the present invention, the display unit may include a display panel, and the display panel may have flexibility.

A display system of one embodiment of the present invention includes a display unit and a signal generation unit. The display unit includes a display panel. The display panel includes a display element and a first transistor. The display element is electrically connected to the first transistor. The display element includes a micro light-emitting diode (hereinafter, also referred to as a micro LED). The first transistor includes a metal oxide in a channel formation region. The signal generation unit has a function of correcting image data and a function of generating an image signal using the corrected image data. The display unit has a function of displaying an image on the basis of the image signal.

A display system of one embodiment of the present invention includes a display unit and a signal generation unit. The display unit includes a display panel. The display panel includes a display element. The display element includes a micro light-emitting diode. The signal generation unit includes a first transistor. The first transistor includes a metal oxide in a channel formation region. The signal generation unit has a function of correcting image data and a function of generating an image signal using the corrected image data. The display unit has a function of displaying an image on the basis of the image signal.

A display system of one embodiment of the present invention includes a display unit and a signal generation unit. The display unit includes a display panel. The display panel includes a display element and a first transistor. The display element is electrically connected to the first transistor. The display element includes a micro light-emitting diode. The first transistor includes a metal oxide in a channel formation region. The signal generation unit includes a second transistor. The second transistor includes a metal oxide in a channel formation region. The signal generation unit has a function of correcting image data and a function of generating an image signal using the corrected image data. The display unit has a function of displaying an image on the basis of the image signal.

In the display system of one embodiment of the present invention, the signal generation unit may include a first obtaining unit, a second obtaining unit, a selection unit, and a correction unit. The first obtaining unit may have a function of obtaining first information on a scene of an image. The second obtaining unit may have a function of obtaining second information on a depth of an image. The selection unit may have a function of selecting a depth map suitable for an emphasis of a stereoscopic effect of an image on the basis of the first information and the second information. The correction unit may have a function of correcting image data on the basis of the depth map. The selection unit may include a neural network. The second information may be input to an input layer of the neural network. A selection result of the depth map may be output from an output layer of the neural network.

In the display system of one embodiment of the present invention, the first obtaining unit may have a function of obtaining the first information using machine learning, and the second obtaining unit may have a function of obtaining the second information using machine learning.

In the display system of one embodiment of the present invention, the correction unit may include a conversion unit and an emphasis unit, and the emphasis unit may have a function of performing processing for emphasizing a stereoscopic effect on the image data corrected by the correction unit.

In the display system of one embodiment of the present invention, the neural network may include a product-sum operation element. The product-sum operation element may include a memory circuit including a third transistor, a fourth transistor, and a capacitor. One of a source and a drain of the third transistor may be electrically connected to a gate of the fourth transistor and the capacitor. The third transistor may include a metal oxide in a channel formation region.

An electronic device of one embodiment of the present invention includes any of the above-described display systems.

Effect of the Invention

One embodiment of the present invention can provide a novel semiconductor device or display system. Another embodiment of the present invention can provide a semiconductor device or display system that can display stereoscopic images. Another embodiment of the present invention can provide a versatile semiconductor device or display system. Another embodiment of the present invention can provide a semiconductor device or display system with a simplified structure. Another embodiment of the present invention can provide a semiconductor device or display system with low power consumption.

Note that the description of these effects does not preclude the existence of other effects. Moreover, one embodiment of the present invention does not necessarily have all of these effects. Effects other than the above will be apparent from the description of the specification, the claims, the drawings, and the like, and effects other than the above can be derived from the description of the specification, the claims, the drawings, and the like.

BRIEF DESCRIPTION OF DRAWINGS

FIG. 7 Diagrams illustrating a structure example of a generation unit and examples of emphasis processing.

FIG. 26 Diagrams illustrating structure examples of display devices.

FIG. 27 Diagrams illustrating structure examples of display devices.

MODE FOR CARRYING OUT THE INVENTION

Figure 1:
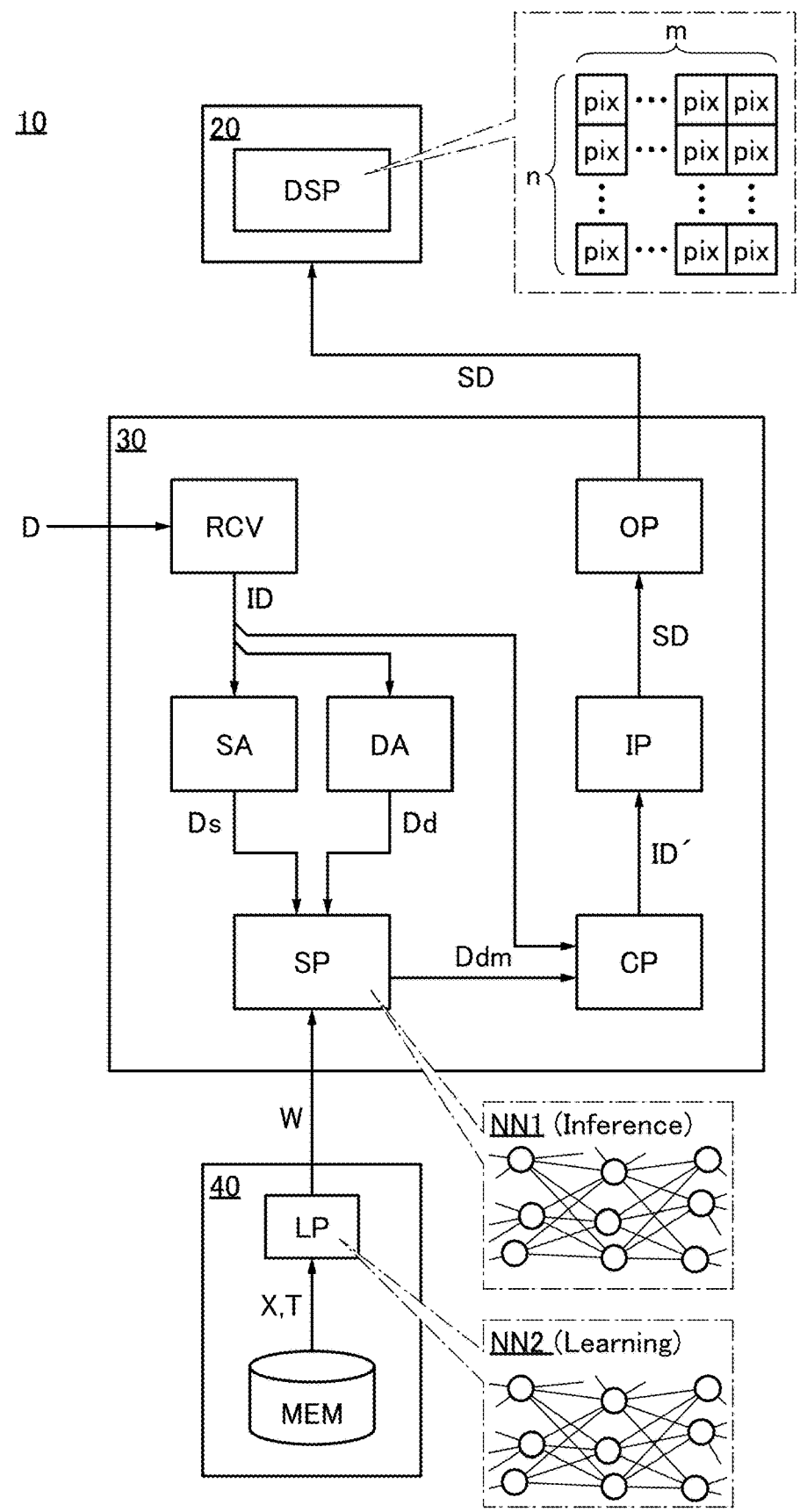
FIG. 1 A diagram illustrating a structure example of a display system.

Embodiments of the present invention are described below in detail with reference to the drawings. Note that the present invention is not limited to the description in the following embodiments, and it is easily understood by those skilled in the art that the modes and details can be changed in various ways without departing from the spirit and scope of the present invention. Thus, the present invention should not be interpreted as being limited to the following description of the embodiments.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. When a metal oxide is used in a channel region of a transistor, for example, the metal oxide is called an oxide semiconductor in some cases. That is, when a metal oxide has at least one of an amplifying function, a rectifying function, and a switching function, the metal oxide can be called a metal oxide semiconductor, or an OS for short. Hereinafter, a transistor containing a metal oxide in a channel region is also referred to as an OS transistor.

In this specification and the like, a metal oxide containing nitrogen is also called a metal oxide in some cases. Moreover, a metal oxide containing nitrogen may be called a metal oxynitride. The details of a metal oxide are described later.

In the case where there is an explicit description X and Y are connected, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is included in the drawings or the texts. Here, X and Y each denote an object (e.g., a device, an element, a circuit, a wiring, an electrode, a terminal, a conductive film, or a layer).

An example of the case where X and Y are directly connected is the case where an element that allows an electrical connection between X and Y (e.g., a switch, a transistor, a capacitor, an inductor, a resistor, a diode, a display element, a light-emitting element, or a load) is not connected between X and Y, and is the case where X and Y are connected without the element that allows the electrical connection between X and Y (e.g., a switch, a transistor, a capacitor, an inductor, a resistor, a diode, a display element, a light-emitting element, or a load) provided therebetween.

An example of the case where X and Y are electrically connected is the case where one or more elements that allow an electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being turned on or off to control whether current flows therethrough or not. Alternatively, a switch has a function of selecting and changing a current path. Note that the case where X and Y are electrically connected includes the case where X and Y are directly connected.

An example of the case where X and Y are functionally connected is the case where one or more circuits that allow a functional connection between X and Y (e.g., a logic circuit (an inverter, a NAND circuit, a NOR circuit, or the like); a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, or a control circuit) can be connected between X and Y. Note that even when another circuit is provided between X and Y, for example, X and Y are regarded as being functionally connected in the case where a signal output from X is transmitted to Y. Note that the case where X and Y are functionally connected includes the case where X and Y are directly connected and the case where X and Y are electrically connected.

Note that in the case where there is an explicit description X and Y are electrically connected, the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween) are disclosed in this specification and the like. That is, in the case where there is an explicit description "being electrically connected", the same contents as the case where there is only an explicit description "being connected", are disclosed in this specification and the like.

Even when a drawing shows that independent components are electrically connected to each other, one component has functions of a plurality of components in some cases. For example, when part of a wiring also functions as an electrode, one conductive film has functions of both of the components, the function of the wiring and the function of the electrode. Thus, electrical connection in this specification also includes such a case where one conductive film has functions of a plurality of components, in its category.

Embodiment 1

In this embodiment, a semiconductor device and a display system of one embodiment of the present invention are described.

<Structure Example of Display System>

FIG. 1 illustrates a structure example of a display system 10. The display system 10 has a function of generating a signal for displaying an image on the basis of data received from the outside and displaying the image using the signal. The display system 10 includes a display unit 20, a signal generation unit 30, and an arithmetic unit 40.

Note that the display unit 20, the signal generation unit 30, and the arithmetic unit 40 can each include a semiconductor device. The display unit 20 can include a display device, and the arithmetic unit 40 can include an arithmetic device. Circuits included in the signal generation unit 30 can be integrated into one integrated circuit. Thus, the display unit 20 can be referred to as a semiconductor device or a display device. The signal generation unit 30 can be referred to as a semiconductor device or an integrated circuit. The arithmetic unit 40 can be referred to as a semiconductor device or an arithmetic device.

[Display Unit]

The display unit 20 includes a display region DSP. The display region DSP has a function of displaying an image on the basis of a signal for displaying a predetermined image (hereinafter, also referred to as an image signal) that is input from the signal generation unit 30. The display region DSP includes a plurality of pixels pix. Here, the case where the display region DSP includes the pixels pix arranged in n rows and m columns (n and m are natural numbers) is described.

The pixels pix each include a display element and have a function of expressing a predetermined gray level. The gray levels of the pixels pix are controlled, whereby a predetermined image is displayed on the display region DSP.

Examples of the display element provided in the pixels pix include a liquid crystal element and a light-emitting element. As the liquid crystal element, a transmissive liquid crystal element, a reflective liquid crystal element, a transflective liquid crystal element, or the like can be used. Moreover, as the display element, a shutter type MEMS (Micro Electro Mechanical Systems) element, an optical interference type MEMS element, or a display element using a microcapsule method, an electrophoretic method, an electrowetting method, an Electronic Liquid Powder (registered trademark) method, or the like can be used, for example. In addition, examples of the light-emitting element include self-luminous light-emitting elements such as an OLED (Organic Light Emitting Diode), an LED (Light Emitting Diode), a QLED (Quantum-dot Light Emitting Diode), and a semiconductor laser.

The number of pixels pix provided in the display region DSP can be freely set. For example, pixels of 3840×2160 or more or 4096×2160 or more are preferably provided in the case of displaying a 4K2K image on the display region DSP. Moreover, pixels of 7680×4320 or more are preferably provided in the case of displaying an 8K4K image on the display region DSP. Furthermore, a larger number of pixels pix can be provided in the display region DSP.

The display region DSP may have a curved surface. Accordingly, images can be displayed on various places. For example, the display region DSP can be provided along a curved surface of an inside wall or an outside wall of a building or an interior or an exterior of a vehicle.

An image to be displayed on the display unit 20 may include a three-dimensional object, scenery, or the like. However, an image that is actually displayed on the display region DSP is expressed by image data of two-dimensional arrangement of n×m, and thus is displayed as a two-dimensional image. Therefore, in order to display a three-dimensional image with a stereoscopic effect on the display region DSP, it is preferable to perform image processing for emphasizing the stereoscopic effect. The stereoscopic effect of a two-dimensional image can be emphasized by, for example, control of the luminance of the image, a size of an object in the image, aerial perspective (blueness in the background, a blur of an outline, or the like), a shadow, a contrast, or the like.

Here, in one embodiment of the present invention, an image signal emphasizing a stereoscopic effect of an image is generated using artificial intelligence (AI). Specifically, the signal generation unit 30 has a function of, with the use of artificial intelligence, obtaining information on a scene of an image (hereinafter, also referred to as scene information) and information on a depth of an image (hereinafter, also referred to as depth information) and correcting image data on the basis of the information so that a stereoscopic effect is emphasized. By supplying an image signal, which is obtained by the correction of the image data, to the display unit 20, a stereoscopic image can be displayed on the display region DSP.

Note that artificial intelligence is a general term of computers that imitate the intelligence of human beings. In this specification and the like, artificial intelligence includes a computer that performs an arithmetic operation using machine learning. Examples of the machine learning include a support vector machine (SVM) and boosting. In this specification and the like, artificial intelligence includes an artificial neural network (ANN). The artificial neural network is a circuit that imitates a neural network including neurons and synapses. In this specification and the like, the term "neural network" particularly refers to an artificial neural network. Hereinafter, the signal generation unit 30 including artificial intelligence is described.

[Structure Example of Signal Generation Unit]

The signal generation unit 30 has a function of generating an image signal on the basis of data D input from the outside. The signal generation unit 30 includes a receiving unit RCV, an obtaining unit SA, an obtaining unit DA, a selection unit SP, a correction unit CP, an image processing unit IP, and an output unit OP. Each of these units can include a circuit.

The receiving unit RCV has a function of receiving the data D input from the outside and performing signal processing as appropriate. For example, the receiving unit RCV has a function of performing demodulation of the data D, analog-digital conversion, decoding, and the like. A broadcast signal modulated by a predetermined mode and encoded, or the like is input to the receiving unit RCV. Note that the data D may be received with or without a wire.

Image data (data ID) corresponding to an image displayed on the display unit 20 is generated by the signal processing by the receiving unit RCV and is output to the obtaining unit SA and the obtaining unit DA.

The obtaining unit SA has a function of obtaining scene information on an image corresponding to the data ID. Examples of scene information include information on the entire structure of an image, information on an object included in an image, and information on situations (place, time, and the like) of an image. Specific examples of situations of an image include information on whether an image is an indoor image or an outdoor image and information on whether an image is a dawn image, a daytime image, an evening image, or a night image.

Figure 2A:
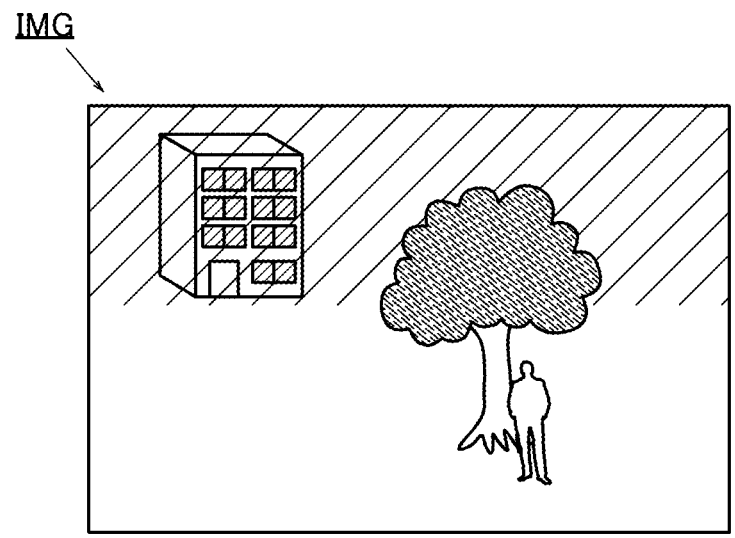
FIG. 2 Diagrams illustrating an example of scene information.
Figure 2B:
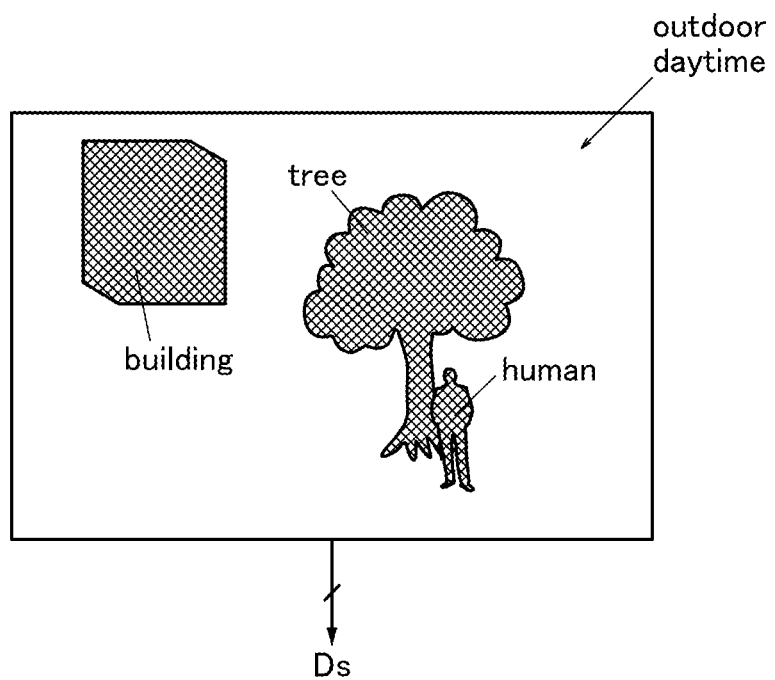

FIG. 2 illustrates an example of scene information obtained by the obtaining unit SA. FIG. 2(A) illustrates an example of an image IMG expressed using the data ID. When the data ID is input to the obtaining unit SA, the obtaining unit SA recognizes an object included in the image IMG. FIG. 2(B) illustrates a state where information on the existence of a building, a tree, and a human in the image IMG is obtained by the object recognition by the obtaining unit SA.

Furthermore, information on the situation of the image IMG may be obtained by the obtaining unit SA. FIG. 2(B) illustrates a state where information that the image IMG is an outdoor image in the daytime (outdoor daytime) is obtained by the obtaining unit SA.

The above scene information is obtained by the obtaining unit SA and output to the selection unit SP as data Ds.

The obtaining unit DA has a function of obtaining depth information on an image corresponding to the data ID. Examples of depth information include a size of an object in an image, a distance between objects in an image, aerial perspective, a shadow, and a decrease in a contrast due to air scattering. Aerial perspective is generated by light scattering and refers to a phenomenon in which an object distant from the front is blurred and its outline is blurred and thus an image becomes bluish. The depth of an image can be estimated from the information.

Figure 3:
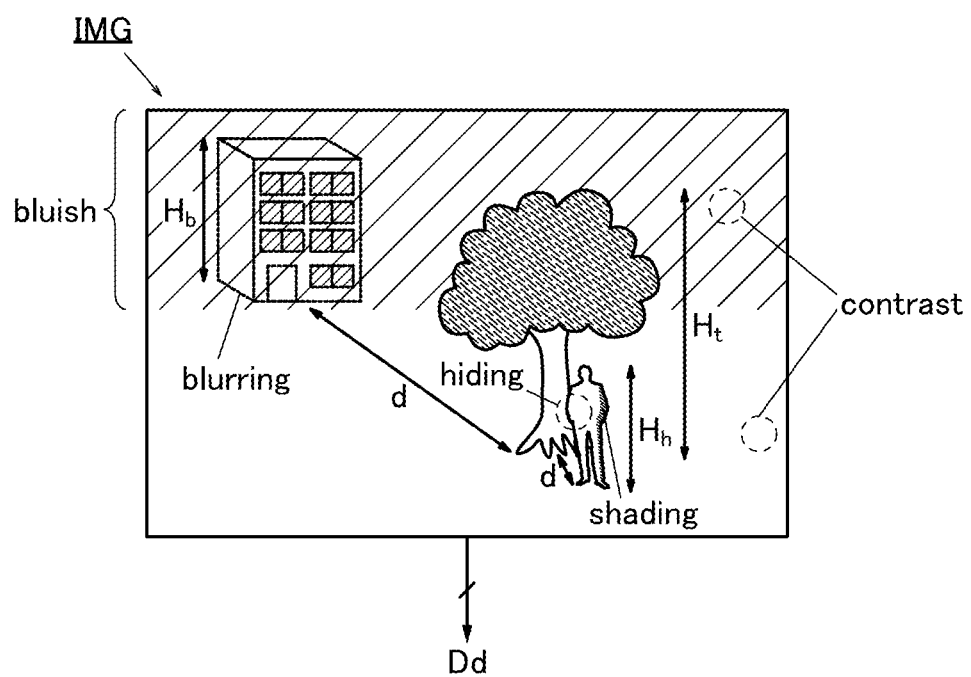
FIG. 3 A diagram illustrating an example of depth information.

FIG. 3 illustrates examples of depth information obtained by the obtaining unit DA. From the image IMG expressed using the data ID, heights $H_b$, $H_t$, and $H_h$ of objects (the building, the tree, and the human), a distanced between the objects, a shadow of the human (shading), hiding of the tree by the human (hiding), a bluish region in the back (bluish), a blur of the outline of the building (blurring), a contrast difference between the foreground and the background (contrast), and the like are obtained as the depth information. It is recognized from the depth information that the tree is positioned behind the human and the building is positioned behind the tree.

The above depth information is obtained by the obtaining unit DA and output to the selection unit SP as data Dd.

Each of the scene information and the depth information can be obtained using machine learning. In that case, a feature value and the kind of machine learning can be freely selected. For example, in the case of extracting a feature of an image on the basis of luminance information, a Joint Haar-like feature value, a sparse feature value, or the like can be used as the feature value. In the case of extracting a feature of an image on the basis of edge information, a Shapelet feature value, a Joint HOG feature value, or the like can be used as the feature value. Moreover, a support vector machine (SVM), boosting, a neural network, and the like can be used for the machine learning. The feature value can also be extracted by a neural network.

The selection unit SP has a function of selecting a depth map suitable for the emphasis of the stereoscopic effect of an image. Specifically, the selection unit SP has a function of selecting a depth map of an image (hereinafter, also referred to as an image depth map) or a depth map of an object included in an image (hereinafter, also referred to as an object depth map) on the basis of the scene information and the depth information. A plurality of image depth maps or a plurality of object depth maps are prepared in advance, and a depth map suitable for the emphasis of the stereoscopic effect is selected on the basis of the scene information and the depth information.

A depth map selected by the selection unit SP is used for image data correction. The coordinates of the image or the object included in the image are converted in accordance with the depth map selected on the basis of the scene information and the depth information, so that the stereoscopic effect of the image can be emphasized.

Figure 4A:
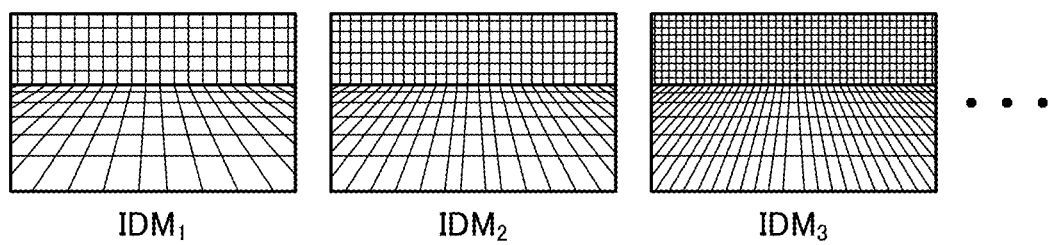
FIG. 4 Diagrams illustrating examples of a depth map.

FIG. 4(A) illustrates examples of an image depth map. An image depth map IDM is a map showing the depth of the whole image. The selection unit SP has a function of selecting one depth map IDM that is suitable for the emphasis of the stereoscopic effect from a plurality of depth maps IDM on the basis of the data Ds and the data Dd.

Figure 4B:
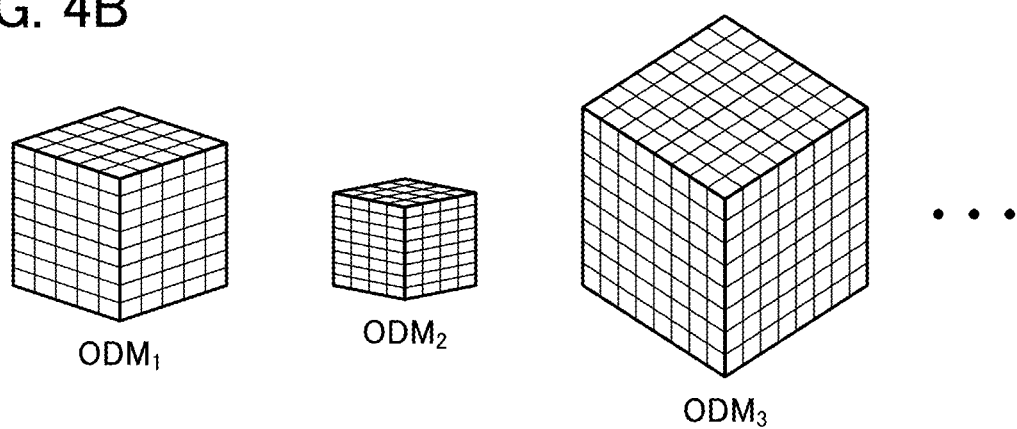

FIG. 4(B) illustrates examples of an object depth map. An object depth map ODM is a map showing the depth of a boxy object included in an image. The selection unit SP has a function of selecting one depth map ODM that is suitable for the emphasis of the stereoscopic effect from a plurality of depth maps ODM on the basis of the data Ds and the data Dd. Note that the object depth map can be selected for each object included in the image.

In order to effectively emphasize the stereoscopic effect, the depth map needs to be selected properly in accordance with the contents of the image. Here, the selection unit SP has a function of selecting a depth map using a neural network NN1 (Inference). Thus, a suitable depth map can be selected using various kinds of scene information and depth information. FIG. 5 illustrates structure examples of the selection unit SP including the neural network NN1.

Figure 5A:
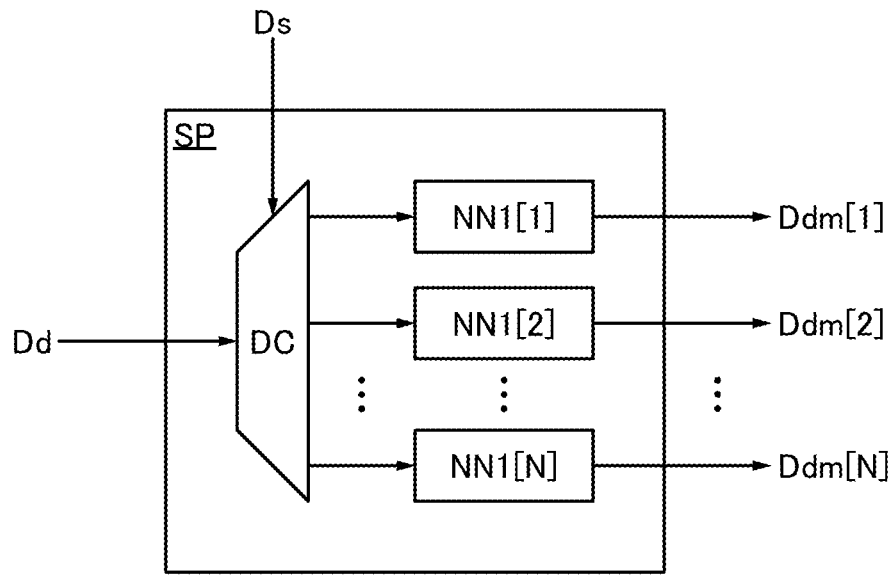
FIG. 5 Diagrams illustrating structure examples of a selection unit.

The selection unit SP illustrated in FIG. 5(A) has a function of selecting a depth map using a plurality of neural networks NN1. The selection unit SP includes a distribution circuit DC and N (N is an integer of 2 or more) neural networks NN1.

The distribution circuit DC has a function of distributing the data Dd and selecting the neural network NN1 to which the data Dd is supplied. The neural network NN1 to which the data Dd is supplied is determined on the basis of the data Ds.

The plurality of neural networks NN1 have a function of selecting the depth map of the image or the object included in the image by the inference using the data Dd as an input data. Each of the neural networks NN1[1] to NN1[N] has learned such that a depth map suitable for the emphasis of the stereoscopic effect can be selected from a plurality of depth maps prepared in advance. The output layers of the neural networks NN1[1] to NN1[N] output data Ddm[1] to Ddm[N], respectively, that correspond to selection results.

The case where a depth map for emphasizing the stereoscopic effect of an image including a building, a tree, and a human is selected is considered, for example. In that case, for example, the neural networks NN1[1] to NN1[4] are used as neural networks that select depth maps of the whole image, the building, the tree, and the human. When the data Dd is input to the selection circuit CP, the distribution circuit DC distributes the data Dd to the particular neural network NN1 depending on whether the data Dd is the depth information on the whole image, the building, the tree, or the human, that is, on the basis of an object of the depth information. Note that an object of the depth information can be determined on the basis of the data Ds.

Specifically, when the data Dd is the depth information on the whole image, the data Dd is input to the neural network NN1[1]. When the data Dd is the depth information on the building, the tree, and the human, the data Dd is input to the neural networks NN1[2], NN1[3], and NN1[4]. The depth maps suitable for the emphasis of the stereoscopic effect are selected using the neural networks NN1[1] to NN1[4] and are output as the data Ddm[1] to Ddm[4].

Figure 6:
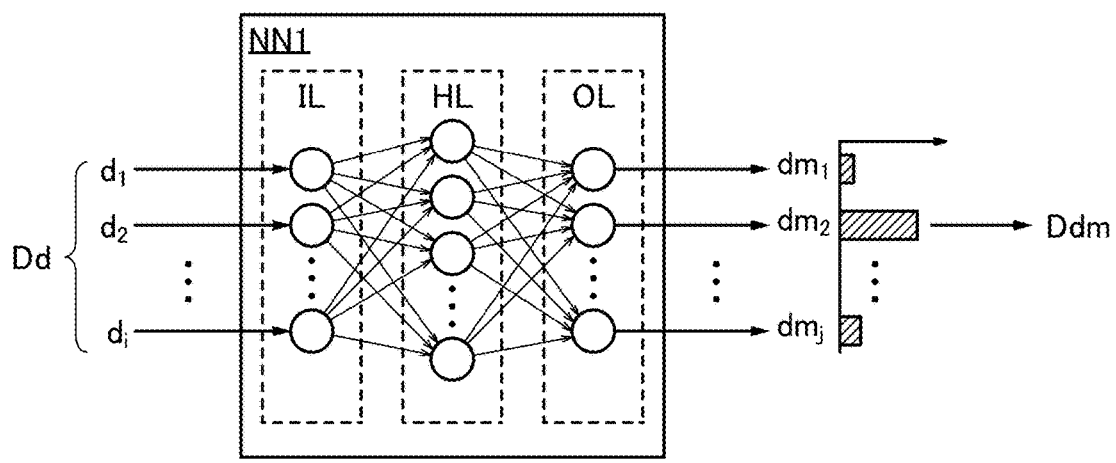
FIG. 6 A diagram illustrating a structure example of a neural network.

FIG. 6 illustrates a specific structure example of the neural network NN1. The neural network NN1 includes an input layer IL, an output layer OL, and a hidden layer (middle layer) HL. Data $d_1$ to $d_i$ (i is a natural number) corresponding to the depth information included in the data Dd are input to the input layer IL.

Note that the neural network NN1 may be a network including a plurality of hidden layers HL (DNN: deep neural network). Learning in the deep neural network is referred to as deep learning in some cases. The output layer OL, the input layer IL, and the hidden layer HL each include a plurality of units (neuron circuits), and output from units is supplied to units provided in different layers through weights (connection strength).

Note that the weight coefficient of the neural network NN1 can be input from the outside of the signal generation unit 30. Specifically, a weight coefficient W calculated by the arithmetic unit 40 is supplied to the selection unit SP, and the neural network NN1 has a function of storing the weight coefficient W.

The function of selecting a depth map suitable for the stereoscopic emphasis on the basis of the depth information (data $d_1$ to $d_i$) is added to the neural network NN1 by learning. When the data $d_1$ to $d_i$ are input to the input layer of the neural network NN1, arithmetic processing is performed in each layer. The arithmetic processing in each layer is performed by, for example, product-sum operation of output from the units in the previous layer and weight coefficients. Note that connection between the layers may be full connection in which all the units are connected or partial connection in which some of the units are connected. Then, the selection results of the depth map are output from the output layer OL as data $dm_1$ to $dm_j$ (j is a natural number).

The data $dm_1$ to $dm_j$ each correspond to a particular depth map. The value of the data dm can correspond to the probability that the corresponding depth map is suitable for the stereoscopic emphasis. Such a structure can be obtained when the number of units in the output layer OL is j and a softmax function or the like is used as an activation function of the output layer OL. The data dm, which has the highest value among the data $dm_1$ to $dm_j$, corresponds to the selection result of the depth map, and the selected depth map is output to the correction unit CP as the data Ddm. In this manner, a particular depth map suitable for the emphasis of the stereoscopic effect is selected from j depth maps.

The use of a neural network in the selection unit SP makes it possible to select a suitable depth map on the basis of the combination of unknown depth information. Therefore, the selection unit SP can have higher versatility.

Figure 5B:
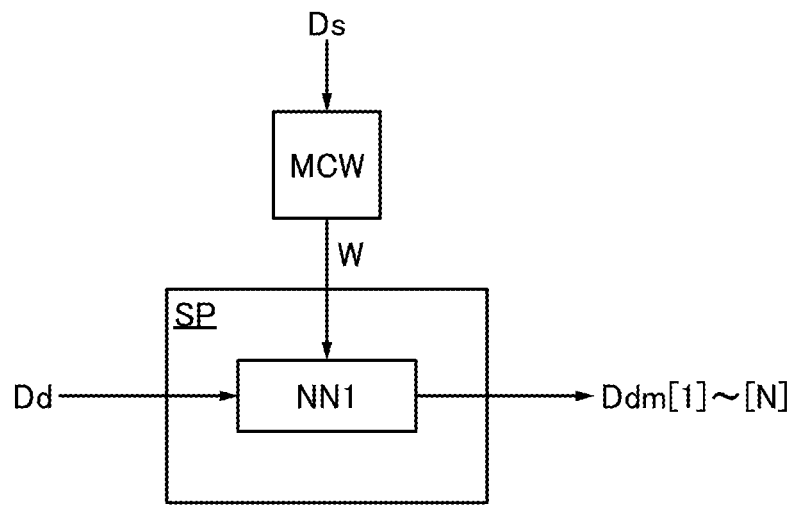

Note that a plurality of depth maps may be selected using one neural network NN1. FIG. 5(B) illustrates a structure example in which the data Dd is sequentially input to one neural network NN1. Note that the neural network NN1 illustrated in FIG. 5(B) is connected to a memory circuit MCW.

When the data Dd is input to the neural network NN1, the memory circuit MCW supplies the weight coefficient W suitable for the data Dd to the neural network NN1 on the basis of the data Ds. That is, the weight coefficient W stored in the neural network NN1 is changed with the data Ds every time the data Dd is input. For example, when N sets of the weight coefficients W are stored in the memory circuit MCW and one weight coefficient W is supplied to the neural network NN1 in accordance with the data Ds, N kinds of depth maps can be selected as in FIG. 5(A). This can reduce the number of neural networks NN1 and can simplify the structure of the signal generation unit 30.

As described above, the selection unit SP can select a depth map using the neural network NN1. Then, the selection result of the depth map is output as the data Ddm to the correction unit CP illustrated in FIG. 1.

The correction unit CP has a function of correcting the data ID on the basis of the data Ddm. Specifically, the correction unit CP has a function of correcting the data ID to data ID' using the depth map selected by the selection unit SP so that the stereoscopic effect is emphasized. The correction unit CP may have a function of performing processing for emphasizing the stereoscopic effect (hereinafter, also referred to as emphasis processing) on the data ID'.

FIG. 7(A) illustrates a structure example of the correction unit CP. The correction unit CP includes a conversion unit TP and an emphasis unit EP. The data ID and the data Ddm are supplied to the conversion unit TP.

The conversion unit TP has a function of converting the data ID using the data Ddm. Specifically, the conversion unit TP has a function of converting the depth map of the image or the object included in the image expressed using the data ID into the depth map selected by the selection unit SP. Accordingly, the data ID is converted into image data having an emphasized stereoscopic effect (the data ID'), and the data ID' is output to the emphasis unit EP.

The emphasis unit EP has a function of performing emphasis processing on the data ID'. Examples of the emphasis processing include adjustment of luminance of an image, a size of an object in an image, aerial perspective, a shadow, and a contrast. FIGS. 7(B-1) to 7(B-4) illustrate specific examples of the emphasis processing.

FIG. 7(B-1) illustrates an example of adjusting the luminance of an object. Increasing the gray levels toward a region positioned at the front can emphasize the stereoscopic effect of the object. FIG. 7(B-2) illustrates an example of adjusting the shadow of the object. The adjustment of the existence or depth of the shadow can emphasize the stereoscopic effect of the object.

FIG. 7(B-3) illustrates an example of adjusting the aerial perspective. The perspective of the whole image can be emphasized when the background is made bluish and the outline of an object positioned at a distant place is blurred. FIG. 7(B-4) illustrates an example of adjusting a contrast. The contrast of an object positioned at the front is increased and the contrast of an object positioned at a distant place is decreased, so that the perspective of the whole image can be emphasized.

The data ID' with the stereoscopic effect emphasized by the emphasis unit EP is output to the image processing unit IP. Note that the emphasis unit EP can be omitted when the stereoscopic effect is emphasized only by conversion of the depth map using the conversion unit TP.

The image processing unit IP has a function of perforating various kinds of image processing on the data ID' and generating an image signal. Examples of the image processing include noise removal processing, gray level conversion processing, tone correction processing, and luminance correction processing. The tone correction processing or the luminance correction processing can be performed with the use of gamma correction or the like. Furthermore, the image processing unit IP may have a function of executing pixel interpolation processing accompanying up-conversion of the resolution, frame interpolation processing accompanying up-conversion of the frame frequency, or the like. The image processing unit IP may also have a function of performing processing for emphasizing the outline or the perspective of the image.

Examples of the noise removal processing include removal of various noise such as mosquito noise that appears near the outlines of characters and the like, block noise that appears in high-speed moving images, random noise that causes flicker, and dot noise caused by up-conversion of the resolution.

The gray level conversion processing converts the gray level expressed by a signal SD to a gray level corresponding to output characteristics of the display unit 20. For example, in the case where the number of gray levels is increased, gradation values of pixels are interpolated to an input image with a small number of gray levels and assigned to the pixels, so that processing for smoothing a histogram can be executed. A high-dynamic range (HDR) processing for increasing the dynamic range is also included in the gray level conversion processing.

The tone correction processing corrects the tone of an image. The luminance correction processing corrects the brightness (luminance contrast) of an image. The luminance and tone of an image displayed on the display unit 20 are corrected to be optimal, in accordance with the kind, luminance, or color purity of lighting of a room in which the display unit 20 is provided, for example.

The pixel interpolation processing interpolates data that does not actually exist when resolution is up-converted. For example, with reference to pixels around the target pixel, data is interpolated to display intermediate color between the colors of the pixels.

In the case where the frame frequency of the displayed image is increased, the frame interpolation processing generates an image for a frame that does not actually exist (interpolation frame). For example, an image for an interpolation frame that is interposed between certain two images is generated from a difference between the two images. Alternatively, images for a plurality of interpolation frames can be generated between the two images. For example, when the frame frequency of image data is 60 Hz, a plurality of interpolation frames are generated, and the frame frequency of an image signal output to the display unit 20 can be increased twofold to 120 Hz, fourfold to 240 Hz, or eightfold to 480 Hz, for example.

An image signal is generated by image processing by the image processing unit IP, and is output to the output unit OP as the signal SD. Note that the image processing may be performed on the data ID that has not been input to the correction unit CP Furthermore, artificial intelligence can be used for the image processing.

The output unit OP has a function of temporarily storing the signal SD supplied from the image processing unit IP and outputting the signal SD to the display unit 20 at a predetermined timing. Then, the display unit 20 displays an image on the basis of the signal SD.

As described above, the signal generation unit 30 converts image data using artificial intelligence, whereby the stereoscopic effect of the image displayed on the display unit 20 can be emphasized.

[Arithmetic Unit]

The learning in the neural network NN1 can be performed using the arithmetic unit 40 provided outside the signal generation unit 30. FIG. 1 illustrates the arithmetic unit 40 including a learning unit LP and a memory device MEM.

The learning in the neural network NN1 can be performed by updating the weight coefficient using depth information as learning data and a depth map suitable for the emphasis of the stereoscopic effect as teacher data. Here, the learning unit LP includes a neural network NN2 (Learning) that has the same structure as the neural network NN1. The neural network NN2 has a function of performing learning using a set of teaming data X (depth information) and teacher data T (suitable depth map) as learning samples. The learning data X and the teacher data T are stored in the memory device MEM in advance and read out at the time of learning.

The weight coefficient W of the neural network NN2 obtained by the learning is stored in the neural network NN1 provided in the signal generation unit 30. Accordingly, the results of the learning in the neural network NN2 can be reflected in the neural network NN1. Learning in the neural network performed in the arithmetic unit 40 in this manner can simplify the structure of the neural network NN1 provided in the signal generation unit 30.

Note that in order to make the structure of the neural network NN1 and the structure of the neural network NN2 correspond to each other, for example, a hierarchical neural network is used for each of the neural networks, and the neural networks have the same number of layers and the same number of units in each layer.

As the arithmetic unit 40, a computer with high arithmetic processing properties, such as a dedicated server or a cloud, can be used. The learning unit LP can include software. Accordingly, the computer with high arithmetic processing properties can be used for the learning in the neural network NN2, and the learning results can be reflected in the neural network NN1. Thus, learning in the neural network NN1 can be efficiently performed.

Figure 8:
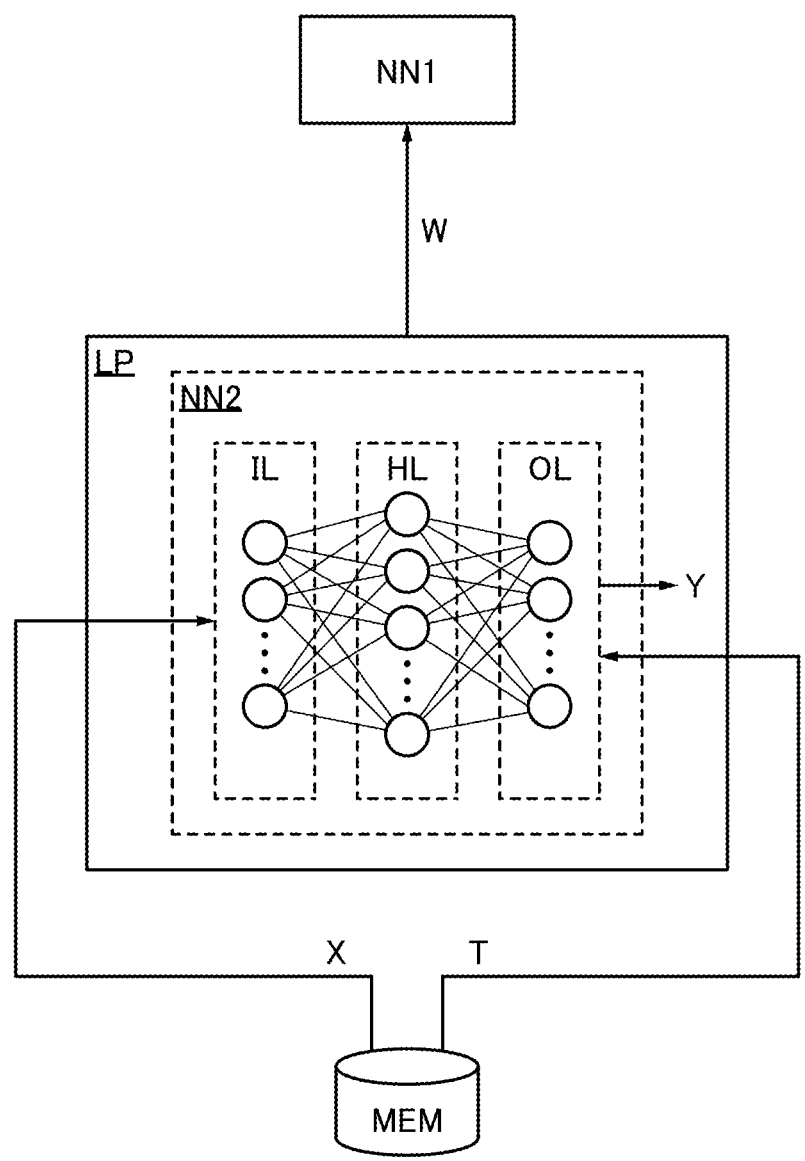
FIG. 8 A diagram illustrating a structure example of a learning unit.

FIG. 8 illustrates a structure example of the learning unit LP. The learning unit LP includes the neural network NN2. Note that the neural network NN2 has the same structure as the neural network NN1.

The learning data X (depth information) and the teacher data T (suitable depth map) are stored in the memory device MEM. The learning data X and the teacher data are read out from the memory device MEM at the time of the learning, the learning data X is supplied to the input layer IL of the neural network NN2, and the teacher data T is supplied to the output layer OL of the neural network NN2.

The neural network NN2 has a function of performing learning using the learning data X and the teacher data T as learning samples. Specifically, first, the neural network NN2 performs inference using the learning data X as input data, and obtains Y as output data. Note that the selection of the depth map is a classification problem, and the output data Y corresponds to an output value of a softmax function or the like.

The weight coefficient of the neural network NN2 is updated so that an error between the output data Y and the teacher data T becomes small. The weight coefficient can be updated using a gradient descent method using cross entropy as an error function, or the like. The update of weight is repeated until the error between the output data Y and the teacher data T becomes a certain value or less. After that, similar learning is performed using another set of the learning data X and the teacher data T. Then, the update of the weight coefficients using all sets of the learning data X and the teacher data T is completed, so that the learning in the neural network NN2 is completed.

Note that the allowable range of an error can be freely set. The initial value of the weight coefficient of the neural network NN2 may be determined by random numbers. The initial value of the weight coefficient might affect the learning speed (e.g., the convergent speed of the weight coefficient and the prediction accuracy of the neural network); thus, the initial value of the weight coefficient may be changed when the learning speed is low. Alternatively, the initial value of the weight coefficient may be determined by pre-training.

As a result of the above learning, the weight coefficient W of the neural network NN2 after the learning can be obtained. The weight coefficient W is supplied to and stored in the neural network NN1 in the signal generation unit 30. Accordingly, the results of the learning in the neural network NN2 can be reflected in the neural network NN1.

Note that the weight coefficient W is obtained for each depth map. For example, in the case where a depth map of an image including a building, a tree, and a human is selected, the weight coefficient for selecting the depth map of the whole image and the weight coefficients for selecting the depth maps of the building, the tree, and the human are each obtained by learning. Then, the plurality of obtained weight coefficients W are supplied to different neural networks NN1 (see FIG. 5(A)).

The neural network NN2 can be obtained by software written by a program. In that case, the neural network NN2 can perform learning by execution of the program.

As described above, the display system 10 of one embodiment of the present invention can perform learning in the neural network using the arithmetic unit 40.

<Structure Example of Neural Network>

Next, a structure example of a neural network that can be used as each of the neural network NN1 and the neural network NN2 is described. FIG. 9 illustrates structure examples of the neural network. The neural network includes neuron circuits NC and synapse circuits SC provided between the neuron circuits.

Figure 9A:
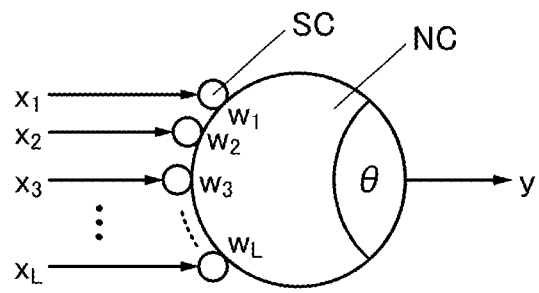
FIG. 9 Diagrams illustrating structure examples of a neural network.

FIG. 9(A) illustrates a structure example of the neuron circuit NC and the synapse circuits SC. Input data $x_1$ to $x_L$ (L is a natural number) are input to the synapse circuits SC. In addition, the synapse circuits SC have a function of storing a weight coefficient $w_k$ (k is an integer of 1 to L inclusive). The weight coefficient $w_k$ corresponds to the connection strength between the neuron circuits NC.

When the input data $x_1$ to $x_L$ are input to the synapse circuits SC, the sum of the products $(x_k w_k)$ for k=1 to L (i.e., $x_1 w_1 + x_2 w_2 + \ldots + x_L w_L$) of input data $x_k$ input to the synapse circuit SC and the weight coefficient $w_k$ stored in the synapse circuit SC, that is, a value obtained by the product-sum operation of $x_k$ and $w_k$ is supplied to the neuron circuit NC. When the value is larger than the threshold θ of the neuron circuit NC, the neuron circuit NC outputs a high-level signal y. This phenomenon is referred to as firing of the neuron circuit NC.

Figure 9B:
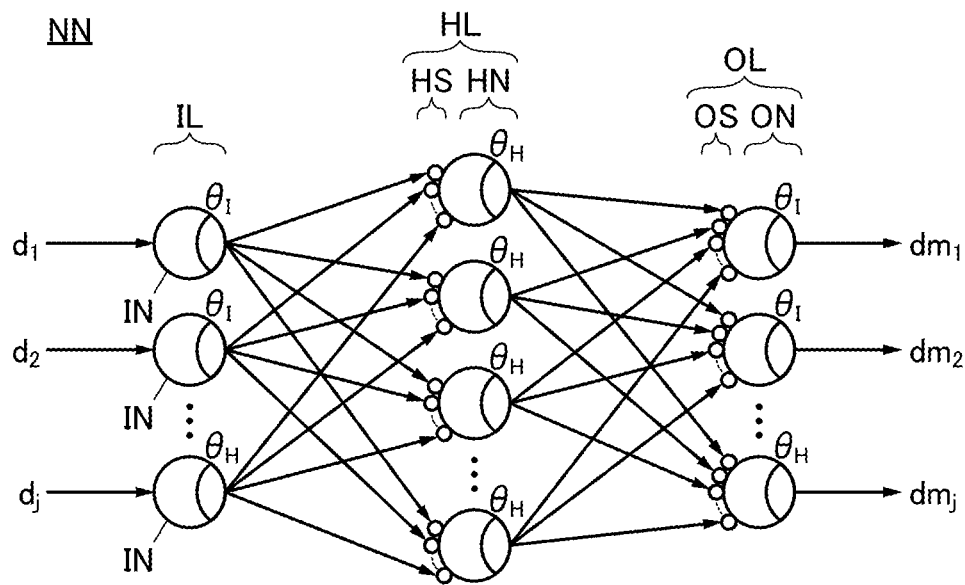

FIG. 9(B) illustrates a model of a hierarchical neural network using the neuron circuits NC and the synapse circuits SC. The neural network includes the input layer IL, the hidden layer HL, and the output layer OL. The input layer IL includes input neuron circuits IN. The hidden layer HL includes hidden synapse circuits HS and hidden neuron circuits HN. The output layer OL includes output synapse circuits OS and output neuron circuits ON. The thresholds θ of the input neuron circuit IN, the hidden neuron circuit HN, and the output neuron circuit ON are referred to as $θ_I$, $θ_H$, and $θ_O$, respectively.

The data $d_1$ to $d_i$ corresponding to the depth information are supplied to the input layer IL, and output from the input layer IL is supplied to the hidden layer HL. Then, a value obtained by the product-sum operation of the output data of the input layer IL and the weight coefficients w that are held in the hidden synapse circuits HS is supplied to the hidden neuron circuits HN. A value obtained by the product-sum operation of the output from the hidden neuron circuits HN and the weight coefficients w that are held in the output synapse circuits OS is supplied to the output neuron circuits ON. Then, the data $dm_1$ to $dm_j$ corresponding to the probability of the depth map are output from the output neuron circuits ON. Note that here, a softmax function is used as the activation function of the output layer OL.

As described above, the neural network illustrated in FIG. 9(B) has a function of calculating the probability of the depth map suitable for the emphasis of the stereoscopic effect from the depth information. Note that the structure in FIG. 9(B) can be used for the neural networks NN1 and NN2.

Figure 9C:
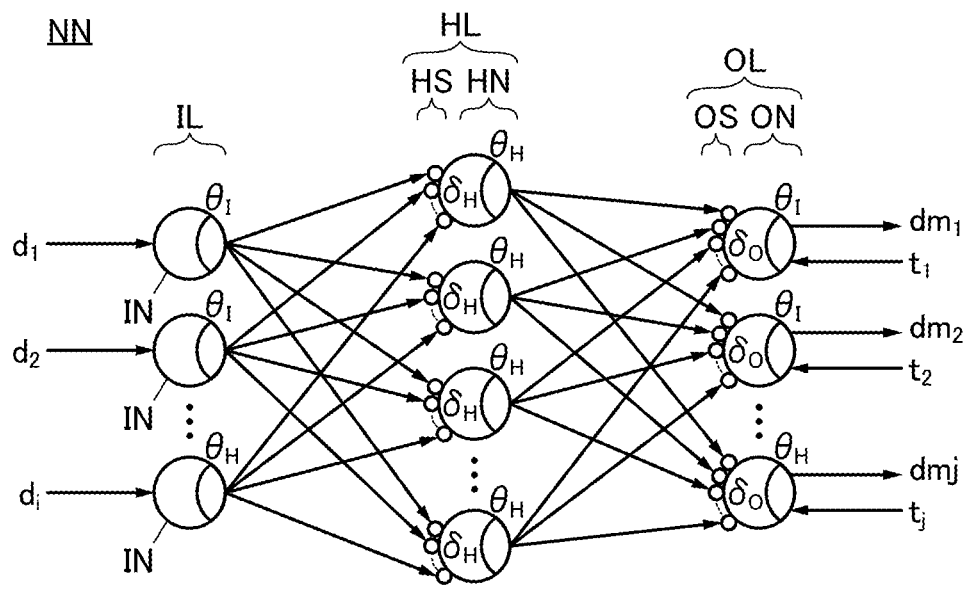

A gradient descent method or the like can be used for learning in the neural network, and a backpropagation method can be used for calculation of a gradient. FIG. 9(C) illustrates a model of a neural network that performs supervised learning using a backpropagation method.

A backpropagation method is one of methods for changing a weight coefficient of a synapse circuit so that an error between output data of a neural network and teacher data becomes small. Specifically, the weight coefficient w of the hidden synapse circuit HS is changed with an error $δ_O$ that is determined on the basis of the output data (data $dm_1$ to $dm_j$) and the teacher data (data $t_1$ to $t_j$). In addition, the weight coefficient w of the synapse circuit SC in the previous stage is changed with the amount of change in the weight coefficient w of the hidden synapse circuit HS. In this manner, the weight coefficients of the synapse circuits SC are sequentially changed on the basis of the teacher data, so that the neural network NN can perform learning. This backpropagation method can be used for the learning in the neural network NN2.

Note that the number of hidden layers HL is one in FIGS. 9(B) and 9(C) but the number of hidden layers HL may be two or more. Thus, deep learning can be performed.

<Operation Example of Display System>

Figure 10:
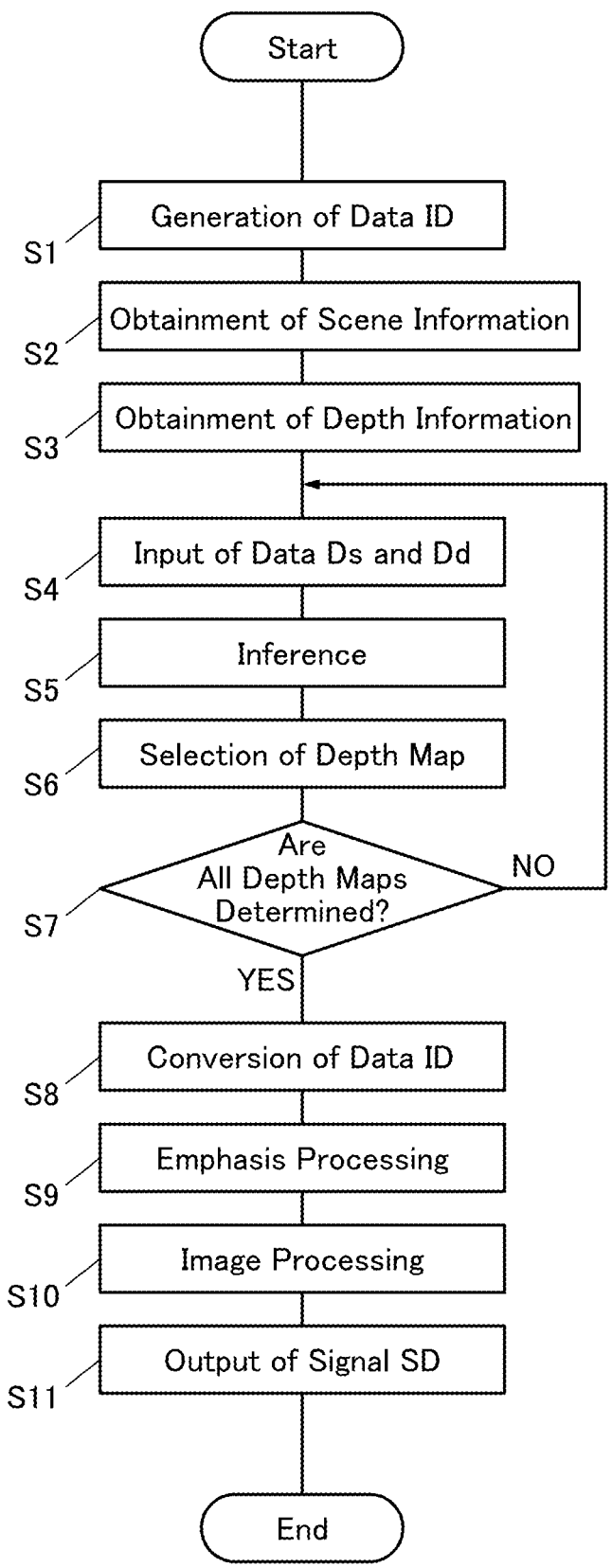
FIG. 10 A flow chart.

Next, an operation example of the display system 10 at the time when an image signal is generated using the neural network NN1 is described. FIG. 10 is a flow chart showing an operation example of the display system 10.

Note that in the neural network NN1, the weight coefficient W is set in advance by learning, and a function of selecting a depth map suitable for the emphasis of the stereoscopic effect on the basis of depth information is added. For the learning in the neural network NN1, refer to FIG. 8 and the like.

First, the receiving unit RCV receives the data D, and the data ID is generated (Step S1). Then, the data ID is output to the obtaining unit SA, the obtaining unit DA, and the correction unit CP.

When the data ID is input to the obtaining unit SA, scene information is obtained by the obtaining unit SA (Step S2). Then, the scene information is output to the selection unit SP as the data Ds. When the data ID is input to the obtaining unit DA, depth information is obtained by the obtaining unit DA (Step S3). Then, the depth information is output to the selection unit SP as the data Dd. Note that the above-described machine learning or the like can be used to obtain the scene information and the depth information.

Then, when the data Ds and the data Dd are input to the selection unit SP (Step S4), inference is performed by the neural network NN1 corresponding to an object of the depth information (Step S5), and a depth map that is expected to be optimal for the emphasis of the stereoscopic effect is selected (Step S6). The selection result of the depth map by the selection unit SP is output to the correction unit CP as the data Ddm. Then, the selection of the depth map is repeated in a similar manner (NO in Step S7).

When all of the depth maps are determined (YES in Step S7), the correction unit CP converts the data ID into the data ID' on the basis of the data Ddm (Step S8). Specifically, the depth map of the image or the object included in the image that is expressed by the data ID is converted into the depth map selected by the selection unit SP. Accordingly, the stereoscopic effect of the image or the object included in the image is emphasized. Then, various kinds of emphasis processing and image processing are performed on the data ID' (Steps S9 and S10), and the obtained signal SD is output from the output unit OP to the display unit 20 (Step S11). Thus, a stereoscopic image is displayed on the display unit 20.

As described above, in one embodiment of the present invention, artificial intelligence is used for obtaining the scene information and the depth information and selecting the depth map. In this manner, the image data can be corrected properly so that the stereoscopic effect of the image is emphasized, whereby the display system 10 that can display a stereoscopic image can be obtained.

This embodiment can be combined with the description of the other embodiments as appropriate.

Embodiment 2

In this embodiment, a structure example of the arithmetic unit described in the above embodiment is described.

Figure 11:
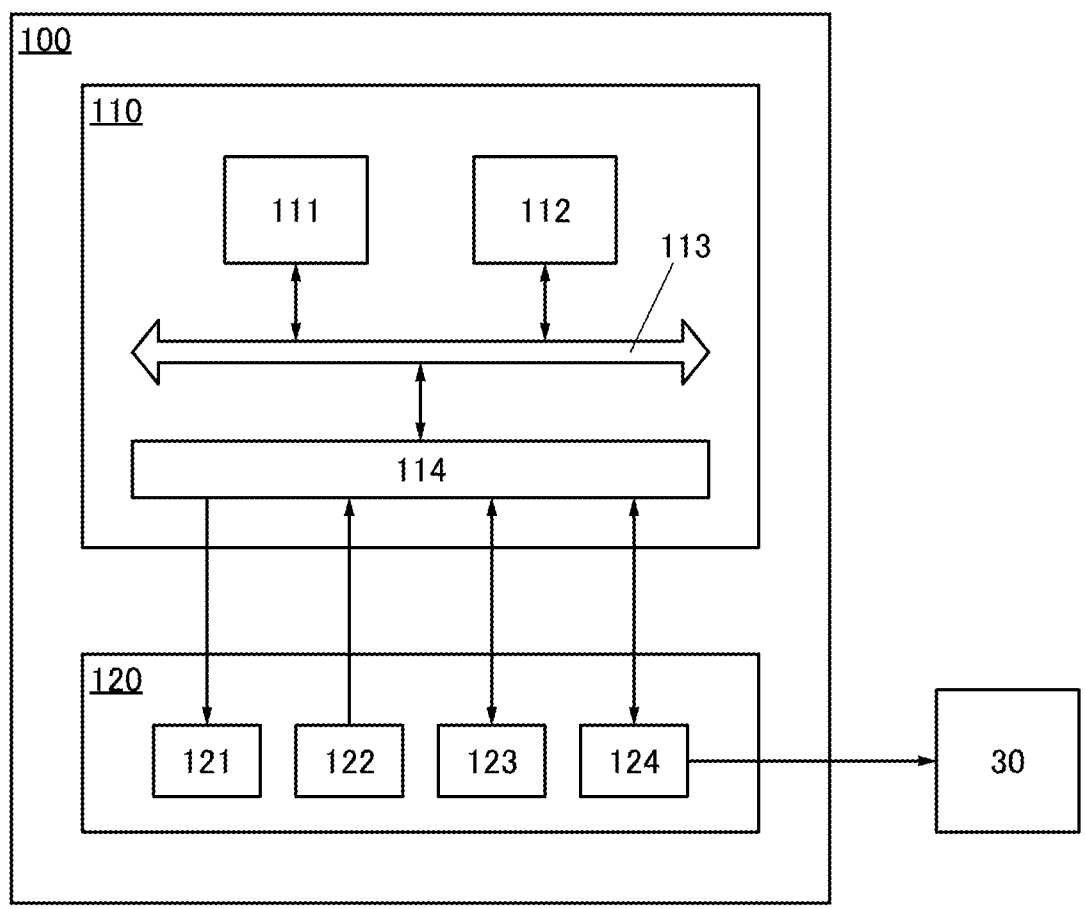
FIG. 11 A diagram illustrating a structure example of an arithmetic device.

As described above, the learning unit LP included in the arithmetic unit 40 can include software. In the case where the processing by the learning unit LP is performed using a program, an arithmetic device is used as the arithmetic unit 40, and the arithmetic device can execute the program. FIG. 11 illustrates a structure example of the arithmetic device.

An arithmetic device 100 includes a processing device 110 and an input/output device 120. The processing device 110 has a function of performing a variety of arithmetic operations such as execution of a program. The processing device 110 includes an arithmetic unit 111, a memory unit 112, a transmission path 113, and an interface 114. The input/output device 120 includes a display unit 121, an operation unit 122, an input/output unit 123, and a communication unit 124.

The memory unit 112 has a function of storing a program or the like that performs processing of the teaming unit LP. As the memory unit 112, non-transitory computer-readable memory media can be used, and for example, a memory such as a DRAM (Dynamic Random Access Memory) or an SRAM (Static Random Access Memory) can be used. Alternatively, as the memory unit 112, a resistance change memory typified by a ReRAM (Resistive Random Access Memory) or the like, a magnetoresistive memory typified by an MRAM (Magnetoresistive Random Access Memory) or the like, a nonvolatile memory typified by a flash memory, or the like can be used. The program stored in the memory unit 112 may include processing by the neural network NN2 illustrated in FIG. 8.

The arithmetic unit 111 has a function of performing an arithmetic operation with use of information stored in the memory unit 112. A program stored in the memory unit 112 is executed by the arithmetic unit 111.

The transmission path 113 has a function of transmitting information. Information can be transmitted and received between the arithmetic unit 111, the memory unit 112, and the interface 114 through the transmission path 113.

The interface 114 has a function of transmitting information to the input/output device 120 and a function of receiving information output from the input/output device 120.

The display unit 121 has a function of displaying an image on the basis of information input from the processing device 110. A display device such as a liquid crystal display or an organic EL display can be used as the display unit 121.

The operation unit 122 has a function of transmitting an instruction to the processing device 110 in response to an operation by the user. As the operation unit 122, a keyboard, a mouse, an operation button, a touch sensor, a pointing device, or the like can be used.

The input/output unit 123 has a function of inputting information to the processing device 110 or outputting information input from the processing device 110. As the input/output unit 123, a camera, a microphone, an external memory device, a scanner, a speaker, a printer, or the like can be used. As an external memory device, a hard disk, a removable memory, or the like can be used.

The communication unit 124 has a function of transmitting information input from the processing device 110 to the outside of the arithmetic device 100 and a function of receiving information from the outside of the arithmetic device 100 and outputting the information to the processing device 110. As the communication unit 124, a hub, a router, a modem, or the like can be used. Information may be transmitted and received through wire communication or wireless communication (e.g., radio waves or infrared light).

The weight coefficient W (see FIG. 1 and the like) obtained by execution of the program stored in the memory unit 112 can be transmitted to the signal generation unit 30 through the communication unit 124.

This embodiment can be combined with the description of the other embodiments as appropriate.

Embodiment 3

In this embodiment, structure examples of a semiconductor device that can be used in the neural networks described in the above embodiment are described.

In the case where a neural network includes hardware, product-sum operation in the neural network can be performed with the use of a product-sum operation element. In this embodiment, structure examples of a semiconductor device that can be used as a product-sum operation element in the neural network NN1 are described.

<Structure Example of Semiconductor Device>

Figure 12:
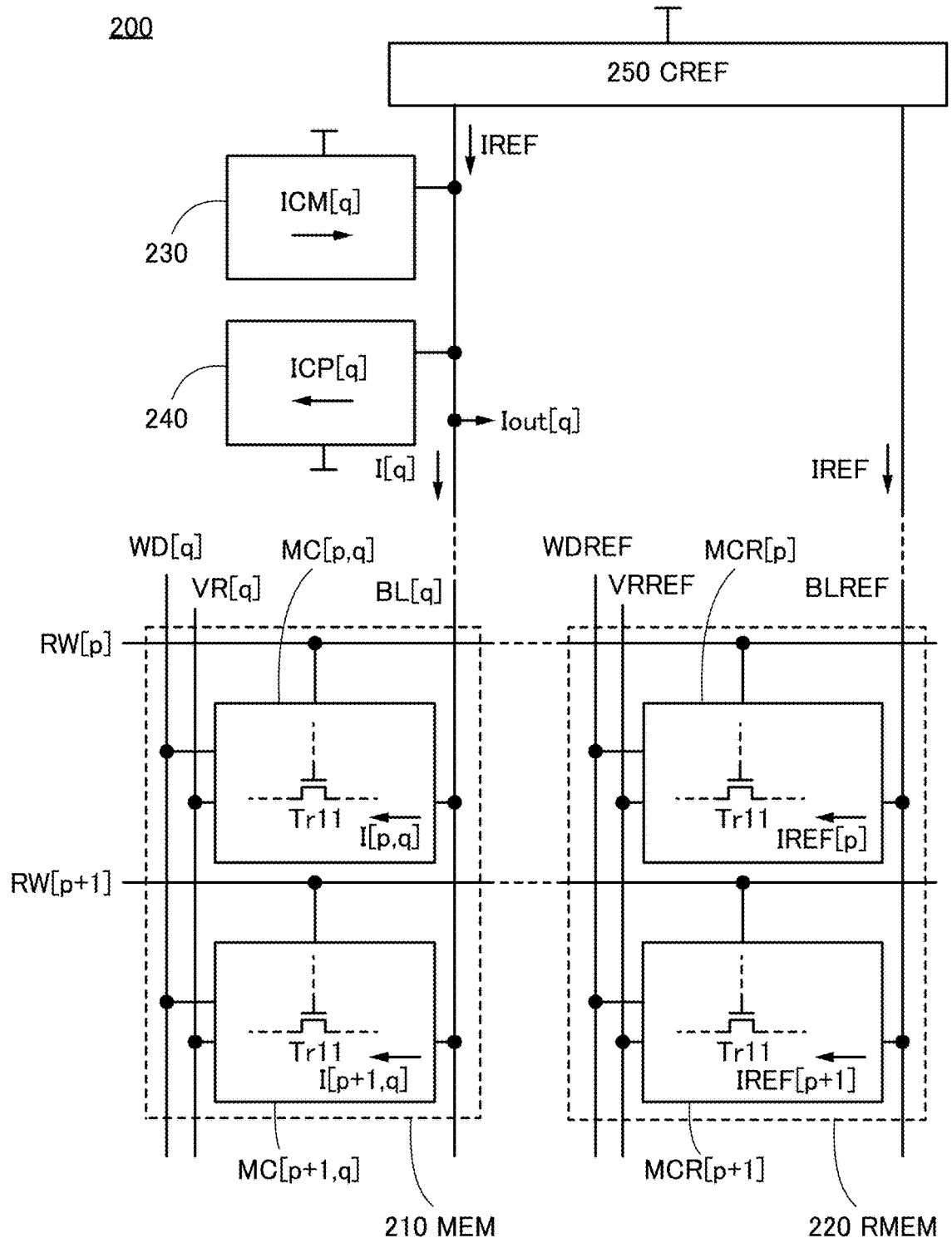
FIG. 12 A diagram illustrating a structure example of a semiconductor device.

FIG. 12 illustrates a structure example of a semiconductor device 200. The semiconductor device 200 illustrated in FIG. 12 includes a memory circuit 210 (MEM), a reference memory circuit 220 (RMEM), a circuit 230, and a circuit 240. The semiconductor device 200 may further include a current supply circuit 250 (CREF).

The memory circuit 210 (MEM) includes memory cells MC such as a memory cell MC [p, q] and a memory cell MC[p+1, q]. The memory cells MC each include an element that has a function of converting an input potential into current. As the element having such a function, an active element such as a transistor can be used, for example. FIG. 12 illustrates an example where the memory cells MC each include a transistor Tr11.

A first analog potential is input to the memory cells MC through a wiring WD such as a wiring WD[q]. The first analog potential corresponds to first analog data. The memory cells MC each have a function of generating a first analog current corresponding to the first analog potential. Specifically, drain current of the transistor Tr11 that is obtained when the first analog potential is supplied to a gate of the transistor Tr11 can be used as the first analog current. Hereinafter, current flowing in the memory cell MC[p, q] is denoted by I[p, q], and current flowing in the memory cell MC[p+1, q] is denoted by I[p+1, q].

Note that the drain current of the transistor Tr11 operating in a saturation region is not dependent on voltage between its source and drain and is controlled by the difference between its gate voltage and threshold voltage. Thus, the transistor Tr11 desirably operates in a saturation region. The gate voltage and the voltage between the source and the drain of the transistor Tr11 are each appropriately set to a voltage at which the transistor Tr11 operates in a saturation region.

Specifically, in the semiconductor device 200 illustrated in FIG. 12, a first analog potential Vx[p, q] or a potential corresponding to the first analog potential Vx[p, q] is input to the memory cell MC[p, q] through the wiring WD[q]. The memory cell MC[p, q] has a function of generating a first analog current corresponding to the first analog potential Vx[p, q]. This means that the current I[p, q] in the memory cell MC[p, q] corresponds to the first analog current, in this case.

Specifically, in the semiconductor device 200 illustrated in FIG. 12, a first analog potential Vx[p+1, q] or a potential corresponding to the first analog potential Vx[p+1, q] is input to the memory cell MC[p+1, q] through the wiring WD[q]. The memory cell MC[p+1, q] has a function of generating a first analog current corresponding to the first analog potential Vx[p+1, q]. This means that the current I[p+1, q] in the memory cell MC[p+1, q] corresponds to the first analog current, in this case.

The memory cells MC each have a function of holding the first analog potential. In other words, by holding the first analog potential, the memory cells MC each have a function of holding the first analog current corresponding to the first analog potential.

A second analog potential is input to the memory cells MC through a wiring RW such as a wiring RW[p] or a wiring RW[p+1]. The second analog potential corresponds to second analog data. The memory cells MC each have a function of adding the second analog potential or a potential corresponding to the second analog potential to the first analog potential that has been held and a function of holding a third analog potential obtained by the addition. The memory cells MC each also have a function of generating a second analog current corresponding to the third analog potential. In other words, by holding the third analog potential, the memory cells MC each have a function of holding the second analog current corresponding to the third analog potential.

Specifically, in the semiconductor device 200 illustrated in FIG. 12, a second analog potential Vw[p, q] is input to the memory cell MC[p, q] through the wiring RW[p]. The memory cell MC[p, q] has a function of holding a third analog potential corresponding to the first analog potential Vx[p, q] and the second analog potential Vw[p, q]. The memory cell MC[p, q] also has a function of generating a second analog current corresponding to the third analog potential. This means that the current I[p, q] in the memory cell MC[p, q] corresponds to the second analog current, in this case.

Furthermore, in the semiconductor device 200 illustrated in FIG. 12, a second analog potential Vw[p+1, q] is input to the memory cell MC[p+1, q] through the wiring RW[p+1]. The memory cell MC[p+1, q] has a function of holding a third analog potential corresponding to the first analog potential Vx[p+1, q] and the second analog potential Vw[p+1, q]. The memory cell MC[p+1, q] also has a function of generating a second analog current corresponding to the third analog potential. This means that the current I[p+1, q] in the memory cell MC[p+1, q] corresponds to the second analog current, in this case.

The current I[p, q] flows between a wiring BL[q] and a wiring VR[q] through the memory cell MC[p, q]. The current I[p+1, q] flows between the wiring BL[q] and the wiring VR[q] through the memory cell MC[p+1, q]. Accordingly, a current I[q], which corresponds to the sum of the current I[p, q] and the current I[p+1, q], flows between the wiring BL[q] and the wiring VR[q] through the memory cell MC[p, q] and the memory cell MC[p+1, q].

The reference memory circuit 220 (RMEM) includes memory cells MCR such as a memory cell MCR[p] and a memory cell MCR[p+1]. A first reference potential VPR is input to the memory cells MCR through a wiring WDREF. The memory cells MCR each have a function of generating a first reference current corresponding to the first reference potential VPR. Note that hereinafter, current flowing in the memory cell MCR[p] is denoted by IREF[p], and current flowing in the memory cell MCR[p+1] is denoted by IREF[p+1].

Specifically, in the semiconductor device 200 illustrated in FIG. 12, the first reference potential VPR is input to the memory cell MCR[p] through the wiring WDREF. The memory cell MCR[p] has a function of generating the first reference current corresponding to the first reference potential VPR. This means that the current IREF[p] in the memory cell MCR[p] corresponds to the first reference current, in this case.

Furthermore, in the semiconductor device 200 illustrated in FIG. 12, the first reference potential VPR is input to the memory cell MCR[p+1] through the wiring WDREF. The memory cell MCR[p+1] has a function of generating the first reference current corresponding to the first reference potential VPR. This means that the current IREF[p+1] in the memory cell MCR[p+1] corresponds to the first reference current, in this case.

The memory cells MCR each have a function of holding the first reference potential VPR. In other words, by holding the first reference potential VPR, the memory cells MCR each have a function of holding the first reference current corresponding to the first reference potential VPR.

Moreover, the second analog potential is input to the memory cells MCR through the wiring RW such as the wiring RW[p] or the wiring RW[p+1]. The memory cells MCR each have a function of adding the second analog potential or a potential corresponding to the second analog potential to the first reference potential VPR that has been held and a function of holding a second reference potential obtained by the addition. The memory cells MCR each also have a function of generating a second reference current corresponding to the second reference potential. In other words, by holding the second reference potential, the memory cells MCR each have a function of holding the second reference current corresponding to the second reference potential.

Specifically, in the semiconductor device 200 illustrated in FIG. 12, the second analog potential Vw[p, q] is input to the memory cell MCR[p] through the wiring RW[p]. The memory cell MCR[p] has a function of holding a second reference potential corresponding to the first reference potential VPR and the second analog potential Vw[p, q]. The memory cell MCR[p] also has a function of generating the second reference current corresponding to the second reference potential. This means that the current IREF[p] in the memory cell MCR[p] corresponds to the second reference current, in this case.

Furthermore, in the semiconductor device 200 illustrated in FIG. 12, the second analog potential Vw[p+1, q] is input to the memory cell MCR[p+1] through the wiring RW[p+1].

The memory cell MCR[p+1] has a function of holding a second reference potential corresponding to the first reference potential VPR and the second analog potential Vw[p+1, q]. The memory cell MCR[p+1] also has a function of generating the second reference current corresponding to the second reference potential. This means that the current IREF[p+1] in the memory cell MCR[p+1] corresponds to the second reference current, in this case.

The current IREF[p] flows between a wiring BLREF and a wiring VRREF through the memory cell MCR[p]. The current IREF[p+1] flows between the wiring BLREF and the wiring VRREF through the memory cell MCR[p+1]. Accordingly, a current IREF, which corresponds to the sum of the current IREF[p] and the current IREF[p+1], flows between the wiring BLREF and the wiring VRREF through the memory cell MCR[p] and the memory cell MCR[p+1].

The current supply circuit 250 has a function of supplying current with the same value as the current IREF that flows through the wiring BLREF or supplying current corresponding to the current IREF to the wiring BL. In the case where the current I[q] that flows between the wiring BL[q] and the wiring VR[q] through the memory cell MC[p, q] and the memory cell MC[p+1, q] is different from the current IREF that flows between the wiring BLREF and the wiring VRREF through the memory cell MCR[p] and the memory cell MCR[p+1] and thus offset current is set as described later, current corresponding to the difference flows in the circuit 230 or the circuit 240. The circuit 230 serves as a current source circuit, and the circuit 240 serves as a current sink circuit.

Specifically, in the case where the current I[q] is higher than the current IREF, the circuit 230 has a function of generating a current ΔI[q] that corresponds to the difference between the current I[q] and the current IREF. The circuit 230 also has a function of supplying the generated current ΔI[q] to the wiring BL[q]. This means that the circuit 230 has a function of holding the current ΔI[q].

In the case where the current I[q] is lower than the current IREF, the circuit 240 has a function of generating current corresponding to the absolute value of the current ΔI[q] that corresponds the difference between the current I[q] and the current IREF. The circuit 240 also has a function of drawing the generated current ΔI[q] from the wiring BL[q]. This means that the circuit 240 has a function of holding the current ΔI[q].

Next, an operation example of the semiconductor device 200 illustrated in FIG. 12 is described.

First, a potential corresponding to the first analog potential is stored in the memory cell MC[p, q]. Specifically, a potential VPR−Vx[p, q], which is obtained by subtracting the first analog potential Vx[p, q] from the first reference potential VPR, is input to the memory cell MC[p, q] through the wiring WD[q]. The memory cell MC[p, q] holds the potential VPR−Vx[p, q]. In addition, the memory cell MC[p, q] generates the current I[p, q] that corresponds to the potential VPR−Vx[p, q]. The first reference potential VPR is, for example, a potential that is higher than a ground potential. Specifically, the first reference potential VPR is desirably higher than a ground potential and as high as or lower than a high-level potential VDD that is supplied to the current supply circuit 250.

Furthermore, the first reference potential VPR is stored in the memory cell MCR[p]. Specifically, the first reference potential VPR is input to the memory cell MCR[p] through the wiring WDREF. The memory cell MCR[p] holds the first reference potential VPR. In addition, the memory cell MCR[p] generates the current IREF[p] that corresponds to the first reference potential VPR.

Moreover, a potential corresponding to the first analog potential is stored in the memory cell MC[p+1, q]. Specifically, a potential VPR−Vx[p+1, q], which is obtained by subtracting the first analog potential Vx[p+1, q] from the first reference potential VPR, is input to the memory cell MC[p+1, q] through the wiring WD[q]. The memory cell MC[p+1, q] holds the potential VPR−Vx[p+1, q]. In addition, the memory cell MC[p+1, q] generates the current I[p+1, q] that corresponds to the potential VPR−Vx[p+1, q].

Furthermore, the first reference potential VPR is stored in the memory cell MCR[p+1]. Specifically, the first reference potential VPR is input to the memory cell MCR[p+1] through the wiring WDREF. The memory cell MCR[p+1] holds the first reference potential VPR. In addition, the memory cell MCR[p+1] generates the current IREF[p+1] that corresponds to the first reference potential VPR.

During the above operation, the potentials of the wiring RW[p] and the wiring RW[p+1] are set to a base potential. As a base potential, for example, a ground potential or a low-level potential VSS that is lower than a base potential can be used. Alternatively, a potential between the potential VSS and the potential VDD is preferably used as a base potential, in which case the potential of the wiring RW can be higher than the ground potential regardless of whether the second analog potential Vw is positive or negative, which enables easy generation of signals and multiplication of either positive or negative analog data.

As a result of the above operation, current corresponding to the sum of currents generated in the memory cells MC connected to the wiring BL[q] flows through the wiring BL[q]. Specifically, in FIG. 12, the current I[q], which is the sum of the current I[p, q] generated in the memory cell MC[p, q] and the current I[p+1, q] generated in the memory cell MC[p+1, q], flows. In addition, as a result of the above operation, current corresponding to the sum of currents generated in the memory cells MCR connected to the wiring BLREF flows through the wiring BLREF. Specifically, in FIG. 12, the current IREF, which is the sum of the current IREF[p] generated in the memory cell MCR[p] and the current IREF[p+1] generated in the memory cell MCR[p+1], flows.

Next, an offset current Ioffset[q], which is obtained from the difference between the current I[q] obtained by inputting the first analog potential and the current IREF obtained by inputting the first reference potential, is held in the circuit 230 or the circuit 240 while the potentials of the wiring RW[p] and the wiring RW[p+1] are kept at base potentials.

Specifically, when the current I[q] is higher than the current IREF, the circuit 230 supplies the current Ioffset[q] to the wiring BL[q]. This means that a current ICM[q] that flows in the circuit 230 corresponds to the current Ioffset[q]. The value of the current ICM[q] is held in the circuit 230. When the current I[q] is lower than the current IREF, the circuit 240 draws the current Ioffset[q] from the wiring BL[q]. This means that a current ICP[q] that flows in the circuit 240 corresponds to the current Ioffset[q]. The value of the current ICP[q] is held in the circuit 240.

Then, the second analog potential or a potential corresponding to the second analog potential is stored in the memory cell MC[p, q] so as to be added to the first analog potential or a potential corresponding to the first analog potential that has been held in the memory cell MC[p, q]. Specifically, when the potential of the wiring RW[p] is set to a potential that is higher than a base potential by Vw[p], a second analog potential Vw[p] is input to the memory cell MC[p, q] through the wiring RW[p]. The memory cell MC[p, q] holds a potential VPR−Vx[p, q]+Vw[p]. Furthermore, the memory cell MC[p, q] generates the current I[p, q] corresponding to the potential VPR−Vx[p, q]+Vw[p].

In addition, the second analog potential or the potential corresponding to the second analog potential is stored in the memory cell MC[p+1, q] so as to be added to the first analog potential or a potential corresponding to the first analog potential that has been held in the memory cell MC[p+1, q]. Specifically, when the potential of the wiring RW[p+1] is set to a potential that is higher than a base potential by Vw[p+1], a second analog potential Vw[p+1] is input to the memory cell MC[p+1, q] through the wiring RW[p+1]. The memory cell MC[p+1, q] holds a potential VPR−Vx[p+1, q]+Vw[p+1]. Furthermore, the memory cell MC[p+1, q] generates the current I[p+1, q] corresponding to the potential VPR−Vx[p+1, q]+Vw[p+1].

In the case where the transistor Tr11 that operates in a saturation region is used as an element for converting a potential into current, Vw[p] is assumed to be the potential of the wiring RW[p], and Vw[p+1] is assumed to be the potential of the wiring RW[p+1], since the drain current of the transistor Tr11 included in the memory cell MC[p, q] corresponds to the current I[p, q], the second analog current is expressed by Formula 1 below. Note that k is a coefficient and Vth is the threshold voltage of the transistor Tr11.

$$I[p,q]=k(Vw[p]-Vth+VPR-Vw[p,q])^2 \quad \text{(Formula 1)}$$

Furthermore, since the drain current of the transistor Tr11 included in the memory cell MCR[p] corresponds to the current IREF[p], the second reference current is expressed by Formula 2 below.

$$IREF[p]=k(Vw[p]-Vth+VPR)^2 \quad \text{(Formula 2)}$$

The current I[q], which corresponds to the sum of the current I[p, q] flowing in the memory cell MC[p, q] and the current I[p+1, q] flowing in the memory cell MC[p+1, q], is expressed as ΣiI[p, q], and the current IREF, which corresponds to the sum of the current IREF[p] flowing in the memory cell MCR[p] and the current IREF[p+1] flowing in the memory cell MCR[p+1], is expressed as ΣiIREF[p]; accordingly, the current ΔI[q] that corresponds to the difference between the current I[q] and the current IREF is expressed by Formula 3 below.

$$\Delta I[q]=IREF-I[q]=\Sigma iIREF[p]-\Sigma iI[p,q] \quad \text{(Formula 3)}$$

The current ΔI[q] can be obtained from Formula 1, Formula 2, and Formula 3, as expressed by Formula 4 below.

$$\Delta I[q] = \sum i\{k(Vw[p] - Vth + VPR)^2 - \quad \text{(Formula 4)}$$
$$k(Vw[p] - Vth + VPR - Vx[p, q])^2\} =$$
$$2k\sum i(Vw[p]\cdot Vx[p, q]) - 2k\sum i(Vth - VPR)\cdot Vx[p, q] -$$
$$k\sum iVx[p, q]^2$$

The term 2kΣi(Vw[p]·Vx[p, q]) in Formula 4 corresponds to the sum of the product of the first analog potential Vx[p, q] and the second analog potential Vw[p] and the product of the first analog potential Vx[p+1, q] and the second analog potential Vw[p+1].

Furthermore, if the current Ioffset[q] is defined as the current ΔI[q] at the time when the potential of the wiring RW[p] is all set to a base potential, that is, when the second analog potential Vw[p] is 0 and the second analog potential Vw[p+1] is 0, Formula 5 below can be obtained from Formula 4.

$$Ioffset[q]=-2k\Sigma i(Vth-VPR)\cdot Vx[p,q]-k\Sigma iVx[p,q]^2 \quad \text{(Formula 5)}$$

According to Formulae 3 to 5, 2kΣi(Vw[p]·Vx[p, q]) that corresponds to the product-sum of the first analog data and the second analog data is expressed by Formula 6 below.

$$2k\Sigma i(Vw[p]\cdot Vx[p,q])=IREF-I[q]-Ioffset[q] \quad \text{(Formula 6)}$$

When the potential of the wiring RW[p] is Vw[p] and the potential of the wiring RW[p+1] is Vw[p+1], a current Iout[q] that flows from the wiring BL[q] is expressed by IREF−I[q]−Ioffset[q], where I[q] is the sum of currents flowing in the memory cells MC, IREF is the sum of currents flowing in the memory cells MCR, and Ioffset[q] is current flowing in the circuit 230 or the circuit 240. According to Formula 6, the current Iout[q] is equal to 2kΣi(Vw[p]·Vx[p, q]), which corresponds to the sum of the product of the first analog potential Vx[p, q] and the second analog potential Vw[p] and the product of the first analog potential Vx[p+1, q] and the second analog potential Vw[p+1].

The transistor Tr11 desirably operates in a saturation region; however, even if the operation region of the transistor Tr11 deviates from an ideal saturation region, the transistor Tr11 is regarded as operating in a saturation region as long as there is no problem in obtaining current that corresponds to the sum of the product of the first analog potential Vx[p, q] and the second analog potential Vw[p] and the product of the first analog potential Vx[p+1, q] and the second analog potential Vw[p+1] with an accuracy within a desired range.

According to one embodiment of the present invention, analog data can be subjected to arithmetic processing without being converted into digital data; thus, the circuit scale of a semiconductor device can be reduced. Alternatively, according to one embodiment of the present invention, analog data can be subjected to arithmetic processing without being converted into digital data; thus, the time required for the arithmetic processing of analog data can be shortened. Alternatively, according to one embodiment of the present invention, power consumption of a semiconductor device can be reduced while the time required for arithmetic processing of analog data is shortened.

<Structure Example of Memory Circuit>

Next, a specific structure example of the memory circuit 210 (MEM) and the reference memory circuit 220 (RMEM) is described with reference to FIG. 13.

Figure 13:
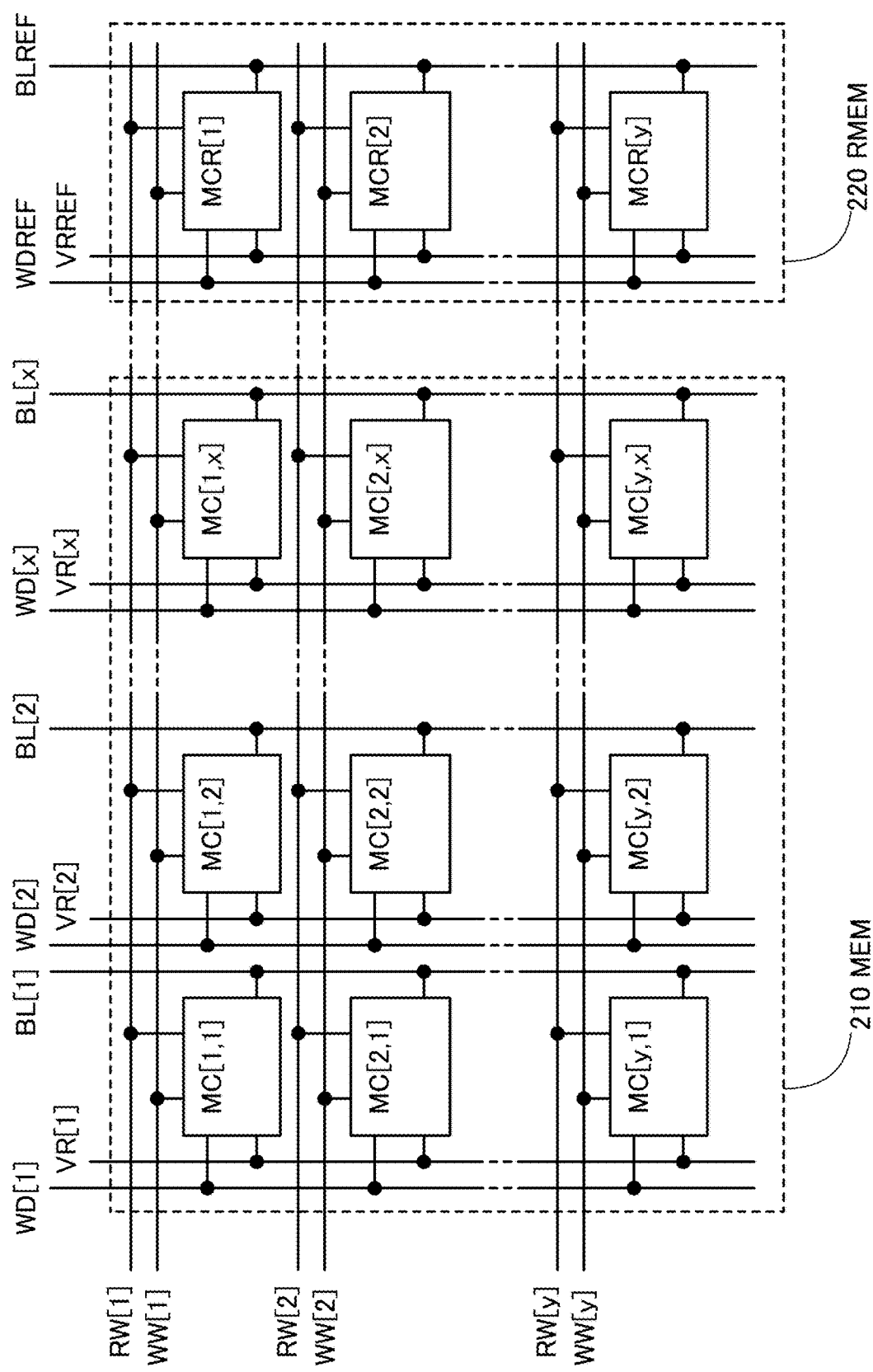
FIG. 13 A diagram illustrating a structure example of a memory circuit.

FIG. 13 illustrates an example where the memory circuit 210 (MEM) includes the memory cells MC in y rows and x columns (x and y are natural numbers) and the reference memory circuit 220 (RMEM) includes the memory cells MCR in y rows and one column.

Note that a source of a transistor in this specification and the like means a source region that is part of a semiconductor layer functioning as a channel region, a source electrode connected to the semiconductor layer, or the like. Similarly, a drain of a transistor means a drain region that is part of the semiconductor layer, a drain electrode connected to the semiconductor layer, or the like. A gate means a gate electrode or the like.

The names of a source and a drain of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although the connection relation of a transistor is sometimes described assuming that the source and the drain are fixed for convenience, actually, the names of the source and the drain interchange with each other depending on the relation of the potentials.

The memory circuit 210 is connected to the wiring RW, a wiring WW, the wiring WD, the wiring VR, and the wiring BL. In the example illustrated in FIG. 13, wirings RW[1] to RW[y] are connected to the memory cells MC in the respective rows, wirings WW[1] to WW[y] are connected to the memory cells MC in the respective rows, wirings WD[1] to WD[x] are connected to the memory cells MC in the respective columns, and wirings BL[1] to BL[x] are connected to the memory cells MC in the respective columns. Moreover, in the example illustrated in FIG. 13, wirings VR[1] to VR[x] are connected to the memory cells MC in the respective columns. Note that the wirings VR[1] to VR[x] may be connected to each other.

The reference memory circuit 220 is connected to the wiring RW, the wiring WW, the wiring WDREF, the wiring VRREF, and the wiring BLREF. In the example illustrated in FIG. 13, the wirings RW[1] to RW[y] are connected to the memory cells MCR in the respective rows, the wirings WW[1] to WW[y] are connected to the memory cells MCR in the respective rows, the wiring WDREF is connected to the memory cells MCR in the one column, the wiring BLREF is connected to the memory cells MCR in the one column, and the wiring VRREF is connected to the memory cells MCR in the one column. Note that the wiring VRREF may be connected to the wirings VR[1] to VR[x].

Figure 14:
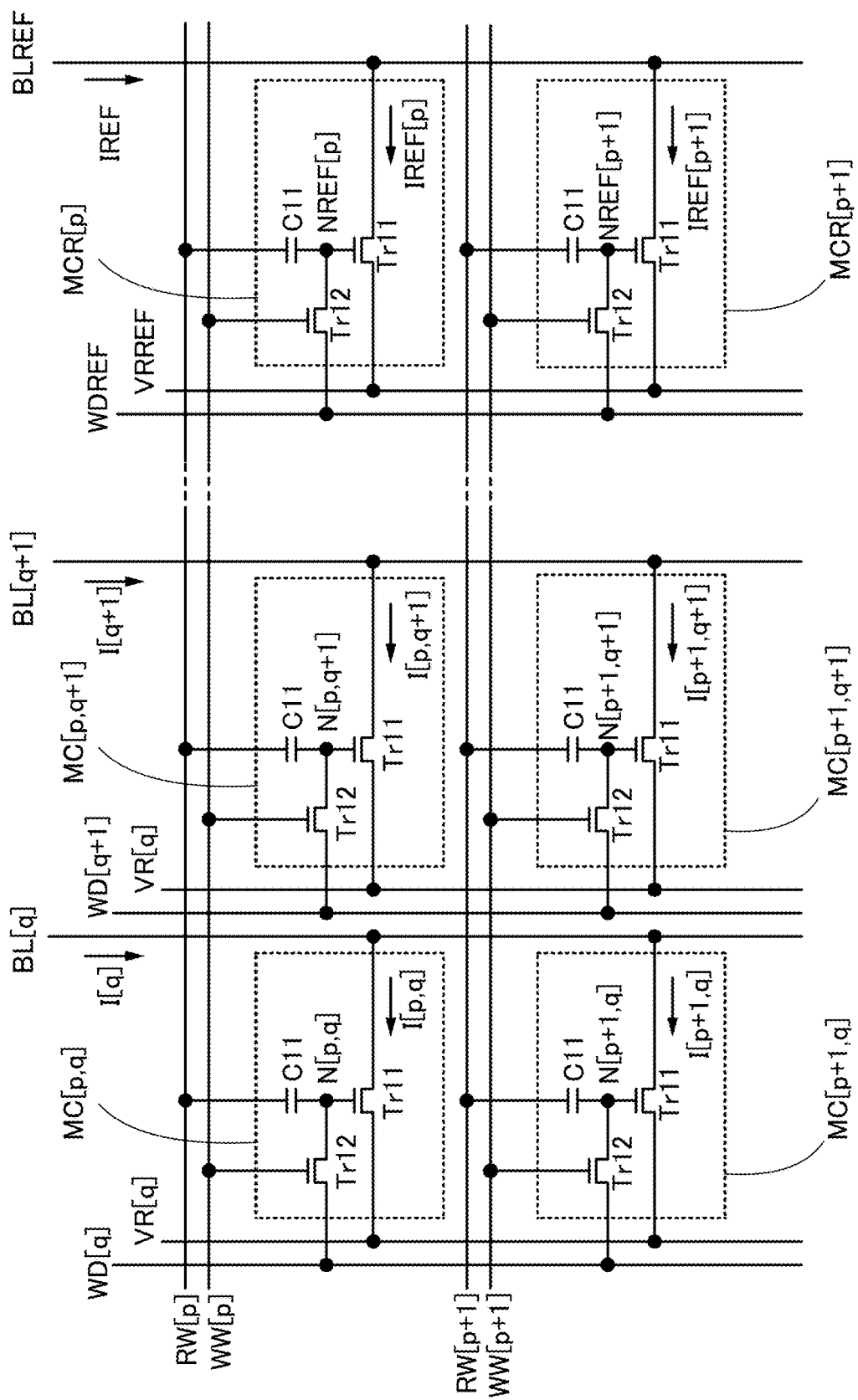
FIG. 14 A diagram illustrating a structure example of memory cells.

Next, FIG. 14 illustrates, as an example, a specific circuit structure and a specific connection relation of the memory cells MC in any two rows and two columns among the memory cells MC illustrated in FIG. 13 and the memory cells MCR in any two rows and one column among the memory cells MCR illustrated in FIG. 13.

Specifically, FIG. 14 illustrates the memory cell MC[p, q] in the p-th row and the q-th column, the memory cell MC[p+1, q] in the p+1-th row and the q-th column, a memory cell MC[p, q+1] in the p-th row and the q+1-th column, and a memory cell MC[p+1, q+1] in the p+1-th row and the q+1-th column. Furthermore, specifically, FIG. 14 illustrates the memory cell MCR[p] in the p-th row and the memory cell MCR[p+1] in the p+1-th row. Note that p is any number from 1 to (y−1), and q is any number from 1 to (x−1).

The memory cell MC[p, q], the memory cell MC[p, q+1], and the memory cell MCR[p] in the p-th row are connected to the wiring RW[p] and a wiring WW[p]. The memory cell MC[p+1, q], the memory cell MC[p+1, q+1], and the memory cell MCR[p+1] in the p+1-th row are connected to the wiring RW[p+1] and a wiring WW[p+1].

The memory cell MC[p, q] and the memory cell MC[p+1, q] in the q-th column are connected to the wiring WD[q], the wiring VR[q], and the wiring BL[q]. The memory cell MC[p, q+1] and the memory cell MC[p+1, q+1] in the q+1-th column are connected to a wiring WD[q+1], a wiring VR[q+1], and a wiring BL[q+1]. The memory cell MCR[p] in the p-th row and the memory cell MCR[p+1] in the p+1-th row are connected to the wiring WDREF, the wiring VRREF, and the wiring BLREF.

The memory cells MC and the memory cells MCR each include the transistor Tr11, a transistor Tr12, and a capacitor C11. The transistor Tr12 has a function of controlling the input of the first analog potential to the memory cell MC or the memory cell MCR. The transistor Tr11 has a function of generating analog current in accordance with a potential input to its gate. The capacitor C11 has a function of adding the second analog potential or a potential corresponding to the second analog potential to the first analog potential or a potential corresponding to the first analog potential that is held in the memory cell MC or the memory cell MCR.

Specifically, in the memory cell MC illustrated in FIG. 14, a gate of the transistor Tr12 is connected to the wiring WW, one of a source and a drain is connected to the wiring WD, and the other of the source and the drain is connected to the gate of the transistor Tr11. Furthermore, one of the source and the drain of the transistor Tr11 is connected to the wiring VR, and the other of the source and the drain is connected to the wiring BL. A first electrode of the capacitor C11 is connected to the wiring RW, and a second electrode is connected to the gate of the transistor Tr11.

In addition, in the memory cell MCR illustrated in FIG. 14, the gate of the transistor Tr12 is connected to the wiring WW, one of the source and the drain is connected to the wiring WDREF, and the other of the source and the drain is connected to the gate of the transistor Tr11. Furthermore, one of the source and the drain of the transistor Tr11 is connected to the wiring VRREF, and the other of the source and the drain is connected to the wiring BLREF. The first electrode of the capacitor C11 is connected to the wiring RW, and the second electrode is connected to the gate of the transistor Tr11.

When the gate of the transistor Tr11 in the memory cell MC is called a node N, in the memory cell MC, the first analog potential or the potential corresponding to the first analog potential is input to the node N through the transistor Tr12, and then, when the transistor Tr12 is turned off, the node N is brought into a floating state and the first analog potential or the potential corresponding to the first analog potential is held at the node N. In the memory cell MC, when the node N is brought into a floating state, the second analog potential or the potential corresponding to the second analog potential that is input to the first electrode of the capacitor C11 is applied to the node N. As a result of the above operation, the node N can have a potential obtained by adding the second analog potential or the potential corresponding to the second analog potential to the first analog potential or the potential corresponding to the first analog potential.

Since the potential of the first electrode of the capacitor C11 is applied to the node N through the capacitor C11, the amount of change in the potential of the first electrode is not exactly the same as the amount of change in the potential of the node N, actually. Specifically, the accurate amount of change in the potential of the node N can be calculated in the following manner: a coupling coefficient uniquely determined by the capacitance value of the capacitor C11, the capacitance value of the gate capacitance of the transistor Tr11, and the capacitance value of parasitic capacitance is multiplied by the amount of change in the potential of the first electrode. In the following description, the amount of change in the potential of the first electrode is assumed to be substantially the same as the amount of change in the potential of the node N, for easy understanding.

The drain current of the transistor Tr11 is determined by the potential of the node N. Thus, when the transistor Tr12 is turned off and thus the potential of the node N is held, the value of the drain current of the transistor Tr11 is also held. The drain current is affected by the first analog potential and the second analog potential.

When the gate of the transistor Tr11 in the memory cell MCR is called a node NREF, in the memory cell MCR, the first reference potential or a potential corresponding to the first reference potential is input to the node NREF through the transistor Tr12, and then, when the transistor Tr12 is turned off, the node NREF is brought into a floating state and the first reference potential or the potential corresponding to the first reference potential is held at the node NREF. In the memory cell MCR, when the node NREF is brought into a floating state, the second analog potential or the potential corresponding to the second analog potential that is input to the first electrode of the capacitor C11 is applied to the node NREF. As a result of the above operation, the node NREF can have a potential obtained by adding the second analog potential or the potential corresponding to the second analog potential to the first reference potential or the potential corresponding to the first reference potential.

The drain current of the transistor Tr11 is determined by the potential of the node NREF. Thus, when the transistor Tr12 is turned off and thus the potential of the node NREF is held, the value of the drain current of the transistor Tr11 is also held. The drain current is affected by the first reference potential and the second analog potential.

When the drain current flowing in the transistor Tr11 in the memory cell MC[p, q] is the current I[p, q] and the drain current flowing in the transistor Tr11 in the memory cell MC[p+1, q] is the current I[p+1, q] the sum of currents supplied to the memory cell MC[p, q] and the memory cell MC[p+1, q] from the wiring BL[q] is the current I[q]. When the drain current flowing in the transistor Tr11 in the memory cell MC[p, q+1] is a current I[p, q+1] and the drain current flowing in the transistor Tr11 in the memory cell MC[p+1, q+1] is a current I[p+1, q+1], the sum of currents supplied to the memory cell MC[p, q+1] and the memory cell MC[p+1, q+1] from the wiring BL[q+1] is a current I[q+1]. When the drain current flowing in the transistor Tr11 in the memory cell MCR[p] is the current IREF[p] and the drain current flowing in the transistor Tr11 in the memory cell MCR[p+1] is the current IREF[p+1], the sum of currents supplied to the memory cell MCR[p] and the memory cell MCR[p+1] from the wiring BLREF is the current IREF.

<Structure Example of Circuit 230, Circuit 240, and Current Supply Circuit>

Next, specific structure examples of the circuit 230, the circuit 240, and the current supply circuit 250 (CREF) are described with reference to FIG. 15.

Figure 15:
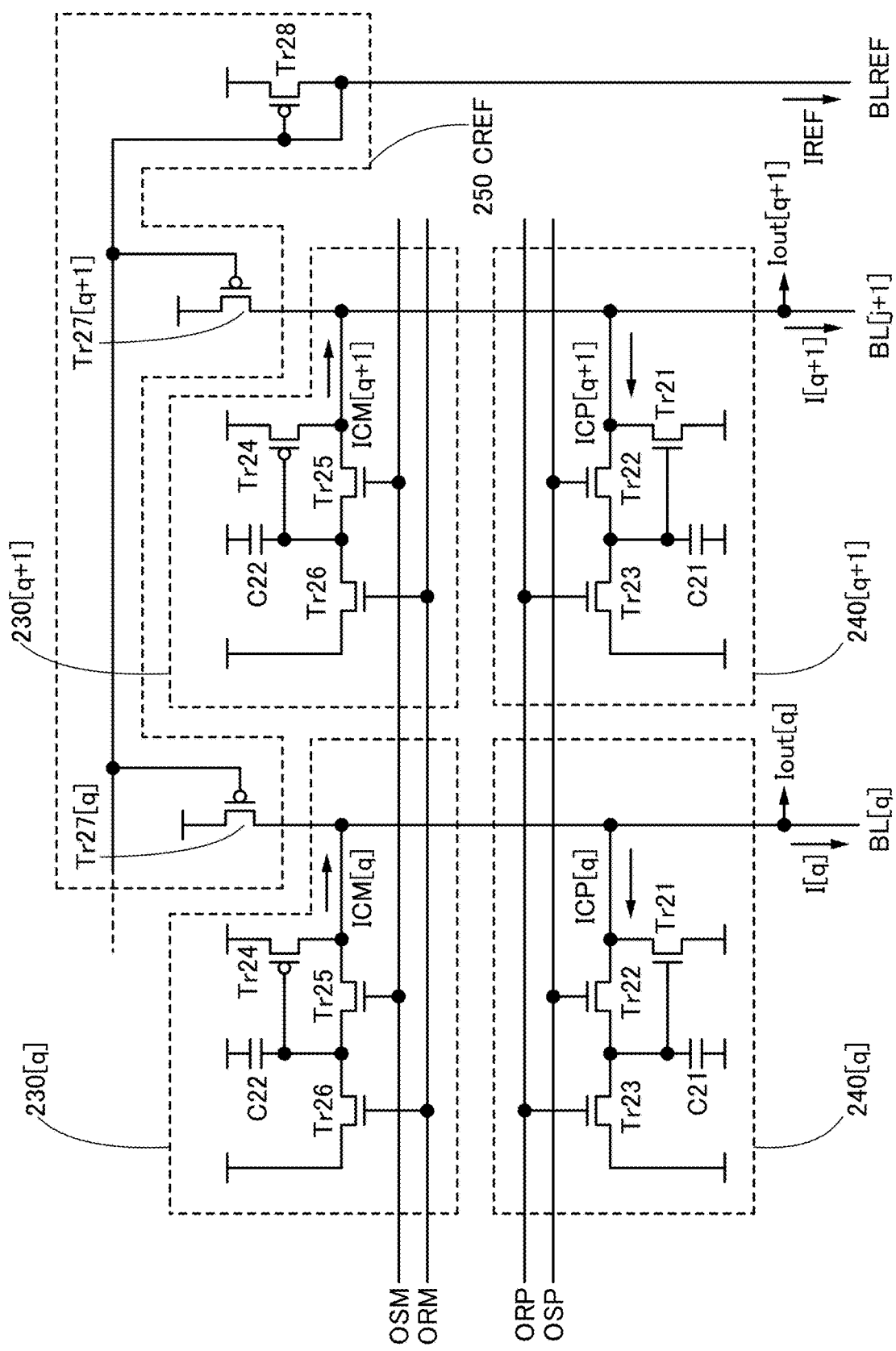
FIG. 15 A diagram illustrating structure examples of circuits.

FIG. 15 illustrates a structure example of the circuit 230, the circuit 240, and the current supply circuit 250 for the memory cells MC and the memory cells MCR illustrated in FIG. 14. Specifically, the circuit 230 illustrated in FIG. 15 includes a circuit 230[$q$] for the memory cells MC in the q-th column and a circuit 230[$q$+1] for the memory cells MC in the q+1-th column. Furthermore, the circuit 240 illustrated in FIG. 15 includes a circuit 240[$q$] for the memory cells MC in the q-th column and a circuit 240[$q$+1] for the memory cells MC in the q+1-th column.

The circuit 230[$q$] and the circuit 240[$q$] are connected to the wiring BL[q]. The circuit 230[$q$+1] and the circuit 240[$q$+1] are connected to the wiring BL[q+1].

The current supply circuit 250 is connected to the wiring BL[q], the wiring BL[q+1], and the wiring BLREF. The current supply circuit 250 has a function of supplying the current IREF to the wiring BLREF and a function of supplying current that is the same as the current IREF or current that corresponds to the current IREF to each of the wiring BL[q] and the wiring BL[q+1].

Specifically, the circuit 230[$q$] and the circuit 230[$q$+1] each include transistors Tr24 to Tr26 and a capacitor C22. The transistor Tr24 in the circuit 230[$q$] has a function of generating the current ICM[q] that corresponds to the difference between the current I[q] and the current IREF, when the current I[q] is higher than the current IREF and offset current is set. Furthermore, the transistor Tr24 in the circuit 230[$q$+1] has a function of generating a current ICM[q+1] that corresponds to the difference between the current I[q+1] and the current IREF, when the current I[q+1] is higher than the current IREF. The current ICM[q] and the current ICM[q+1] are supplied from the circuit 230[$q$] and the circuit 230[$q$+1] to the wiring BL[q] and the wiring BL[q+1], respectively.

In each of the circuit 230[$q$] and the circuit 230[$q$+1], one of a source and a drain of the transistor Tr24 is connected to the corresponding wiring BL, and the other of the source and the drain is connected to a wiring through which a predetermined potential is supplied. One of a source and a drain of the transistor Tr25 is connected to the corresponding wiring BL, and the other of the source and the drain is connected to a gate of the transistor Tr24. One of a source and a drain of the transistor Tr26 is connected to the gate of the transistor Tr24, and the other of the source and the drain is connected to a wiring through which a predetermined potential is supplied. A first electrode of the capacitor C22 is connected to the gate of the transistor Tr24, and a second electrode is connected to a wiring through which a predetermined potential is supplied.

A gate of the transistor Tr25 is connected to a wiring OSM, and a gate of the transistor Tr26 is connected to a wiring ORM.

Note that FIG. 15 illustrates an example where the transistor Tr24 is a p-channel transistor and the transistors Tr25 and Tr26 are n-channel transistors.

The circuit 240[$q$] and the circuit 240[$q$+1] each include transistors Tr21 to Tr23 and a capacitor C21. The transistor Tr21 in the circuit 240[$q$] has a function of generating the current ICP[q] that corresponds to the difference between the current I[q] and the current IREF, when the current I[q] is lower than the current IREF and offset current is set. Furthermore, the transistor Tr21 in the circuit 240[$q$+1] has a function of generating a current ICP[q+1] that corresponds to the difference between the current I[q+1] and the current IREF, when the current I[q+1] is lower than the current IREF. The current ICP[q] and the current ICP[q+1] are drawn from the wiring BL[q] and the wiring BL[q+1] into the circuit 240[$q$] and the circuit 240[$q$+1], respectively.

Note that the current ICM[q] and the current ICP[q] each correspond to the current Ioffset[q]. The current ICM[q+1] and the current ICP[q+1] each correspond to a current Ioffset[q+1].

In each of the circuit 240[$q$] and the circuit 240[$q$+1], one of a source and a drain of the transistor Tr21 is connected to the corresponding wiring BL, and the other of the source and the drain is connected to a wiring through which a predetermined potential is supplied. One of a source and a drain of the transistor Tr22 is connected to the wiring BL, and the other of the source and the drain is connected to a gate of the transistor Tr21. One of a source and a drain of the transistor Tr23 is connected to the gate of the transistor Tr21, and the other of the source and the drain is connected to a wiring through which a predetermined potential is supplied. A first electrode of the capacitor C21 is connected to the gate of the transistor Tr21, and a second electrode is connected to a wiring through which a predetermined potential is supplied.

A gate of the transistor Tr22 is connected to a wiring OSP, and a gate of the transistor Tr23 is connected to a wiring ORP.

Note that FIG. 15 illustrates an example where the transistors Tr21 to Tr23 are n-channel transistors.

The current supply circuit 250 includes a transistor Tr27 for the wiring BL and a transistor Tr28 for the wiring BLREF. Specifically, FIG. 15 illustrates an example where the current supply circuit 250 includes, as the transistor Tr27, a transistor Tr27[q] for the wiring BL[q] and a transistor Tr27[q+1] for the wiring BL[q+1].

A gate of the transistor Tr27 is connected to a gate of the transistor Tr28. One of a source and a drain of the transistor Tr27 is connected to the corresponding wiring BL, and the other of the source and the drain is connected to a wiring through which a predetermined potential is supplied. One of a source and a drain of the transistor Tr28 is connected to the wiring BLREF, and the other of the source and the drain is connected to a wiring through which a predetermined potential is supplied.

The transistor Tr27 and the transistor Tr28 have the same polarity. FIG. 15 illustrates an example where the transistor Tr27 and the transistor Tr28 are p-channel transistors.

The drain current of the transistor Tr28 corresponds to the current IREF. The transistor Tr27 and the transistor Tr28 collectively serve as a current mirror circuit; thus, the drain current of the transistor Tr27 is substantially the same as the drain current of the transistor Tr28 or corresponds to the drain current of the transistor Tr28.

<Operation Example of Semiconductor Device>

Next, a specific operation example of the semiconductor device 200 of one embodiment of the present invention is described with reference to FIG. 14 to FIG. 16.

Figure 16:
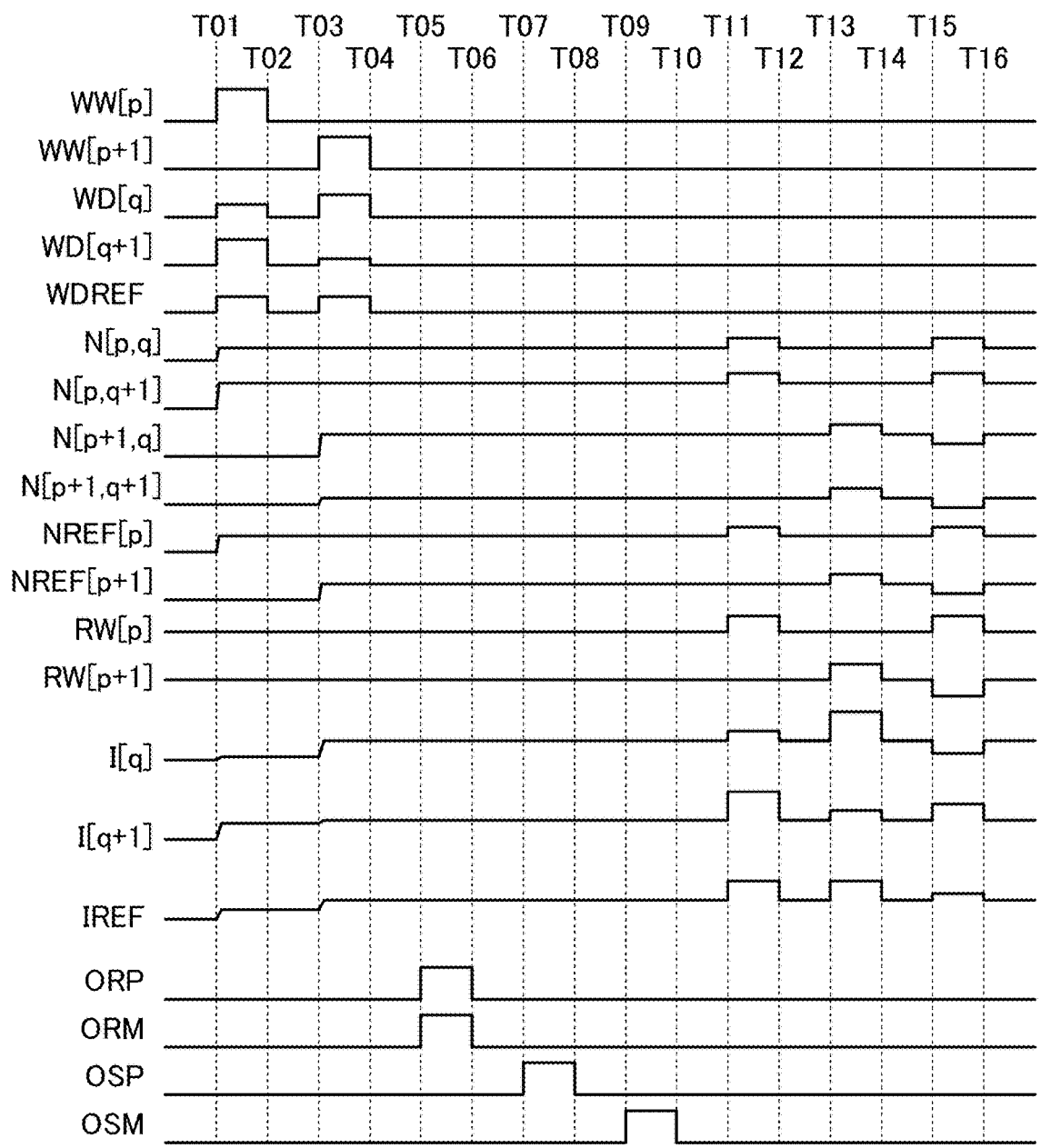
FIG. 16 A timing chart.

FIG. 16 corresponds to an example of a timing chart showing the operations of the memory cells MC and the memory cells MCR illustrated in FIG. 14 and the circuit 230, the circuit 240, and the current supply circuit 250 illustrated in FIG. 15. From Time T01 to Time T04 in FIG. 16, the first analog data is stored in the memory cells MC and the memory cells MCR. From Time T05 to Time T10, the current value of the offset current Ioffset that is supplied from the circuit 230 and the circuit 240 is set. From Time T11 to Time T16, data corresponding to the product-sum of the first analog data and the second analog data is obtained.

Note that a low-level potential is supplied to the wiring VR[q] and the wiring VR[q+1]. The high-level potential VDD is supplied to all wirings having a predetermined potential that are connected to the circuit 230. The low-level potential VSS is supplied to all wirings having a predetermined potential that are connected to the circuit 240. Furthermore, the high-level potential VDD is supplied to all wirings having a predetermined potential that are connected to the current supply circuit 250.

The transistors Tr11, Tr21, Tr24, Tr27[q], Tr27[q+1], and Tr28 each operate in a saturation region.

First, a high-level potential is applied to the wiring WW[p] and a low-level potential is applied to the wiring WW[p+1] from Time T01 to Time T02. As a result of the above operation, the transistors Tr12 in the memory cell MC[p, q], the memory cell MC[p, q+1], and the memory cell MCR[p] illustrated in FIG. 14 are turned on. The transistors Tr12 in the memory cell MC[p+1, q], the memory cell MC[p+1, q+1], and the memory cell MCR[p+1] remain off.

In addition, from Time T01 to Time T02, a potential obtained by subtracting the first analog potential from the first reference potential VPR is applied to each of the wiring WD[q] and the wiring WD[q+1] illustrated in FIG. 14. Specifically, the potential VPR−Vx[p, q] is applied to the wiring WD[q], and a potential VPR−Vx[p, q+1] is applied to the wiring WD[q+1]. The first reference potential VPR is applied to the wiring WDREF, and a potential between the potential VSS and the potential VDD, e.g., a potential (VDD+VSS)/2, is applied as a base potential to the wiring RW[p] and the wiring RW[p+1].

Accordingly, in FIG. 14, the potential VPR−Vx[p, q] is applied to a node N[p, q] through the transistor Tr12 in the memory cell MC[p, q], the potential VPR−Vx[p, q+1] is applied to a node N[p, q+1] through the transistor Tr12 in the memory cell MC[p, q+1], and the first reference potential VPR is applied to a node NREF[p] through the transistor Tr12 in the memory cell MCR[p].

After Time T02, the potential applied to the wiring WW[p] illustrated in FIG. 14 changes from a high level to a low level, so that the transistors Tr12 in the memory cell MC[p, q], the memory cell MC[p, q+1], and the memory cell MCR[p] are turned off. As a result of the above operation, the potential VPR−Vx[p, q] is held at the node N[p, q], the potential VPR−Vx[p, q+1] is held at the node N[p, q+1], and the first reference potential VPR is held at the node NREF[p].

Then, from Time T03 to Time T04, the potential of the wiring WW[p] illustrated in FIG. 14 remains at a low level and a high-level potential is applied to the wiring WW[p+1]. As a result of the above operation, the transistors Tr12 in the memory cell MC[p+1, q], the memory cell MC[p+1, q+1], and the memory cell MCR[p+1] illustrated in FIG. 14 are turned on. The transistors Tr12 in the memory cell MC[p, q], the memory cell MC[p, q+1], and the memory cell MCR[p] remain off.

In addition, from Time T03 to Time T04, a potential obtained by subtracting the first analog potential from the first reference potential VPR is applied to each of the wiring WD[q] and the wiring WD[q+1] illustrated in FIG. 14. Specifically, the potential VPR−Vx[p+1, q] is applied to the wiring WD[q], and a potential VPR−Vx[p+1, q+1] is applied to the wiring WD[q+1]. The first reference potential VPR is applied to the wiring WDREF, and a potential between the potential VSS and the potential VDD, e.g., the potential (VDD+VSS)/2, is applied as a base potential to the wiring RW[p] and the wiring RW[p+1].

Accordingly, in FIG. 14, the potential VPR−Vx[p+1, q] is applied to a node N[p+1, q] through the transistor Tr12 in the memory cell MC [p+1, q], the potential VPR−Vx[p+1, q+1] is applied to a node N[p+1, q+1] through the transistor Tr12 in the memory cell MC[p+1, q+1], and the first reference potential VPR is applied to a node NREF[p+1] through the transistor Tr12 in the memory cell MCR[p+1].

After Time T04, the potential applied to the wiring WW[p+1] illustrated in FIG. 14 changes from a high level to a low level, so that the transistors Tr12 in the memory cell MC[p+1, q], the memory cell MC[p+1, q+1], and the memory cell MCR[p+1] are turned off. As a result of the above operation, the potential VPR−Vx[p+1, q] is held at the node N[p+1, q], the potential VPR−Vx[p+1, q+1] is held at the node N[p+1, q+1], and the first reference potential VPR is held at the node NREF[p+1].

Next, a high-level potential is applied to the wiring ORP and the wiring ORM illustrated in FIG. 15 from Time T05 to Time T06. When a high-level potential is applied to the wiring ORM, the transistors Tr26 in the circuit 230[q] and the circuit 230[q+1] illustrated in FIG. 15 are turned on, so that the gates of the transistors Tr24 are reset by the potential VDD applied thereto. Furthermore, when a high-level potential is applied to the wiring ORP, the transistors Tr23 in the circuit 240[*q*] and the circuit 240[*q*+1] illustrated in FIG. 15 are turned on, so that the gates of the transistors Tr21 are reset by the potential VSS applied thereto.

After Time T06, the potential applied to the wiring ORP and the wiring ORM illustrated in FIG. 14 changes from a high level to a low level, so that the transistors Tr26 in the circuit 230[*q*] and the circuit 230[*q*+1] are turned off and the transistors Tr23 in the circuit 240[*q*] and the circuit 240[*q*+1] are turned off. As a result of the above operation, the potential VDD is held at the gate of the transistor Tr24 in each of the circuit 230[*q*] and the circuit 230[*q*+1], and the potential VSS is held at the gate of the transistor Tr21 in each of the circuit 240[*q*] and the circuit 240[*q*+1].

Next, from Time T07 to Time T08, a high-level potential is applied to the wiring OSP illustrated in FIG. 15. Furthermore, a potential between the potential VSS and the potential VDD, e.g., the potential (VDD+VSS)/2, is applied as a base potential to the wiring RW[p] and the wiring RW[p+1] illustrated in FIG. 14. Since a high-level potential is applied to the wiring OSP, the transistors Tr22 in the circuit 240[*q*] and the circuit 240[*q*+1] are turned on.

If the current I[q] flowing through the wiring BL[q] is lower than the current IREF flowing through the wiring BLREF, that is, if the current ΔI[q] has a positive value, it means that the sum of current that can be drawn by the transistor Tr28 in the memory cell MC[p, q] illustrated in FIG. 14 and current that can be drawn by the transistor Tr28 in the memory cell MC[p+1, q] is smaller than the value of the drain current of the transistor Tr27[*q*]. Thus, if the current ΔI[q] has a positive value, part of the drain current of the transistor Tr27[*q*] flows to the gate of the transistor Tr21 when the transistor Tr22 is turned on in the circuit 240[*q*], and the potential of the gate starts to increase. When the drain current of the transistor Tr21 becomes substantially equal to the current ΔI[q], the potential of the gate of the transistor Tr21 converges on a certain value. The potential of the gate of the transistor Tr21 at this time corresponds to a potential at which the drain current of the transistor Tr21 becomes the current ΔI[q], i.e., the current Ioffset[q] (=ICP[q]). This means that the transistor Tr21 in the circuit 240[*q*] is in a state of serving as a current source that can supply the current ICP[q].

Similarly, if the current I[q+1] flowing through the wiring BL[q+1] is lower than the current IREF flowing through the wiring BLREF, that is, if a current ΔI[q+1] has a positive value, part of the drain current of the transistor Tr27[*q*+1] flows to the gate of the transistor Tr21 when the transistor Tr22 is turned on in the circuit 240[*q*+1], and the potential of the gate starts to increase. When the drain current of the transistor Tr21 becomes substantially equal to the current ΔI[q+1], the potential of the gate of the transistor Tr21 converges on a certain value. The potential of the gate of the transistor Tr21 at this time corresponds to a potential at which the drain current of the transistor Tr21 becomes the current ΔI[q+1], i.e., the current Ioffset[q+1] (=ICP[q+1]). This means that the transistor Tr21 in the circuit 240[*q*+1] is in a state of serving as a current source that can supply the current ICP[q+1].

After Time T08, the potential applied to the wiring OSP illustrated in FIG. 15 changes from a high level to a low level, so that the transistors Tr22 in the circuit 240[*q*] and the circuit 240[*q*+1] are turned off. As a result of the above operation, the potentials of the gates of the transistors Tr21 are held. Thus, the circuit 240[*q*] remains in a state of serving as the current source that can supply the current ICP[q], and the circuit 240[*q*+1] remains in a state of serving as the current source that can supply the current ICP[q+1].

Next, from Time T09 to Time T10, a high-level potential is applied to the wiring OSM illustrated in FIG. 15. Furthermore, a potential between the potential VSS and the potential VDD, e.g., the potential (VDD+VSS)/2, is applied as a base potential to the wiring RW[p] and the wiring RW[p+1] illustrated in FIG. 14. Since a high-level potential is applied to the wiring OSM, the transistors Tr25 in the circuit 230[*q*] and the circuit 230[*q*+1] are turned on.

If the current I[q] flowing through the wiring BL[q] is higher than the current IREF flowing through the wiring BLREF, that is, if the current ΔI[q] has a negative value, it means that the sum of current that can be drawn by the transistor Tr28 in the memory cell MC[p, q] illustrated in FIG. 14 and current that can be drawn by the transistor Tr28 in the memory cell MC[p+1, q] is larger than the value of the drain current of the transistor Tr27[*q*]. Thus, if the current ΔI[q] has a negative value, current flows from the gate of the transistor Tr24 to the wiring BL[q] when the transistor Tr25 is turned on in the circuit 230[*q*], and the potential of the gate starts to decrease. When the drain current of the transistor Tr24 becomes substantially equal to the current ΔI[q], the potential of the gate of the transistor Tr24 converges on a certain value. The potential of the gate of the transistor Tr24 at this time corresponds to a potential at which the drain current of the transistor Tr24 becomes the current ΔI[q], i.e., the current Ioffset[q] (=ICM[q]). This means that the transistor Tr24 in the circuit 230[*q*] is in a state of serving as a current source that can supply the current ICM[q].

Similarly, if the current I[q+1] flowing through the wiring BL[q+1] is higher than the current IREF flowing through the wiring BLREF, that is, if the current ΔI[q+1] has a negative value, current flows from the gate of the transistor Tr24 in the circuit 230[*q*+1] to the wiring BL[q+1] when the transistor Tr25 is turned on, and the potential of the gate starts to decrease. When the drain current of the transistor Tr24 becomes substantially equal to the absolute value of the current ΔI[q+1] the potential of the gate of the transistor Tr24 converges on a certain value. The potential of the gate of the transistor Tr24 at this time corresponds to a potential at which the drain current of the transistor Tr24 becomes equal to the absolute value of the current ΔI[q+1], i.e., the current Ioffset[q+1] (=ICM[q+1]). This means that the transistor Tr24 in the circuit 230[*q*+1] is in a state of serving as a current source that can supply the current ICM[q+1].

After Time T08, the potential applied to the wiring OSM illustrated in FIG. 15 changes from a high level to a low level, so that the transistors Tr25 in the circuit 230[*q*] and the circuit 230[*q*+1] are turned off. As a result of the above operation, the potentials of the gates of the transistors Tr24 are held. Thus, the circuit 230[*q*] remains in a state of serving as the current source that can supply the current ICM[q], and the circuit 230[*q*+1] remains in a state of serving as the current source that can supply the current ICM[q+1].

In each of the circuit 240[*q*] and the circuit 240[*q*+1], the transistor Tr21 has a function of drawing current. Thus, from Time T07 to Time T08, when the current I[q] flowing through the wiring BL[q] is higher than the current IREF flowing through the wiring BLREF and the current ΔI[q] has a negative value, or when the current I[q+1] flowing through the wiring BL[q+1] is higher than the current IREF flowing through the wiring BLREF and the current ΔI[q+1] has a negative value, it might be difficult to supply current from the circuit 240[*q*] or the circuit 240[*q*+1] to the wiring BL[q] or the wiring BL[q+1] without excess or deficiency. In that case, it might be difficult for the transistor Tr11 in the memory cell MC, the transistor Tr21 in the circuit 240[*q*] or the circuit 240[q+1], and the transistor Tr27[q] or Tr27[q+1] to concurrently operate in a saturation region because a balance between the current flowing through the wiring BLREF and the current flowing through the wiring BL[q] or the wiring BL[q+1] is struck.

To ensure the operations of the transistors Tr11, Tr21, and Tr27[q] or Tr27[q+1] in a saturation region from Time T07 to Time T08 even when the current ΔI[q] has a negative value, the potential of the gate of the transistor Tr24 may be set to a potential that is high enough to obtain a predetermined drain current, instead of resetting the potential of the gate of the transistor Tr24 to the potential VDD, from Time T05 to Time T06. In the above structure, the amount of current that cannot be drawn by the transistor Tr11 can be drawn by the transistor Tr21 to some extent because current from the transistor Tr24, as well as the drain current of the transistor Tr27[q] or Tr27[q+1], is supplied; thus, the operations of the transistors Tr11, Tr21, and Tr27[q] or Tr27[q+1] in a saturation region can be ensured.

Note that if the current I[q] flowing through the wiring BL[q] is lower than the current IREF flowing through the wiring BLREF, that is, if the current ΔI[q] has a positive value, from Time T09 to Time T10, since the circuit 240[q] has been set as the current source that can supply the current ICP[q] from Time T07 to Time T08, the potential of the gate of the transistor Tr24 in the circuit 230[q] remains substantially the same as the potential VDD. Similarly, if the current I[q+1] flowing through the wiring BL[q+1] is lower than the current IREF flowing through the wiring BLREF, that is, if the current ΔI[q+1] has a positive value, since the circuit 240[q+1] has been set as the current source that can supply the current ICP[q+1] from Time T07 to Time T08, the potential of the gate of the transistor Tr24 in the circuit 230[q+1] remains substantially the same as the potential VDD.

Then, from Time T11 to Time T12, the second analog potential Vw[p] is applied to the wiring RW[p] illustrated in FIG. 14. Furthermore, a potential between the potential VSS and the potential VDD, e.g., the potential (VDD+VSS)/2, is still applied as a base potential to the wiring RW[p+1]. Specifically, the potential of the wiring RW[p] is a potential higher than the potential between the potential VSS and the potential VDD (e.g., the potential (VDD+VSS)/2), which is a base potential, by the potential difference Vw[p]; for the simplicity of the following description, however, the potential of the wiring RW[p] is assumed to be the second analog potential Vw[p].

When the potential of the wiring RW[p] becomes the second analog potential Vw[p], with the assumption that the amount of change in the potential of the first electrode of the capacitor C11 is substantially the same as the amount of change in the potential of the node N, the potential of the node N in the memory cell MC[p, q] illustrated in FIG. 14 becomes VPR−Vx[p, q]+Vw[p] and the potential of the node N in the memory cell MC[p, q+1] becomes VPR−Vx[p, q+1]+Vw[p]. According to Formula 6 above, the product-sum of the first analog data and the second analog data for the memory cell MC[p, q] affects current obtained by subtracting the current Ioffset[q] from the current ΔI[q], that is, the current Iout[q] flowing from the wiring BL[q]. Furthermore, the product-sum of the first analog data and the second analog data for the memory cell MC[p, q+1] affects current obtained by subtracting the current Ioffset[q+1] from the current ΔI[q+1], that is, a current Iout[q+1] flowing from the wiring BL[q+1].

After Time T12, a potential between the potential VSS and the potential VDD (e.g., the potential (VDD+VSS)/2), which is a base potential, is applied again to the wiring RW[p].

Then, from Time T13 to Time T14, the second analog potential Vw[p+1] is applied to the wiring RW[p+1] illustrated in FIG. 14. Furthermore, a potential between the potential VSS and the potential VDD, e.g., the potential (VDD+VSS)/2, is still applied as a base potential to the wiring RW[p]. Specifically, the potential of the wiring RW[p+1] is a potential higher than the potential between the potential VSS and the potential VDD (e.g., the potential (VDD+VSS)/2), which is a base potential, by the potential difference Vw[p+1]; for the simplicity of the following description, however, the potential of the wiring RW[p+1] is assumed to be the second analog potential Vw[p+1].

When the potential of the wiring RW[p+1] becomes the second analog potential Vw[p+1], with the assumption that the amount of change in the potential of the first electrode of the capacitor C11 is substantially the same as the amount of change in the potential of the node N, the potential of the node N in the memory cell MC[p+1, q] illustrated in FIG. 14 becomes VPR−Vx[p+1, q]+Vw[p+1] and the potential of the node N in the memory cell MC[p+1, q+1] becomes VPR−Vx[p+1, q+1]+Vw[p+1]. According to Formula 6 above, the product-sum of the first analog data and the second analog data for the memory cell MC[p+1, q] affects current obtained by subtracting the current Ioffset[q] from the current ΔI[q], that is, the current Iout[q]. Furthermore, the product-sum of the first analog data and the second analog data for the memory cell MC[p+1, q+1] affects current obtained by subtracting the current Ioffset[q+1] from the current ΔI[q+1], that is, the current Iout[q+1].

After Time T12, a potential between the potential VSS and the potential VDD (e.g., the potential (VDD+VSS)/2), which is a base potential, is applied again to the wiring RW[p+1].

Then, from Time T15 to Time T16, the second analog potential Vw[p] is applied to the wiring RW[p] illustrated in FIG. 14 and the second analog potential Vw[p+1] is applied to the wiring RW[p+1]. Specifically, the potential of the wiring RW[p] is a potential higher than the potential between the potential VSS and the potential VDD (e.g., the potential (VDD+VSS)/2), which is a base potential, by the potential difference Vw[p], and the potential of the wiring RW[p+1] is a potential higher than the potential between the potential VSS and the potential VDD (e.g., the potential (VDD+VSS)/2), which is a base potential, by the potential difference Vw[p+1]; for the simplicity of the following description, however, the potential of the wiring RW[p] is assumed to be the second analog potential Vw[p] and the potential of the wiring RW[p+1] is assumed to be the second analog potential Vw[p+1].

When the potential of the wiring RW[p] becomes the second analog potential Vw[p], with the assumption that the amount of change in the potential of the first electrode of the capacitor C11 is substantially the same as the amount of change in the potential of the node N, the potential of the node N in the memory cell MC[p, q] illustrated in FIG. 14 becomes VPR−Vx[p, q]+Vw[p] and the potential of the node N in the memory cell MC[p, q+1] becomes VPR−Vx[p, q+1]+Vw[p]. Furthermore, when the potential of the wiring RW[p+1] becomes the second analog potential Vw[p+1], with the assumption that the amount of change in the potential of the first electrode of the capacitor C11 is substantially the same as the amount of change in the potential of the node N, the potential of the node N in the memory cell MC[p+1, q] illustrated in FIG. 14 becomes VPR−Vx[p+1, q]+Vw[p+1] and the potential of the node N in the memory cell MC[p+1, q+1] becomes VPR−Vx[p+1, q+1]+Vw[p+1].

According to Formula 6 above, the product-sum of the first analog data and the second analog data for the memory cell MC [p, q] and the memory cell MC[p+1, q] affects current obtained by subtracting the current Ioffset[q] from the current ΔI[q], that is, the current Iout[q]. Furthermore, the product-sum of the first analog data and the second analog data for the memory cell MC[p, q+1] and the memory cell MC[p+1, q+1] affects current obtained by subtracting the current Ioffset[q+1] from the current ΔI[q+1], that is, the current Iout[q+1].

After Time T16, a potential between the potential VSS and the potential VDD (e.g., the potential (VDD+VSS)/2), which is a base potential, is applied again to the wiring RW[p] and the wiring RW[p+1].

With the above structure, the product-sum operation can be performed with a small circuit scale. With the above structure, the product-sum operation can be performed at high speed. With the above structure, the product-sum operation can be performed with low power.

Note that a transistor with an extremely low off-state current is desirably used as the transistor Tr12, Tr22, Tr23, Tr25, or Tr26. When a transistor with an extremely low off-state current is used as the transistor Tr12, the potential of the node N can be held for a long time. When a transistor with an extremely low off-state current is used as the transistors Tr22 and Tr23, the potential of the gate of the transistor Tr21 can be held for a long time. When a transistor with an extremely low off-state current is used as the transistors Tr25 and Tr26, the potential of the gate of the transistor Tr24 can be held for a long time.

As a transistor with an extremely low off-state current, an OS transistor may be used. The leakage current of an OS transistor normalized by channel width can be lower than or equal to $10 \times 10^{-21}$ A/μm (10 zA/μm) with a source-drain voltage of 10 V at room temperature (approximately 25° C.).

With the use of the semiconductor device described above, the product-sum operation in the neural network NN1 can be performed.

This embodiment can be combined with the description of the other embodiments as appropriate.

Embodiment 4

In this embodiment, a structure example of an OS transistor that can be used in the above embodiment is described.
<Structure Example of Transistor>

Figure 17A:
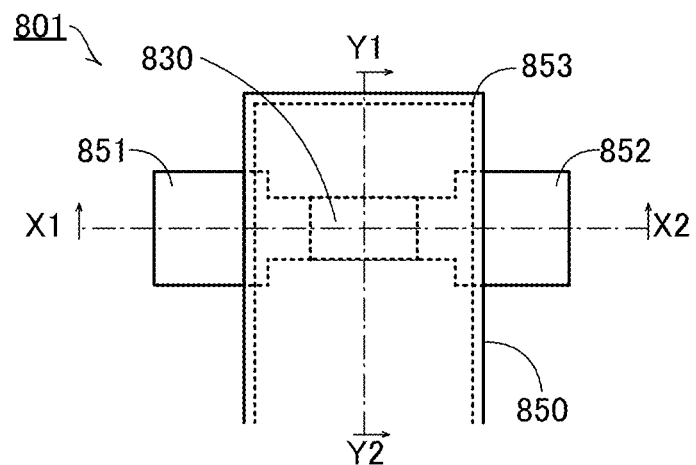
FIG. 17 Diagrams illustrating a structure example of a transistor.
Figure 17B:
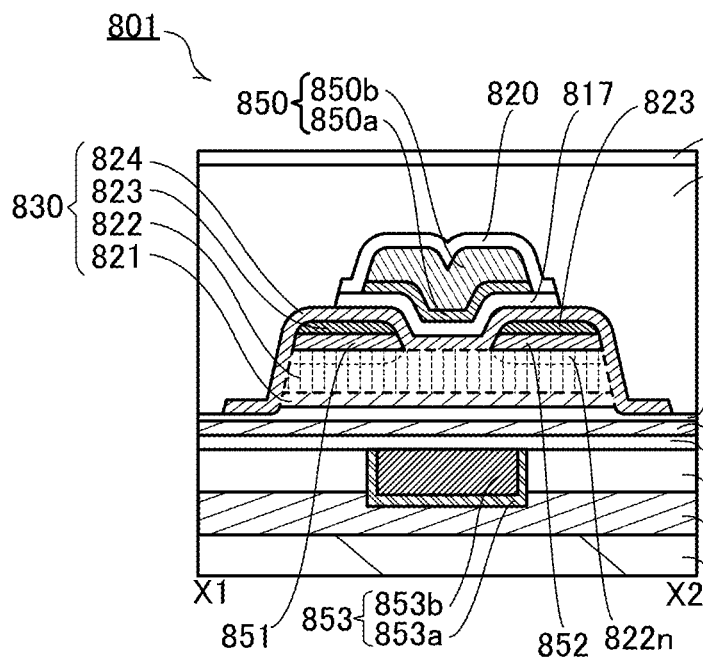
Figure 17C:
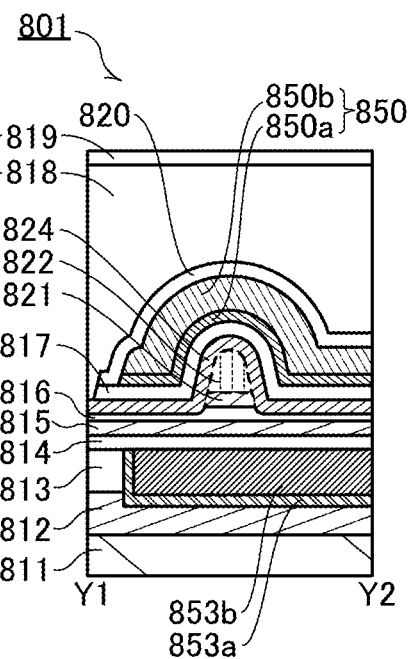

FIG. 17(A) is a top view illustrating a structure example of a transistor. FIG. 17(B) is a cross-sectional view along the line X1-X2 in FIG. 17(A), and FIG. 17(C) is a cross-sectional view along the line Y1-Y2. Here, in some cases, the direction of the line X1-X2 is referred to as a channel length direction and the direction of the line Y1-Y2 as a channel width direction. FIG. 17(B) is a diagram illustrating a cross-sectional structure of the transistor in the channel length direction, and FIG. 17(C) is a diagram illustrating a cross-sectional structure of the transistor in the channel width direction. Note that to clarify the device structure, some components are omitted in FIG. 17(A).

The semiconductor device of one embodiment of the present invention includes insulating layers 812 to 820, metal oxide films 821 to 824, and conductive layers 850 to 853. A transistor 801 is formed on an insulating surface. FIG. 17 illustrates the case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may be a single layer or may be a stack including a plurality of films. They can be formed by a variety of deposition methods such as a sputtering method, a molecular beam epitaxy method (MBE method), a pulsed laser ablation method (PLA method), a CVD method, and an atomic layer deposition method (ALD method). Note that examples of a CVD method include a plasma CVD method, a thermal CVD method, and a metal organic CVD method.

The conductive layer 850 includes a region that functions as a gate electrode of the transistor 801. The conductive layer 851 and the conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer formed of a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIG. 17(B) and FIG. 17(C), the oxide layer 830 includes a region where the metal oxide film 821, the metal oxide film 822, and the metal oxide film 824 are stacked in this order. In addition, a pair of metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 823 and the conductive layer 850. The conductive layer 851 and the conductive layer 852 each include a region that overlaps with the conductive layer 850 with the metal oxide film 823, the metal oxide film 824, and the insulating layer 817 therebetween.

The conductive layer 851 and the conductive layer 852 are formed from a hard mask for forming the metal oxide film 821 and the metal oxide film 822. Thus, the conductive layer 851 and the conductive layer 852 do not include a region that is in contact with the side surfaces of the metal oxide film 821 and the metal oxide film 822. For example, the metal oxide films 821 and 822, the conductive layer 851, and the conductive layer 852 can be formed through the following steps. First, a conductive film is formed over two stacked metal oxide films. This conductive film is processed (etched) into a desired shape so that a hard mask is formed. With the use of the hard mask, the shapes of the two metal oxide films are processed so that the metal oxide film 821 and the metal oxide film 822 that are stacked are formed. Next, the hard mask is processed into a desired shape so that the conductive layer 851 and the conductive layer 852 are formed.

Examples of insulating materials used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed of a single layer or a stack containing these insulating materials. The layers forming the insulating layers 811 to 818 may contain a plurality of insulating materials.

Note that in this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layers 816 to 818 are preferably insulating layers containing oxygen. Further preferably, the insulating layers 816 to 818 are formed of an insulating film from which oxygen is released by heating (hereinafter, also referred to as an "insulating film containing excess oxygen"). Supplying oxygen from the insulating film containing excess oxygen to the oxide layer 830 can compensate for the oxygen vacancies in the oxide layer 830. The reliability and electrical characteristics of the transistor 801 can be improved.

The insulating film containing excess oxygen is a film from which oxygen molecules at more than or equal to $1.0 \times 10^{18}$ [molecules/cm$^3$] are released in TDS (Thermal Desorption Spectroscopy) at a film surface temperature of higher than or equal to 100° C. and lower than or equal to 700° C., or higher than or equal to 100° C. and lower than or equal to 500° C. Note that the number of released oxygen molecules is preferably $3.0 \times 10^{20}$ molecules/cm$^3$ or more.

The insulating film containing excess oxygen can be formed by performing treatment for adding oxygen to an insulating film. Examples of the treatment for adding oxygen include heat treatment under an oxygen atmosphere, plasma treatment, and treatment using an ion implantation method, an ion doping method, or a plasma immersion ion implantation method. As a gas for adding oxygen, an oxygen gas of $^{16}O_2$, $^{18}O_2$, or the like, a nitrous oxide gas, an ozone gas, or the like can be used.

The hydrogen concentrations of the insulating layers 812 to 819 are preferably reduced in order to prevent an increase in hydrogen concentration of the oxide layer 830. In particular, the hydrogen concentrations of the insulating layers 813 to 818 are preferably reduced. Specifically, the hydrogen concentrations are lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The above-mentioned hydrogen concentrations are values measured by secondary ion mass spectrometry (SIMS).

The transistor 801 preferably has a structure in which the oxide layer 830 is surrounded by an insulating layer with oxygen and hydrogen barrier properties (hereinafter, also referred to as a barrier layer). Employing such a structure can prevent release of oxygen from the oxide layer 830 and entry of hydrogen into the oxide layer 830. The reliability and electrical characteristics of the transistor 801 can be improved.

For example, the insulating layer 819 functions as a barrier layer and at least one of the insulating layers 811, 812, and 814 functions as a barrier layer. The barrier layer can be formed of a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is silicon nitride, the insulating layer 812 is aluminum oxide, and the insulating layer 813 is silicon oxynitride. The insulating layers 814 to 816 that function as the gate insulating layer on the back gate electrode side are a stack of silicon oxide, aluminum oxide, and silicon oxide. The insulating layer 817 that functions as the gate insulating layer on the front gate side is silicon oxynitride. The insulating layer 818 that functions as the interlayer insulating layer is silicon oxide. The insulating layer 819 is aluminum oxide.

Examples of conductive materials used for the conductive layers 850 to 853 include a metal such as molybdenum, titanium, tantalum, tungsten, aluminum, copper, chromium, neodymium, and scandium; and a metal nitride containing the above metal as its component (tantalum nitride, titanium nitride, molybdenum nitride, and tungsten nitride). It is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A structure example of the conductive layers 850 to 853 is described. The conductive layer 850 is a single layer of tantalum nitride or tungsten. Alternatively, the conductive layer 850 is a stack of tantalum nitride, tantalum, and tantalum nitride. The conductive layer 851 is a single layer of tantalum nitride or a stack of tantalum nitride and tungsten. The structure of the conductive layer 852 is the same as that of the conductive layer 851. The conductive layer 853 is a single layer of tantalum nitride or a stack of tantalum nitride and tungsten.

In order to reduce the off-state current of the transistor 801, the energy gap of the metal oxide film 822 is preferably large, for example. The energy gap of the metal oxide film 822 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 830 preferably exhibits crystallinity. At least the metal oxide film 822 preferably exhibits crystallinity. With the above-described structure, the transistor 801 having favorable reliability and electrical characteristics can be achieved.

Examples of the oxide that can be used for the metal oxide film 822 include an In—Ga oxide, an In—Zn oxide, and an In-M-Zn oxide (M is Al, Ga, Y, or Sn). The metal oxide film 822 is not limited to an oxide layer containing indium. The metal oxide film 822 can be formed using a Zn—Sn oxide, a Ga—Sn oxide, or a Zn—Mg oxide, for example. The metal oxide films 821, 823, and 824 can also be formed using an oxide that is similar to that used for the metal oxide film 822. In particular, each of the metal oxide films 821, 823, and 824 can be formed using a Ga oxide.

When an interface state is formed at the interface between the metal oxide film 822 and the metal oxide film 821, a channel formation region is formed also in a region in the vicinity of the interface, which causes a change in threshold voltage of the transistor 801. It is therefore preferred that the metal oxide film 821 contain at least one of the metal elements contained in the metal oxide film 822 as its component. Accordingly, an interface state is less likely to be formed at the interface between the metal oxide film 822 and the metal oxide film 821, and variations in electrical characteristics such as threshold voltage of the transistor 801 can be reduced.

The metal oxide film 824 preferably contains at least one of the metal elements contained in the metal oxide film 822 as its component. Thus, interface scattering is less likely to occur at the interface between the metal oxide film 822 and the metal oxide film 824, and carrier transfer is less likely to be inhibited; hence, the field-effect mobility of the transistor 801 can be increased.

It is preferred that the metal oxide film 822 have the highest carrier mobility among the metal oxide films 821 to 824. Accordingly, a channel can be formed in the metal oxide film 822 that is provided in a position apart from the insulating layers 816 and 817.

For example, in a metal oxide containing In, such as an In-M-Zn oxide, carrier mobility can be increased by an increase in the In content. In the In-M-Zn oxide, the s orbital of heavy metal mainly contributes to carrier transfer, and a larger number of s orbitals overlap by increasing the indium content; thus, an oxide having a high indium content has higher mobility than an oxide having a low indium content. Consequently, with the use of an oxide having a high indium content for the metal oxide film, carrier mobility can be increased.

For this reason, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the In content of the metal oxide film 822 is made higher than the In content of the metal oxide films 821 and 823. When the In-M-Zn oxide is formed by a sputtering method, the In content can be changed by changing the atomic ratio of the metal elements of a target.

For example, the atomic ratio In:M:Zn of the metal elements of a target used for forming the metal oxide film 822 is preferably 1:1:1, 3:1:2, or 4:2:4.1. For example, the atomic ratio In:M:Zn of the metal elements of a target used for forming the metal oxide films 821 and 823 is preferably 1:3:2 or 1:3:4. The atomic ratio of an In-M-Zn oxide formed using a target of In:M:Zn=4:2:4.1 is approximately In:M:Zn=4:2:3.

In order to provide the transistor 801 with stable electrical characteristics, it is preferable to reduce the concentration of impurities in the oxide layer 830. In the metal oxide, hydrogen, nitrogen, carbon, silicon, and a metal element other than its main component are impurities. For example, hydrogen and nitrogen contribute to formation of donor states, thereby increasing the carrier density. In addition, silicon and carbon contribute to formation of impurity states in the metal oxide. The impurity states serve as traps and might cause the electrical characteristics of the transistor to deteriorate.

For example, the oxide layer 830 includes a region where the silicon concentration is lower than or equal to $2 \times 10^{18}$ atoms/cm$^3$, preferably lower than or equal to $2 \times 10^{17}$ atoms/cm$^3$. The same applies to the carbon concentration of the oxide layer 830.

The oxide layer 830 includes a region where the concentration of an alkali metal is lower than or equal to $1 \times 10^{18}$ atoms/cm$^3$, preferably lower than or equal to $2 \times 10^{16}$ atoms/cm$^3$. The same applies to the concentration of an alkaline earth metal in the oxide layer 830.

The oxide layer 830 includes a region where the hydrogen concentration is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The above-mentioned concentrations of the impurities in the oxide layer 830 are values obtained by SIMS.

In the case where the metal oxide film 822 contains oxygen vacancies, donor states are sometimes formed by entry of hydrogen into sites of oxygen vacancies. As a result, the oxygen vacancies become a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by reducing hydrogen in the metal oxide film 822 is effective for on-state current characteristics.

Hydrogen contained in a metal oxide reacts with oxygen bonded to a metal atom to be water, and thus forms an oxygen vacancy in some cases. Entry of hydrogen into the oxygen vacancy sometimes generates an electron serving as a carrier. Furthermore, in some cases, bonding of part of hydrogen to oxygen bonded to a metal atom generates an electron serving as a carrier. Since the channel formation region is provided in the metal oxide film 822, when hydrogen is contained in the metal oxide film 822, the transistor 801 is likely to have normally-on characteristics. Accordingly, it is preferred that hydrogen in the metal oxide film 822 be reduced as much as possible.

Note that the metal oxide film 822 may have an n-type region 822*n* in a region in contact with the conductive layer 851 or the conductive layer 852. The region 822*n* is formed by a phenomenon in which oxygen in the metal oxide film 822 is extracted by the conductive layer 851 or the conductive layer 852, a phenomenon in which a conductive material in the conductive layer 851 or the conductive layer 852 is combined with an element in the metal oxide film 822, or the like. When the region 822*n* is formed, the contact resistance between the conductive layer 851 or the conductive layer 852 and the metal oxide film 822 can be reduced.

FIG. 17 illustrates an example where the oxide layer 830 has a four-layer structure; however, one embodiment of the present invention is not limited to this. For example, the oxide layer 830 can have a three-layer structure without the metal oxide film 821 or the metal oxide film 823. Alternatively, one or a plurality of metal oxide films that are similar to the metal oxide films 821 to 824 can be provided at any two or more of the following positions: between given layers in the oxide layer 830, over the oxide layer 830, and under the oxide layer 830.

Figure 18:
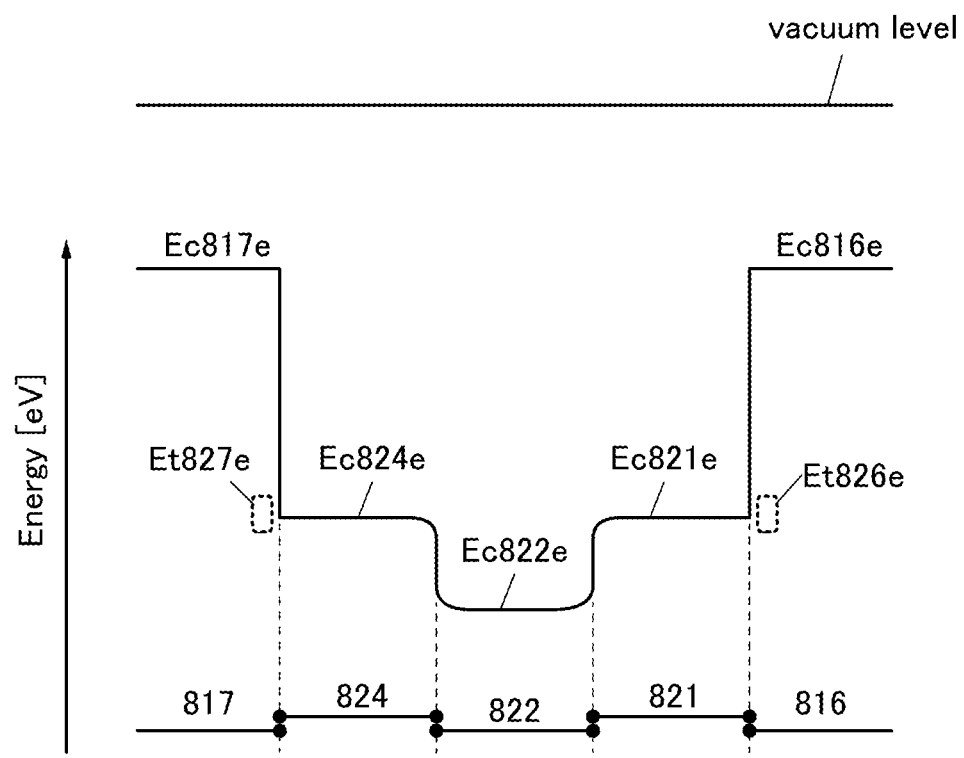
FIG. 18 A diagram showing an energy band structure.

Effects obtained from the stack of the metal oxide films 821, 822, and 824 are described with reference to FIG. 18. FIG. 18 is a schematic diagram of the energy band structure of the channel formation region in the transistor 801.

In FIG. 18, Ec816*e*, Ec821*e*, Ec822*e*, Ec824*e*, and Ec817*e* indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (also referred to as "electron affinity") is a value obtained by subtracting an energy gap from the energy difference between the vacuum level and the valence band maximum (also referred to as an ionization potential). Note that the energy gap can be measured using a spectroscopic ellipsometer (UT-300, HORIBA JOBIN YVON S.A.S.). Moreover, the energy difference between the vacuum level and the valence band maximum can be measured using an ultraviolet photoelectron spectroscopy (UPS) device (VersaProbe, ULVAC-PHI, Inc.).

Since the insulating layers 816 and 817 are insulators, Ec816*e* and Ec817*e* are closer to the vacuum level than Ec821e, Ec822e, and Ec824e (the insulating layers 816 and 817 have low electron affinities).

The metal oxide film 822 has a higher electron affinity than the metal oxide films 821 and 824. For example, the difference in electron affinity between the metal oxide film 822 and the metal oxide film 821 and the difference in electron affinity between the metal oxide film 822 and the metal oxide film 824 are each greater than or equal to 0.07 eV and less than or equal to 1.3 eV. The differences in electron affinity are preferably greater than or equal to 0.1 eV and less than or equal to 0.7 eV, further preferably greater than or equal to 0.15 eV and less than or equal to 0.4 eV Note that the electron affinity is an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide film 821, the metal oxide film 822, and the metal oxide film 824.

An indium gallium oxide has a low electron affinity and a high oxygen-blocking property. Therefore, the metal oxide film 824 preferably contains an indium gallium oxide. The gallium atomic ratio [Ga/(In+Ga)] is, for example, higher than or equal to 70%, preferably higher than or equal to 80%, further preferably higher than or equal to 90%.

A mixed region of the metal oxide film 821 and the metal oxide film 822 sometimes exists between the metal oxide film 821 and the metal oxide film 822. Moreover, a mixed region of the metal oxide film 824 and the metal oxide film 822 sometimes exists between the metal oxide film 824 and the metal oxide film 822. Because the mixed regions have a lower interface state density, a region in which the metal oxide films 821, 822, and 824 are stacked has a band structure where the energy in the vicinity of each interface is changed continuously (also referred to as continuous junction).

Electrons transfer mainly through the metal oxide film 822 in the oxide layer 830 having such an energy band structure. Thus, even when a state exists at the interface between the metal oxide film 821 and the insulating layer 816 or at the interface between the metal oxide film 824 and the insulating layer 817, electron transfer in the oxide layer 830 is less likely to be inhibited by these interface states; hence, the on-state current of the transistor 801 can be increased.

In addition, as shown in FIG. 18, trap states Et826e and Et827e due to impurities or defects might be formed in the vicinity of the interface between the metal oxide film 821 and the insulating layer 816 and the vicinity of the interface between the metal oxide film 824 and the insulating layer 817, respectively; however, the metal oxide film 822 can be made apart from the trap states Et826e and Et827e owing to the existence of the metal oxide films 821 and 824.

Note that when the difference between Ec821e and Ec822e is small, an electron in the metal oxide film 822 might reach the trap state Et826e by passing over the energy difference. When the electron is trapped at the trap state Et826e, negative fixed charge is generated at the interface with the insulating film, causing the threshold voltage of the transistor to be shifted in the positive direction. The same applies to the case where the energy difference between Ec822e and Ec824e is small.

In order to reduce a change in threshold voltage of the transistor 801 and make the electrical characteristics of the transistor 801 favorable, the difference between Ec821e and Ec822e and the difference between Ec824e and Ec822e are each preferably greater than or equal to 0.1 eV, further preferably greater than or equal to 0.15 eV.

Note that the transistor 801 can alternatively have a structure without a back gate electrode.

<Example of Stacked-Layer Structure>

Next, a structure of a semiconductor device including a stack of an OS transistor and another transistor is described.

Figure 19:
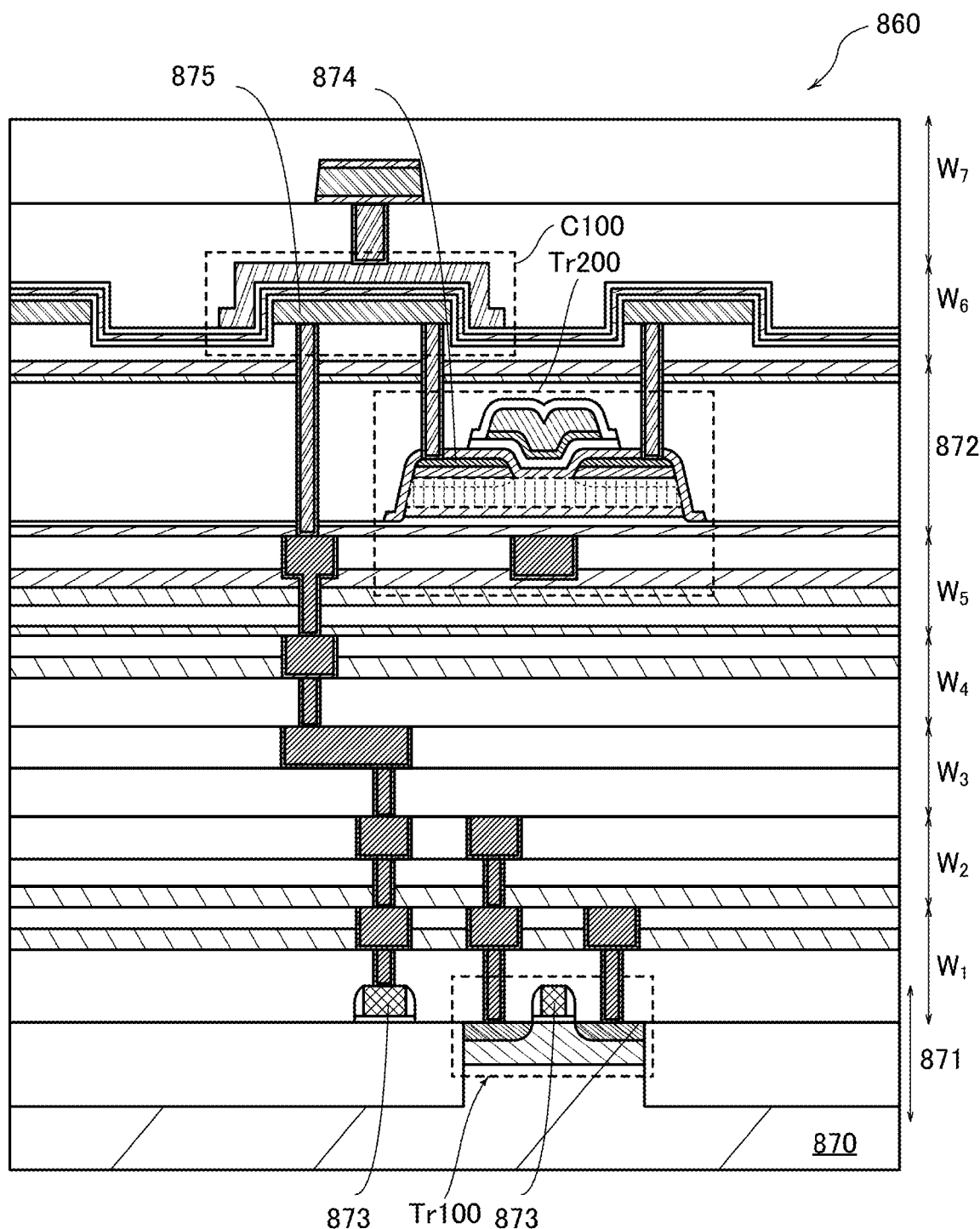
FIG. 19 A diagram illustrating a structure example of a semiconductor device.

FIG. 19 illustrates an example of a stacked-layer structure of a semiconductor device 860 in which a transistor Tr100 that is a Si transistor, a transistor Tr200 that is an OS transistor, and a capacitor C100 are stacked.

The semiconductor device 860 includes a stack of a CMOS layer 871, wiring layers $W_1$ to $W_5$, a transistor layer 872, and wiring layers $W_6$ and $W_7$.

The transistor Tr100 is provided in the CMOS layer 871. A channel formation region of the transistor Tr100 is provided in a single crystal silicon wafer 870. A gate electrode 873 of the transistor Tr100 is connected to one electrode 875 of the capacitor C100 through the wiring layers $W_1$ to $W_5$.

The transistor Tr200 is provided in the transistor layer 872. In FIG. 19, the transistor Tr200 has a structure similar to that of the transistor 801 (FIG. 17). An electrode 874 corresponding to one of a source and a drain of the transistor Tr200 is connected to the one electrode 875 of the capacitor C100. Note that FIG. 19 illustrates the case where the transistor Tr200 includes its back gate electrode in the wiring layer $W_5$. The capacitor C100 is formed in the wiring layer $W_6$.

The OS transistor and other elements are stacked in the above manner, whereby the circuit area can be reduced.

The above-described structure can be used for the semiconductor device 200 described in Embodiment 3 or the like. For example, the transistor Tr100, the transistor Tr200, and the capacitor C100 can be used as the transistor Tr11, the transistor Tr12, and the capacitor C11 in FIG. 14, respectively. It is also possible to use the transistor Tr100, the transistor Tr200, and the capacitor C100 as the transistor Tr21 or Tr24, the transistor Tr22, Tr23, Tr25, or Tr26, and the capacitor C21 or C22 in FIG. 15, respectively.

This embodiment can be combined with the description of the other embodiments as appropriate.

Embodiment 5

In this embodiment, a structure example of a display device that can be used for the display unit described in the above embodiment is described.

<Structure Example 1 of Display Device>

Figure 20A:
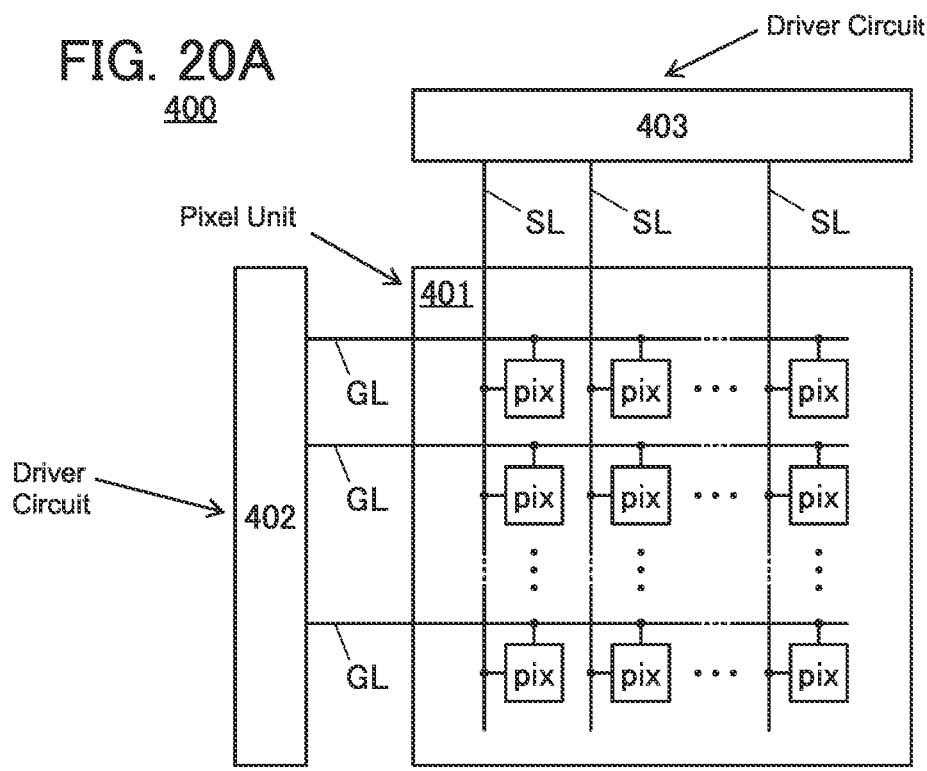
FIG. 20 Diagrams illustrating structure examples of a display device.

FIG. 20(A) illustrates a structure example of a display device 400 that can be used for the display unit 20. The display device 400 includes a pixel unit 401, a driver circuit 402, and a driver circuit 403.

The pixel unit 401 includes a plurality of pixels pix and corresponds to the display region DSP in FIG. 1. The pixels pix are connected to wirings SL and wirings GL. The wirings GL are each connected to the driver circuit 402, and the wirings SL are connected to the driver circuit 403. Selection signals are supplied to the wirings GL, and image signals are supplied to the wirings SL.

The driver circuit 402 has a function of supplying selection signals to the pixels pix. Specifically, the driver circuit 402 has a function of supplying selection signals to the wirings GL, and the wirings GL have a function of transmitting the selection signals output from the driver circuit 402 to the pixels pix. Note that the driver circuit 402 can be referred to as a gate side driver circuit or a gate driver, and the wirings GL can also be referred to as selection signal lines, gate lines, or the like.

The driver circuit 403 has a function of supplying image signals to the pixels pix. Specifically, the driver circuit 403 has a function of supplying image signals to the wirings SL, and the wirings SL have a function of transmitting the image signals output from the driver circuit 403 to the pixels pix. Note that the driver circuit 403 can be referred to as a source side driver circuit or a source driver, and the wirings SL can also be referred to as image signal lines, source lines, or the like.

Figure 20B:
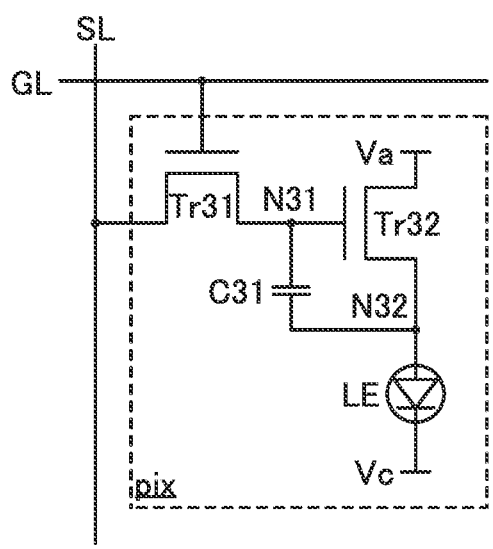

FIG. 20(B) illustrates a structure example of the pixel pix including a light-emitting element as a display element. The pixel pix illustrated in FIG. 20(B) includes transistors Tr31 and Tr32, a capacitor C31, and a light-emitting element LE. Note that although the transistors Tr31 and Tr32 are of n-channel type here, the polarities of the transistors can be changed as appropriate.

A gate of the transistor Tr31 is connected to the wiring GL, one of a source and a drain is connected to a gate of the transistor Tr32 and one electrode of the capacitor C31, and the other of the source and the drain is connected to the wiring SL. One of a source and a drain of the transistor Tr32 is connected to the other electrode of the capacitor C31 and one electrode of the light-emitting element LE, and the other of the source and the drain is connected to a wiring to which a potential Va is supplied. The other electrode of the light-emitting element LE is connected to a wiring to which a potential Vc is supplied. A node that is connected to the one of the source and the drain of the transistor Tr31, the gate of the transistor Tr32, and the one electrode of the capacitor C31 is referred to as a node N31. A node that is connected to the one of the source and the drain of the transistor Tr32 and the other electrode of the capacitor C31 is referred to as a node N32.

Here, the case where the potential Va is a high power supply potential and the potential Vc is a low power supply potential is described. The potential Va and the potential Vc can each be a common potential to the plurality of pixels pix. Furthermore, the capacitor C31 functions as a storage capacitor for holding the potential of the node N31.

The transistor Tr31 has a function of controlling the supply of the potential of the wiring SL to the node N31. Specifically, the potential of the wiring GL is controlled to turn on the transistor Tr31, whereby the potential of the wiring SL that corresponds to an image signal is supplied to the node N31 and written to the pixel pix. After that, the potential of the wiring GL is controlled to turn off the transistor Tr31, whereby the potential of the node N31 is held.

Then, the amount of current flowing between the source and the drain of the transistor Tr32 is controlled in accordance with the voltage between the nodes N31 and N32, and the light-emitting element LE emits light with a luminance corresponding to the amount of flowing current. Accordingly, the gray level of the pixel pix can be controlled. Note that the transistor Tr32 preferably operates in a saturation region.

As illustrated in FIG. 20(B), the pixel pix preferably includes two transistors (Tr31 and Tr32). This structure can increase an aperture ratio of a pixel in the case of a bottom emission structure to be described later. Note that one embodiment of the present invention is not limited thereto, and three or more transistors may be provided in the pixel pix.

Figure 20C:
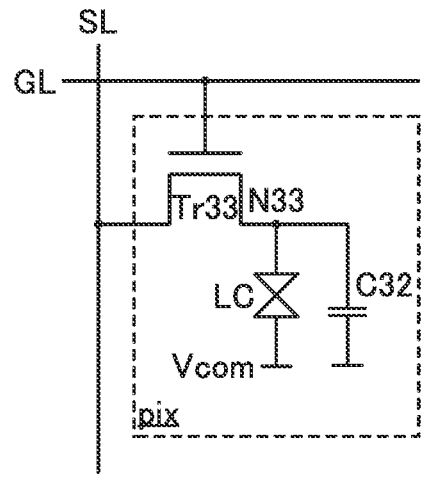

FIG. 20(C) illustrates a structure example of the pixel pix including a liquid crystal element as the display element. The pixel pix illustrated in FIG. 20(C) includes a transistor Tr33, a capacitor C32, and a liquid crystal element LC. Note that although the transistor Tr33 is of n-channel type here, the polarity of the transistor can be changed as appropriate.

A gate of the transistor Tr33 is connected to the wiring GL, one of a source and a drain is connected to one electrode of the liquid crystal element LC and one electrode of the capacitor C32, and the other of the source and the drain is connected to the wiring SL. The other electrode of the liquid crystal element LC is connected to a wiring to which a potential Vcom is supplied. The other electrode of the capacitor C32 is connected to a wiring to which a predetermined potential is supplied. A node that is connected to the one of the source and the drain of the transistor Tr33, the one electrode of the liquid crystal element LC, and the one electrode of the capacitor C32 is referred to as a node N33.

The potential Vcom can be a common potential to the plurality of pixels pix. The potential Vcom may be the same as a potential of a wiring connected to the other electrode of the capacitor C32. The capacitor C32 functions as a storage capacitor for holding the potential of the node N33.

The transistor Tr33 has a function of controlling the supply of the potential of the wiring SL to the node N33. Specifically, the potential of the wiring GL is controlled to turn on the transistor Tr33, whereby the potential of the wiring SL that corresponds to an image signal is supplied to the node N33 and written to the pixel pix. After that, the potential of the wiring GL, is controlled to turn off the transistor Tr33, whereby the potential of the node N33 is held.

The liquid crystal element LC includes a pair of electrodes and a liquid crystal layer containing a liquid crystal material to which a voltage between the pair of electrodes is applied. The alignment of liquid crystal molecules included in the liquid crystal element LC changes in accordance with the value of the voltage applied between the pair of electrodes, and thus the transmittance of the liquid crystal layer is changed. Thus, the gray level of the pixel pix can be controlled by controlling a potential s died from the wiring SL to the node N33.

The above-described operation is sequentially performed for every wiring GL, whereby an image for a first frame can be displayed.

Note that the selection of the wirings GL may be performed by a progressive method or an interlace method. In addition, the supply of image signals to the wirings SL may be performed by dot sequential driving in which image signals are sequentially supplied to the wirings SL, or may be performed by line sequential driving in which image signals are concurrently supplied to all the wirings SL. Alternatively, the supply of image signals may be sequentially performed for every plural wirings SL.

After that, in a second frame period, an image is displayed by operation similar to that in a first frame period. Thus, the image displayed on the pixel unit 401 is rewritten.

As a semiconductor used for the transistors included in the pixels pix, a Group 14 element such as silicon or germanium, a compound semiconductor such as gallium arsenide, an organic semiconductor, a metal oxide, or the like can be used. The semiconductor may be a non-single-crystal semiconductor (e.g., an amorphous semiconductor, a microcrystalline semiconductor, or a polycrystalline semiconductor) or a single crystal semiconductor.

Here, the transistors included in the pixels pix preferably contain an amorphous semiconductor, in particular, hydrogenated amorphous silicon (a-Si:H) in channel formation regions. Transistors using an amorphous semiconductor easily deal with the increase in substrate area; thus, when a large-screen display device that is compatible with 4K2K broadcasting or 8K4K broadcasting, for example, is manufactured, the manufacturing process can be simplified.

Furthermore, a transistor including a metal oxide in a channel formation region (an OS transistor) can be used as each of the transistors included in the pixels pix. An OS transistor has higher field-effect mobility than a transistor including hydrogenated amorphous silicon. In addition, an OS transistor does not require a crystallization process that has been necessary for a transistor using polycrystalline silicon or the like.

Since an OS transistor has an extremely low off-state current, in the case where an OS transistor is used as the transistor Tr31, an image signal can be held in the pixel pix for an extremely long period. This enables the update frequency of an image signal to be extremely low in a period when there is no change in the image displayed on the pixel unit 401 or a period when the change is at a certain level or lower. The update frequency of an image signal can be set less than or equal to once every 0.1 seconds, less than or equal to once every second, or less than or equal to once every 10 seconds, for example. In particular, when a large number of pixels pix are provided to be compatible with 4K2K broadcasting or 8K4K broadcasting, or the like, reducing the power consumption by skipping update of an image signal is effective.

<Structure Example 2 of Display Device>

Figure 21:
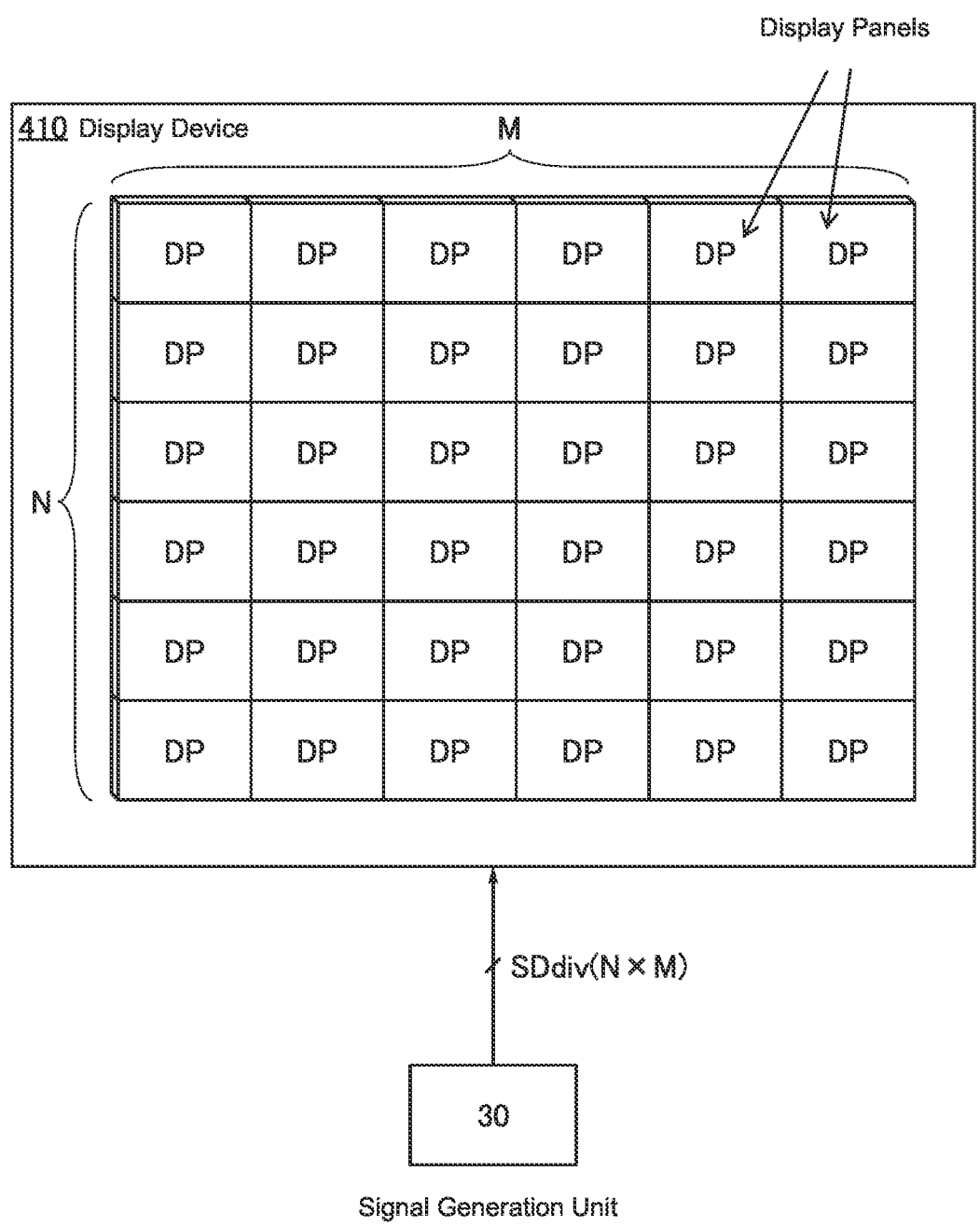
FIG. 21 A diagram illustrating a structure example of a display device.

A display device including a plurality of display panels can be used for the display unit 20. FIG. 21 illustrates a structure example of a display device 410 including a plurality of display panels DP.

The plurality of display panels DP included in the display device 410 each have a function of displaying an image on the basis of an image signal input from the signal generation unit 30 (see FIG. 1). FIG. 21 illustrates the display device 410 including the display panels DP arranged in I rows and J columns (I and J are natural numbers). Note that the display panels DP can control display independent of each other.

An image display region can be enlarged by displaying one image using the plurality of display panels DP. For example, the display unit 20 with a screen diagonal of 30 inches or more, 40 inches or more, 50 inches or more, or 60 inches or more can be obtained. A high-resolution display unit with full high definition or higher, for example, 4K2K, 8K4K, or higher can also be obtained.

In the case where an image is displayed using the plurality of display panels DP, each of the display panels DP is not necessarily large. Thus, an apparatus for manufacturing the display panels does not need to be increased in size. In addition, since an apparatus for manufacturing small- and medium-size display panels can be used, there is no need to prepare equipment for large-size display devices, which reduces manufacturing costs. In addition, a decrease in yield caused by an increase in the size of a display panel can be prevented.

The signal SD that is generated in the signal generation unit 30 is divided into I×J signals SDdiv, and the signals SDdiv are supplied to the display panels DP. Each of the display panels DP displays a predetermined image on the basis of the signal SDdiv. Thus, one image is displayed using the plurality of display panels DP.

Each of the display panels DP includes the pixel unit 401, the driver circuit 402, and the driver circuit 403 illustrated in FIG. 20(A).

In the case where the plurality of display panels DP are provided in the display device 410, the plurality of display panels DP are preferably arranged such that the display region is continuous over adjacent display panels DP. FIG. 22 illustrates a structure example and an arrangement example of the display panels DP.

Figure 22A:
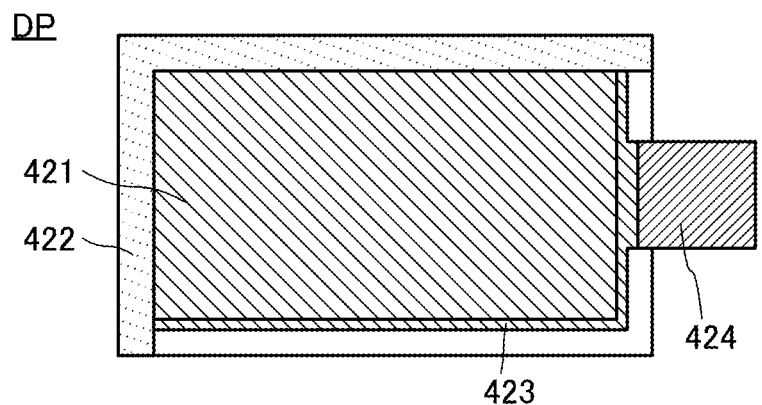
FIG. 22 Diagrams illustrating a structure example of a display panel.

The display panel DP illustrated in FIG. 22(A) includes a display region 421, and a region 422 transmitting visible light and a region 423 blocking visible light that are adjacent to the display region 421. FIG. 22(A) illustrates an example where the display panel DP is provided with an FPC (Flexible Printed Circuit) 424.

The display region 421 includes the plurality of pixels pix (not illustrated). In the region 422, for example, a pair of substrates included in the display panel DP, a sealant for sealing the display element interposed between the pair of substrates, and the like may be provided. Here, for a member provided in the region 422, a material with a visible-light-transmitting property is used. In the region 423, for example, a wiring connected to the pixels pix included in the display region 421 or the like can be provided. In addition, the driver circuit 402 or the driver circuit 403 may be provided in the region 423. Furthermore, a terminal connected to the FPC 424, a wiring connected to the terminal, or the like may be provided in the region 423.

Figure 22B:
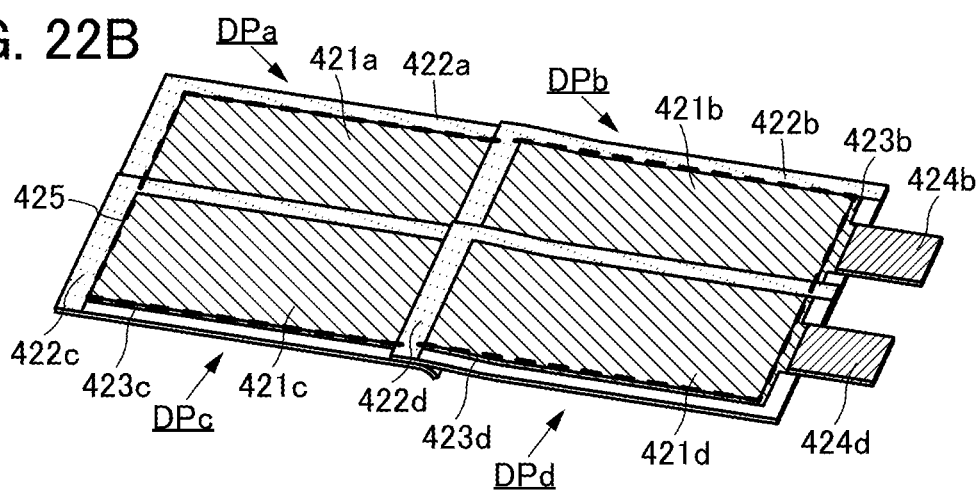
Figure 22C:
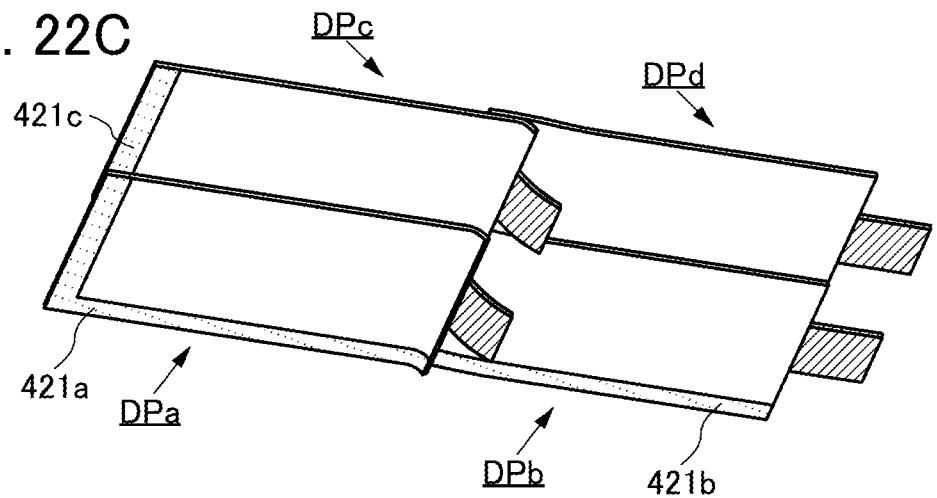

FIG. 22(B) illustrates the arrangement example of the display panels DP illustrated in FIG. 22(A). For example, four adjacent display panels DPa, DPb, DPc, and DPd are illustrated here. FIG. 22(C) is a schematic perspective view of the four display panels seen from the side opposite to the display surface side.

Each of the display panels DP is provided to have a region overlapping with the other display panels DP. Specifically, the display panels DPa, DPb, DPc, and DPd are arranged such that the region 422 transmitting visible light that is included in one display panel DP has a region overlapping with and located over the display region 421 (on the display surface side) of another display panel DP. The display panels DPa, DPb, DPc, and DPd are arranged also such that the region 423 blocking visible light that is included in one display panel DP is prevented from overlapping with and being located over the display region 421 of another display panel DP.

More specifically, a region along a short side of a display region 421*a* of the display panel DPa is provided to overlap with part of a region 422*b* of the display panel DPb. In addition, a region along a long side of the display region 421*a* of the display panel DPa is provided to overlap with part of a region 422*c* of the display panel DPc. Moreover, a region 422*d* of the display panel DPd is provided to overlap with a region along a long side of a display region 421*b* of the display panel DPb and a region along a short side of a display region 421*c* of the display panel DPc.

The region 422 transmitting visible light overlaps with and is located over the display region 421 in such a manner; thus, the whole display region 421 can be viewed from the display surface side. Thus, a region where the display regions 421*a*, 421*b*, 421*c*, and 421*d* are arranged continuously without seams can be used as a display region 425 of the display device 410.

Note that it is preferable that the pair of substrates used for the display panels DP have flexibility and the display panels DP have flexibility. Thus, as illustrated in FIGS. 22(B) and 22(C), for example, part of the display panel DPa on the FPC 424a side is curved, whereby the FPC 424a can underlap the display region 421b of the adjacent display panel DPb. As a result, the FPC 424a can be placed without physical interference with the rear surface of the display panel DPb. Furthermore, when the display panel DPa and the display panel DPb overlap with and are bonded to each other, it is not necessary to consider the thickness of the FPC 424a; thus, a difference in the height between the top surface of the region 422b of the display panel DPb and the top surface of the display region 421a of the display panel DPa can be reduced. As a result, the end portion of the display panel DPb over the display region 421a is prevented from being viewed.

Moreover, each display panel DP is made flexible, in which case the display panel DPb can be curved gently so that the top surface of the display region 421b of the display panel DPb is level with the top surface of the display region 421a of the display panel DPa. Thus, the display regions can be level with each other except in the vicinity of a region where the display panel DPa and the display panel DPb overlap with each other, and the display quality of an image displayed on the display region 425 can be improved.

Note that to reduce the step between two adjacent display panels DP, the thicknesses of the display panels DP are preferably small. For example, the thicknesses of the display panels DP are preferably less than or equal to 1 mm, further preferably less than or equal to 300 µm, still further preferably less than or equal to 100 µm.

Figure 23:
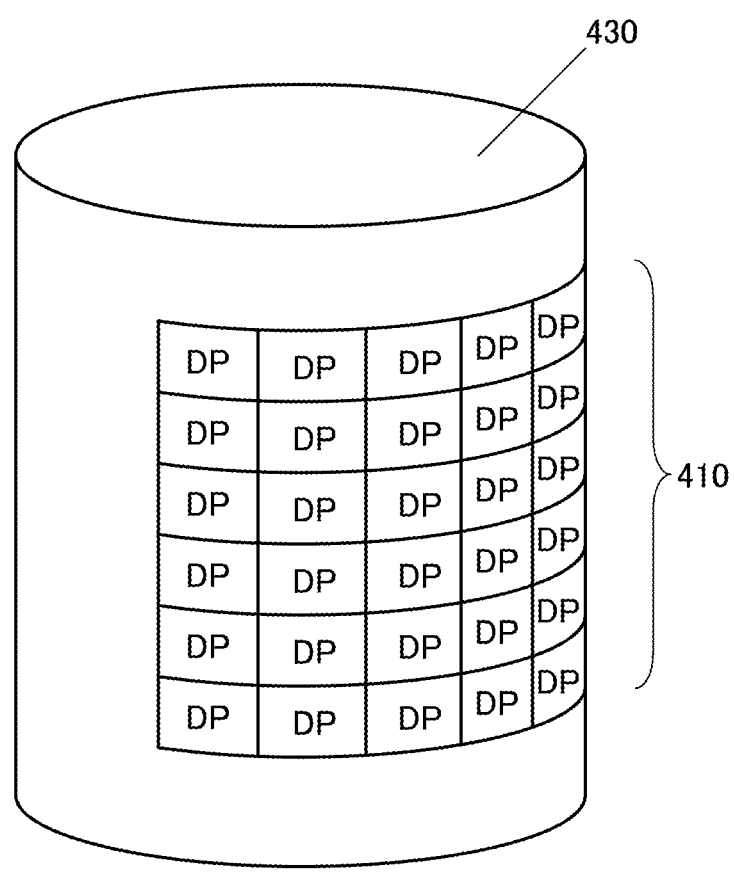
FIG. 23 A diagram illustrating a structure example of a display device.

Furthermore, when the display panels DP are made flexible, a display region that includes the plurality of display panels DP and has a curved surface can be formed. For example, as illustrated in FIG. 23, the flexible display panels DP are provided along a curved surface of a cylindrical pillar 430, whereby the display region having a curved surface can be formed.

This embodiment can be combined with the description of the other embodiments as appropriate.

Embodiment 6

In this embodiment, a specific structure example of the display device described in the above embodiment is described.

Figure 24:
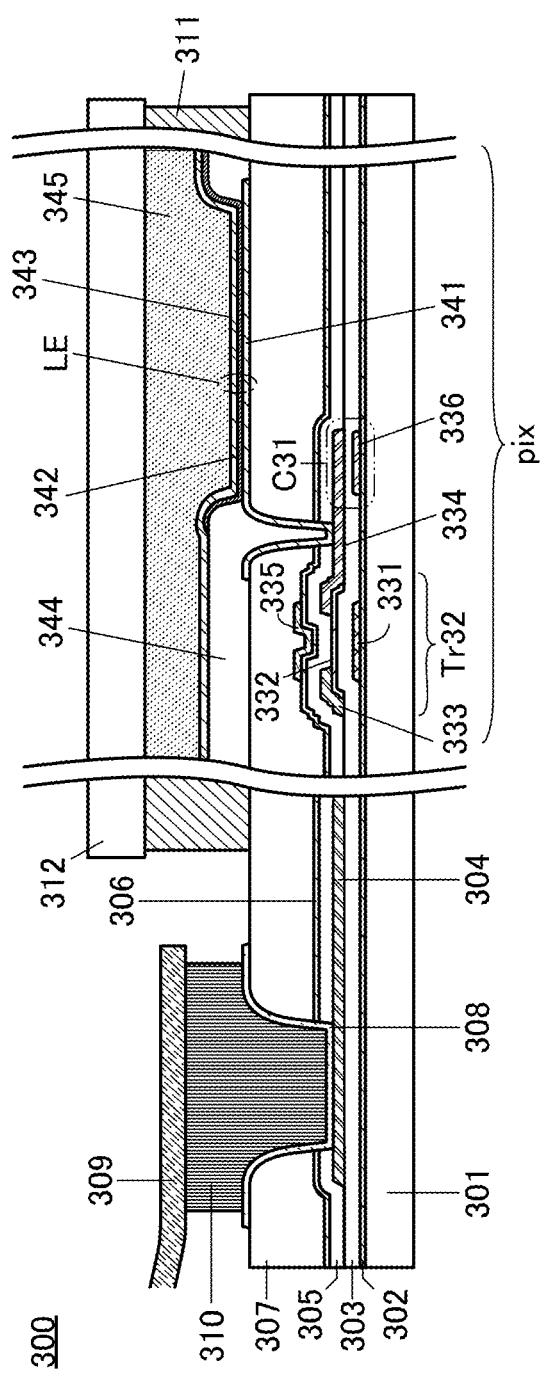
FIG. 24 A diagram illustrating a structure example of a display device.

FIG. 24 illustrates a structure example of a display device 300. The display device 300 has a function of displaying an image with the use of a light-emitting element.

The display device 300 includes an electrode 308, and the electrode 308 is connected to a terminal included in an FPC 309 via an anisotropic conductive layer 310. The electrode 308 is also connected to a wiring 304 through an opening formed in an insulating layer 307, an insulating layer 306, and an insulating layer 305. The electrode 308 is formed using the same material as that of an electrode layer 341.

The pixel pix provided over a substrate 301 includes the transistor Tr32 (see FIG. 20(B)). The transistor Tr32 is provided over an insulating layer 302. The transistor Tr32 includes an electrode 331 provided over the insulating layer 302, and an insulating layer 303 is formed over the electrode 331. A semiconductor layer 332 is provided over the insulating layer 303. An electrode 333 and an electrode 334 are provided over the semiconductor layer 332, the insulating layer 305 and the insulating layer 306 are provided over the electrode 333 and the electrode 334, and an electrode 335 is provided over the insulating layer 305 and the insulating layer 306. The electrode 333 and the electrode 334 are formed using the same material as that of the wiring 304.

In the transistor Tr32, the electrode 331 functions as a gate electrode, the electrode 333 functions as one of a source electrode and a drain electrode, the electrode 334 functions as the other of the source electrode and the drain electrode, and the electrode 335 functions as a back gate electrode.

The transistor Tr32 has a bottom gate structure and includes a back gate, which can increase the on-state current. Moreover, the threshold voltage of the transistor can be controlled. The electrode 335 may be omitted in some cases to simplify the manufacturing process.

As a semiconductor material used for the transistor, for example, a Group 14 element (silicon, germanium, or the like) or a metal oxide can be used. A semiconductor containing silicon, a semiconductor containing gallium arsenide, a metal oxide containing indium, or the like can be typically used.

Silicon can be used as a semiconductor in which a channel of the transistor is formed, for example. It is particularly preferable to use amorphous silicon as silicon. By using amorphous silicon, transistors can be formed over a large substrate in high yield, resulting in excellent mass productivity.

Alternatively, silicon having crystallinity, such as microcrystalline silicon, polycrystalline silicon, or single crystal silicon, can be used. In particular, polycrystalline silicon can be formed at a lower temperature than single crystal silicon and has higher field-effect mobility and higher reliability than amorphous silicon.

As a semiconductor in which a channel of the transistor is formed, in particular, a metal oxide having a wider band gap than silicon can also be used. A semiconductor material having a wider band gap and a lower carrier density than silicon is preferably used because the off-state current of the transistor can be reduced.

Owing to its low off-state current, a transistor using a metal oxide having a wider band gap than silicon enables long-term holding of charges stored in a capacitor that is series-connected to the transistor. The use of such a transistor in pixels allows a driver circuit to stop while the gray level of an image displayed on each display region is maintained. As a result, the display device with significantly reduced power consumption can be obtained.

The metal oxide preferably includes, for example, a material represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor using the metalloid oxide, a stabilizer is preferably contained in addition to them.

Examples of the stabilizer include gallium, tin, hafnium, aluminum, and zirconium. Other examples of the stabilizer include lanthanoid such as lanthanum, cerium, praseodymium, neodymium, samarium, europium, gadolinium, terbium, dysprosium, holmium, erbium, thulium, ytterbium, or lutetium.

As a metal oxide contained in the semiconductor layer, for example, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, In—Yb—Zn-based oxide, an In—Lu—Zn-based oxide, an In—Sn—Ga—Zn-based oxide, an In—Hf—

Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, an In—Ga—Zn-based oxide means an oxide containing In, Ga, and Zn as its main components and there is no limitation on the ratio of In to Ga and Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing costs. For example, the use of metal oxide targets with the same metal composition can reduce the manufacturing costs. In addition, the same etching gas or the same etchant can be used in processing the semiconductor layer and the conductive layer. Note that even when the semiconductor layer and the conductive layer include the same metal elements, they have different compositions in some cases. For example, a metal element in a film may be released during the manufacturing process of the transistor and the capacitor, resulting in different metal compositions.

The energy gap of the metal oxide contained in the semiconductor layer is preferably greater than or equal to 2 eV, further preferably greater than or equal to 2.5 eV, still further preferably greater than or equal to 3 eV. With the use of a metal oxide having such a wide energy gap, the off-state current of the transistor can be reduced.

In the case where the metal oxide contained in the semiconductor layer is an In-M-Zn oxide, the atomic ratio of the metal elements of a sputtering target used for forming a film of the In-M-Zn oxide preferably satisfies In≥Al and Zn≥M. As the atomic ratio of the metal elements of such a sputtering target, In:M:Zn=1:1:1, In:M:Zn=1:1:1.2, In:M:Zn=3:1:2, 4:2:4.1, and the like are preferable. Note that the atomic ratio in the formed semiconductor layer varies from the above atomic ratio of the metal elements contained in the sputtering target within a range of ±40% as an error.

A metal oxide with a low carrier density is preferably used for the semiconductor layer. For example, it is possible to use, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such a semiconductor layer has a low impurity concentration and a low density of defect states and thus has stable characteristics.

Note that without limitation to the above, a material with an appropriate composition can be used in accordance with required semiconductor characteristics and electrical characteristics (e.g., field-effect mobility and threshold voltage) of a transistor. To obtain the required semiconductor characteristics of the transistor, it is preferred that the carrier density, the impurity concentration, the defect density, the atomic ratio of a metal element to oxygen, the interatomic distance, the density, and the like of the semiconductor layer be set to appropriate values.

When silicon or carbon that is one of Group 14 elements is contained in the metal oxide contained in the semiconductor layer, oxygen vacancies are increased in the semiconductor layer, and the semiconductor layer becomes n-type in some cases. Thus, the concentration of silicon or carbon (the concentration measured by secondary ion mass spectrometry) in the semiconductor layer is preferably lower than or equal to $2\times10^{18}$ atoms/$cm^3$, further preferably lower than or equal to $2\times10^{17}$ atoms/$cm^3$.

Moreover, an alkali metal and an alkaline earth metal might generate carriers when bonded to a metal oxide, in which case the off-state current of the transistor might be increased. Therefore, the concentration of an alkali metal or an alkaline earth metal of the semiconductor layer, which is measured by secondary ion mass spectrometry, is preferably lower than or equal to $1\times10^{18}$ atoms/$cm^3$, further preferably lower than or equal to $2\times10^{16}$ atoms/$cm^3$.

The metal oxide may have a non-single-crystal structure, for example. Examples of non-single-crystal structures include a polycrystalline structure, a microcrystalline structure, and an amorphous structure. Among the non-single-crystal structures, the amorphous structure has the highest density of defect states.

A metal oxide having an amorphous structure has disordered atomic arrangement and no crystalline component, for example. Alternatively, an oxide film having an amorphous structure has, for example, a completely amorphous structure and no crystal part.

Note that the metal oxide may be a mixed film including two or more of a region having an amorphous structure, a region having a microcrystalline structure, a region having a polycrystalline structure, and a region having a single crystal structure. The mixed film has, for example, a single-layer structure or a stacked-layer structure including two or more of the above regions in some cases.

The semiconductor materials described above can be used not only in the transistor Tr32 but also in the transistor Tr31 in FIG. 20(B) and the transistor Tr33 in FIG. 20(C).

The display device 300 includes the capacitor C31. The capacitor C31 includes a region where the electrode 334 and an electrode 336 overlap with each other with the insulating layer 303 positioned therebetween. The electrode 336 is formed using the same material as that of the electrode 331.

FIG. 24 illustrates an example of a display device including, as a display element, a light-emitting element such as an EL element. EL elements are classified into organic EL elements and inorganic EL elements.

In an organic EL element, by voltage application, electrons from one electrode and holes from the other electrode are injected to the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element. Note that other than the light-emitting compound, the EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. The EL layer can be formed by an evaporation method (including a vacuum evaporation method), a transfer method, a printing method, an inkjet method, a coating method, and the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localization type light emission that utilizes inner-shell electron transition of metal ions.

FIG. 24 illustrates an example where an organic EL element is used as the light-emitting element LE.

In FIG. 24, the light-emitting element LE is connected to the transistor Tr32 provided in the pixel pix. Although the light-emitting element LE has a stacked-layer structure including the electrode layer 341, a light-emitting layer 342, and an electrode layer 343, one embodiment of the present invention is not limited to this structure. The structure of the light-emitting element LE can be changed as appropriate depending on the direction in which light is extracted from the light-emitting element LE, or the like.

A partition wall 344 is formed using an organic insulating material or an inorganic insulating material. It is particularly preferable that a photosensitive resin material be used and an opening be formed over the electrode layer 341 so that a side surface of the opening becomes an inclined surface with continuous curvature.

The light-emitting layer 342 may be composed of a single layer or a stack of a plurality of layers.

A protective layer may be formed over the electrode layer 343 and the partition wall 344 in order to prevent entry of oxygen, hydrogen, moisture, carbon dioxide, or the like into the light-emitting element LE. The protective layer can be formed using silicon nitride, silicon nitride oxide, aluminum oxide, aluminum nitride, aluminum oxynitride, aluminum nitride oxide, DLC (Diamond Like Carbon), or the like. In addition, in a space that is enclosed by the substrate 301, a substrate 312, and a sealant 311, a filler 345 is provided and sealed. It is preferable that the light-emitting element be packaged (sealed) with a protective film (e.g., a laminate film or an ultraviolet curable resin film) or a cover member in this manner with high air-tightness and little degasification so that the light-emitting element is not exposed to the outside air.

As the filler 345, an ultraviolet curable resin or a thermosetting resin as well as an inert gas such as nitrogen or argon can be used; for example, PVC (polyvinyl chloride), an acrylic resin, polyimide, an epoxy resin, a silicone resin, PVB (polyvinyl butyral), or EVA (ethylene vinyl acetate) can be used. A drying agent may be contained in the filler 345.

A glass material such as a glass frit or a resin material such as a curable resin that is curable at room temperature, such as a two-component-mixture-type resin, a light curable resin, and a thermosetting resin can be used for the sealant 311. A drying agent may be contained in the sealant 311.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on a surface to reduce the glare can be performed.

When the light-emitting element has a microcavity structure, light with high color purity can be extracted. Furthermore, when a microcavity structure and a color filter are used in combination, the glare can be reduced and visibility of a display image can be increased.

For the electrode layer 341 and the electrode layer 343, it is possible to use a conductive material with a light-transmitting property, such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The electrode layer 341 and the electrode layer 343 can be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; or metal nitrides thereof.

The electrode layer 341 and the electrode layer 343 can be formed using a conductive composition containing a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element LE to the outside, at least one of the electrode layer 341 and the electrode layer 343 is transparent. In accordance with how to extract light, the structures of display devices are classified into a top emission structure, a bottom emission structure, and a dual emission structure. In the top emission structure, light is extracted from the substrate 312 side. In the bottom emission structure, light is extracted from the substrate 301 side. In the dual emission structure, light is extracted from both the substrate 312 side and the substrate 301 side. In the case of the top emission structure, for example, the electrode layer 343 is transparent. In the case of the bottom emission structure, for example, the electrode layer 341 is transparent. In the case of the dual emission structure, for example, the electrode layer 341 and the electrode layer 343 are transparent.

Figure 25:
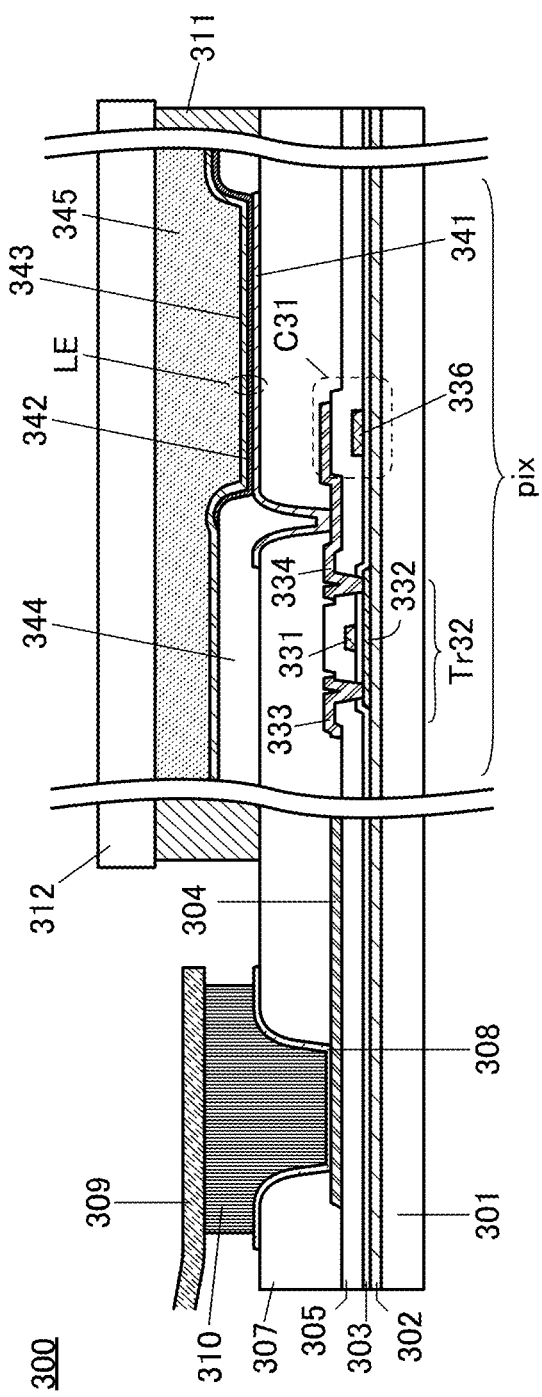
FIG. 25 A diagram illustrating a structure example of a display device.

FIG. 25 illustrates a cross-sectional view in which a top-gate transistor is provided as the transistor Tr32 illustrated in FIG. 24. In the transistor Tr32 in FIG. 25, the electrode 331 functions as a gate electrode, the electrode 333 functions as one of a source electrode and a drain electrode, and the electrode 334 functions as the other of the source electrode and the drain electrode.

For the details of the other components in FIG. 25, refer to the description of FIG. 24.

In the case where a light-emitting element is used as the display element as illustrated in FIG. 24 and FIG. 25, the display device 300 can be referred to as a light-emitting device. Although the case where a light-emitting element is used as the display element is described in this embodiment, a liquid crystal element can be used as the display element as illustrated in FIG. 20(C).

This embodiment can be combined with the description of the other embodiments as appropriate.

Embodiment 7

In this embodiment, a specific structure example of the display de vice described in the above embodiment is described.

The display device of this embodiment has a function of displaying an image with the use of a light-emitting element. In this embodiment, in particular, an example where a micro LED is used as the light-emitting element is described. Note that in this embodiment, a micro LED having a double heterojunction is described. Note that one embodiment of the present invention is not limited thereto, and a micro LED having a quantum well junction may be used.

When a micro LED is used as the display element, the power consumption of a display device can be reduced. Furthermore, the display device can be thinner and more lightweight. Moreover, the display device using the micro LED as the display element has high contrast and a wide viewing angle; thus, the display quality can be improved.

The area of a light-emitting region of a micro LED is preferably less than or equal to 1 mm$^2$, further preferably less than or equal to 10000 μm$^2$, still further preferably less than or equal to 3000 μm$^2$, even further preferably less than or equal to 700 μm$^2$.

FIG. 26(A1) illustrates a cross-sectional view of a display device 350A. FIG. 26(A2) illustrates an enlarged view of a light-emitting element LE1 and the vicinity thereof in the display device 350A.

FIG. 26(B1) illustrates a cross-sectional view of a display device 350B. FIG. 26(B2) illustrates an enlarged view of a light-emitting element LE2 and the vicinity thereof in the display device 350B.

FIG. 27(A1) illustrates a cross-sectional view of a display device 350C. FIG. 27(A2) illustrates an enlarged view of a light-emitting element LE3 and the vicinity thereof in the display device 350C.

FIG. 27(B) illustrates a cross-sectional view of a display device 350D. A light-emitting element LE4 included in the display device 350D has a structure similar to that of the light-emitting element LE2; thus, an enlarged view and the detailed description thereof are omitted.

Note that the description of Embodiment 6 can be referred to for the components of the display device of this embodiment, which are similar to those in FIG. 24 or FIG. 25; therefore, the detailed description is omitted in some cases. For example, the structure of the display device of this embodiment except the pixel pix is similar to that in FIG. 24 or FIG. 25; therefore, the description of Embodiment 6 can be referred to.

The transistor Tr32 and the capacitor C31 included in the pixel pix in the display device of this embodiment are similar to those in FIG. 24 or FIG. 25; therefore, the description of Embodiment 6 can be referred to. In particular, in the display device of this embodiment, a channel formation region of the transistor Tr32 preferably includes a metal oxide. As described above, a transistor including a metal oxide can have low power consumption. Thus, a combination with a micro LED can achieve a display device with significantly reduced power consumption.

Hereinafter, the structures of the light-emitting elements and their vicinities in the drawings are described in detail.

The light-emitting element LE1 illustrated in FIG. 26(A1) and FIG. 26(A2) includes an electrode 361, a clad layer 372, an active layer 373, a clad layer 374, and an electrode 363.

The electrode 361 is electrically connected to an electrode 351 through a bonding layer 371. The electrode 351 is electrically connected to the electrode 334 included in the transistor Tr32. That is, the electrode 361 functions as a pixel electrode. The bonding layer 371 is preferably formed using a material having high conductivity.

The electrode 363 is electrically connected to an electrode 353 through the bonding layer 371. The electrode 351 and the electrode 353 are electrically insulated from each other by the partition walls 344. The electrode 363 functions as a common electrode.

The active layer 373 is sandwiched between the clad layer 372 and the clad layer 374. In the active layer 373, electrons and holes are bonded to emit light. That is, the active layer 373 can be referred to as a light-emitting layer. One of the clad layer 372 and the clad layer 374 is an n-type clad layer, and the other is a p-type clad layer. The stacked-layer structure including the clad layer 372, the active layer 373, and the clad layer 374 is formed to emit light of red, yellow, green, blue, or the like. For example, for the stacked-layer structure, a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like can be used. When the above-described stacked-layer structure including the clad layer 372, the active layer 373, and the clad layer 374 is formed to emit light of red, yellow, green, blue, or the like, a step of forming a coloring film such as a color filter is not necessary. Consequently, the manufacturing costs of display devices can be reduced.

The light-emitting element LE1 may be fixed to the partition wall 344 with a sealant 346. This can prevent display defects or the like of the light-emitting element LE1.

The light-emitting element LE1 illustrated in FIG. 26(A1) and FIG. 26(A2) has a bottom emission structure and emits light to the substrate 301 side. Thus, the electrode 351, the bonding layer 371, the electrode 353, the electrode 361, and the electrode 363 are each formed using a conductive material that transmits visible light.

For example, the light-emitting element LE1 is formed over a carrier substrate and transferred from the carrier substrate to the substrate 301 (specifically, over the electrode 351, the electrode 353, and the partition wall 344). The light-emitting elements LE1 may be formed over different carrier substrates for the respective colors and transferred to the substrate 301. Alternatively, a plurality of light-emitting elements LE1 that emit light of respective different colors may be formed over one carrier substrate, and then the plurality of light-emitting elements LE1 may be collectively transferred to the substrate 301.

The light-emitting element LE2 illustrated in FIG. 5(B1) and FIG. 26(B2) includes the electrode 361, the clad layer 372, the active layer 373, the clad layer 374, and an electrode 362. As illustrated in FIG. 26(31), a plurality of light-emitting elements may be electrically connected to one transistor Tr32.

The electrode 361 is electrically connected to the electrode 351 through the bonding layer 371. The electrode 351 is electrically connected to the electrode 334 included in the transistor Tr32. That is, the electrode 361 functions as a pixel electrode.

The electrode 362 is electrically connected to an electrode 357 through the electrode 353. The electrode 351 and the electrode 357 are electrically insulated from each other by an insulating layer 355. The electrode 351 and the electrode 353 are electrically insulated from each other by an insulating layer 356. The electrode 362 functions as a common electrode.

The active layer 373 is sandwiched between the clad layer 372 and the clad layer 374.

The light-emitting element LE2 illustrated in FIG. 26(B1) and FIG. 26(B2) has a top emission structure and emits light to the substrate 312 side. Thus, the electrode 362 and the electrode 353 are each formed using a conductive material that transmits visible light. Since the electrode 351, the electrode 357, and the electrode 361 do not necessarily have light-transmitting properties, the electrodes can be formed using a metal material that blocks visible light. Furthermore, the transistor Tr32 or the capacitor C31 can be provided to overlap with the light-emitting element LE2; thus, an aperture ratio can be increased.

For example, the light-emitting element LE2 is formed over the carrier substrate and transferred from the carrier substrate to the substrate 301 (specifically, over the electrode 351, the electrode 357, and the insulating layer 355). After the transfer, forming the electrode 353 over the light-emitting element LE2 makes it possible to electrically connect the electrode 362 to the electrode 357.

The light-emitting element LE3 illustrated in FIG. 27(A1) and FIG. 27(A2) includes the electrode 361, the clad layer 372, the active layer 373, the clad layer 374, and the electrode 363.

The electrode 361 is electrically connected to the electrode 351 through the bonding layer 371. The electrode 351 is electrically connected to the electrode 334 included in the transistor Tr32. That is, the electrode 361 functions as a pixel electrode.

The electrode 363 is electrically connected to the electrode 353 through the bonding layer 371. The electrode 351 and the electrode 353 are electrically insulated from each other by the partition walls 344. The electrode 363 functions as a common electrode.

The active layer 373 is sandwiched between the clad layer 372 and the clad layer 374.

In the light-emitting element LE3, the electrode 361 and the electrode 363 are formed using different materials. The clad layer 372 and the active layer 373 overlap with the electrode 361 and do not overlap with the electrode 363.

The light-emitting element LE3 has a bottom emission structure and emits light to the substrate 301 side. Thus, the electrode 351, the bonding layer 371, and the electrode 361 are each formed using a conductive material that transmits visible light. Since the electrode 363 does not overlap with a light-emitting region of the light-emitting element LE3, the electrode 363 does not necessarily have a light-transmitting property.

The light-emitting element LE4 illustrated in FIG. 27(B) has a structure similar to that of the light-emitting element LE2. As illustrated in FIG. 27(B), one light-emitting element may be electrically connected to one transistor Tr32.

As described above, the display device of this embodiment uses a micro LED as the display element. Thus, a display device with low power consumption and high display quality can be provided. In addition, a combination with the semiconductor device of one embodiment of the present invention enables a stereoscopic image to be displayed with high quality and low power consumption.

This embodiment can be combined with the description of the other embodiments as appropriate.

Embodiment 8

In this embodiment, a metal oxide that can be used for the OS transistor described in the above embodiment is described. In particular, the details of a metal oxide and a CAC (Cloud-Aligned Composite)-OS are described below.

A CAC-OS or a CAC-metal oxide has a conducting function in a part of the material and an insulating function in a part of the material, and has a function of a semiconductor as the whole material. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. When carriers flow in this composition, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be called a matrix composite or a metal matrix composite.

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed in a metal oxide and regions including the metal element(s) are mixed with a size greater than or equal to 0.5 nm and less than or equal to 10 nm, preferably greater than or equal to 1 nm and less than or equal to 2 nm, or a similar size is hereinafter referred to as a mosaic pattern or a patch-like pattern.

Note that a metal oxide preferably contains at least indium. In particular, indium and zinc are preferably contained. Moreover, in addition to them, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide with the CAC-OS composition may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a structure formed of two layers of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is intentionally not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRT) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanometer-sized electron beam), a ring-like high-luminance region and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that an In—Ga—Zn oxide with the CAC-OS composition has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has properties different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component has higher conductivity than a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, cloud-like distribution of regions including $In_{X2}Zn_{Y2}O_{Z2}$ or $InO_{X1}$ as a main component in an oxide semiconductor can achieve high field-effect mobility (μ).

In contrast, a region including $GaO_{X3}$ or the like as a main component has a higher insulating property than a region including $In_{X2}Zn_{Y2}O_{Z2}$ or $InO_{X1}$ as a main component. In other words, distribution of regions including $GaO_{X3}$ or the like as a main component in an oxide semiconductor can reduce leakage current and achieve favorable switching operation.

Accordingly, when the CAC-OS is used for a semiconductor element, the insulating property derived from $GaO_{X3}$ or the like and the conductivity derived from $In_{X2}Zn_{Y2}O_{X2}$ or $InO_{X1}$ complement each other, whereby high on-state current ($I_{on}$) and high field-effect mobility (μ) can be achieved.

Moreover, a semiconductor element using the CAC-OS has high reliability. Thus, the CAC-OS is most suitable for a variety of semiconductor devices.

This embodiment can be combined with the description of the other embodiments as appropriate.

Embodiment 9

In this embodiment, electronic devices of embodiments of the present invention are described with reference to drawings.

The display unit 20 and the signal generation unit 30 described in the above embodiment can be installed in the electronic devices illustrated as examples below. Thus, an electronic device that can display a stereoscopic image can be provided.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of one embodiment of the present invention may include an antenna. When a signal is received by the antenna, the electronic device can display an image, information, or the like on a display unit. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, it can have a function of displaying a variety of information (a still image, a moving image, a text image, and the like) on the display unit, a touch panel function, a function of displaying a calendar, date, time, and the like, a function of executing a variety of software (programs), a wireless communication function, and a function of reading out a program or data stored in a recording medium.

Figure 28A:
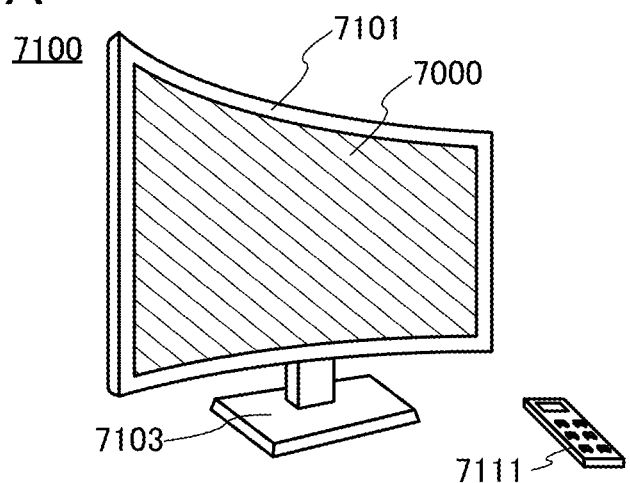
FIG. 28 Diagrams illustrating structure examples of electronic devices.

FIG. 28(A) illustrates an example of a television device. In a television device 7100, a display unit 7000 is incorporated in a housing 7101. Here, a structure in which the housing 7101 is supported by a stand 7103 is illustrated.

The display unit of one embodiment of the present invention can be used as the display unit 7000.

The television device 7100 illustrated in FIG. 28(A) can be operated with an operation switch provided in the housing 7101 or a separate remote controller 7111. Alternatively, the display unit 7000 may include a touch sensor, and the television device 7100 can be operated by touch on the display unit 7000 with a finger or the like. The remote controller 7111 may be provided with a display unit for displaying information output from the remote controller 7111. With operation keys or a touch panel provided in the remote controller 7111, channels and volume can be operated and images displayed on the display unit 7000 can be operated.

Note that the television device 7100 is provided with a receiver, a modem, and the like. A general television broadcast can be received with the receiver. Furthermore, when the television device is connected to a communication network with or without wires via the modem, one-way (from a transmitter to a receiver) or two-way (between a transmitter and a receiver or between receivers, for example) data communication can be performed.

Figure 28B:
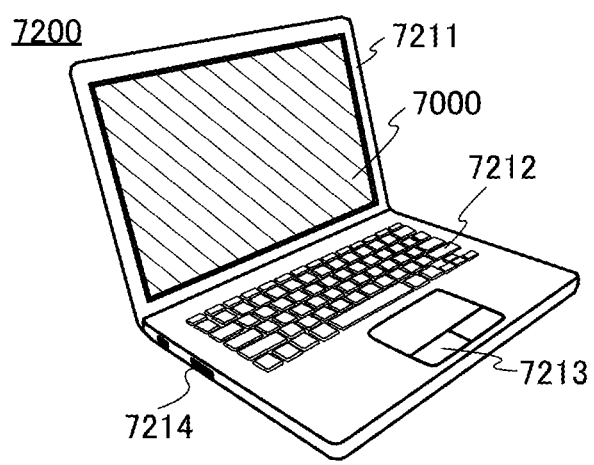

FIG. 28(B) illustrates a laptop personal computer 7200. The laptop personal computer 7200 includes a housing 7211, a keyboard 7212, a pointing device 7213, an external connection port 7214, and the like. In the housing 7211, the display unit 7000 is incorporated.

The display unit of one embodiment of the present invention can be used as the display unit 7000.

Figure 29A:
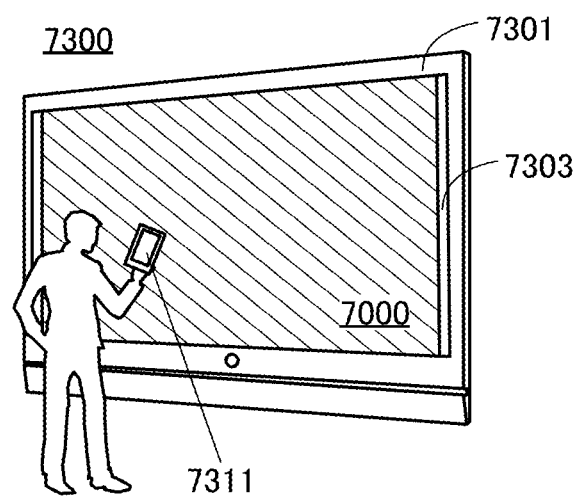
FIG. 29 Diagrams illustrating structure examples of electronic devices.
Figure 29B:
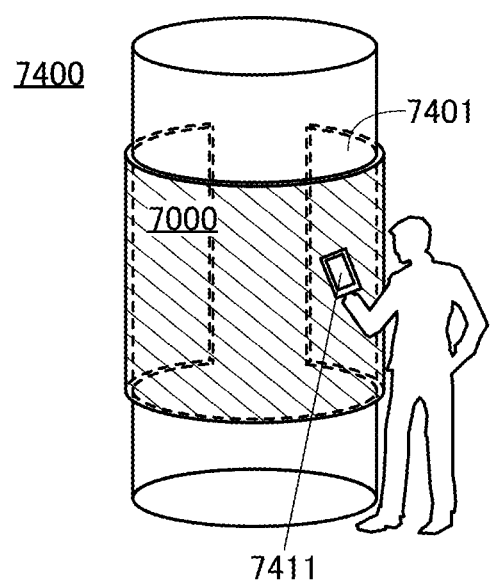

FIGS. 29(A) and 29(B) illustrate examples of digital signage.

Digital signage 7300 illustrated in FIG. 29(A) includes a housing 7301, the display unit 7000, a speaker 7303, and the like. Furthermore, the digital signage can include an LED lamp, operation keys (including a power switch or an operation switch), a connection terminal, a variety of sensors, a microphone, and the like.

FIG. 29(B) is digital signage 7400 attached to a cylindrical pillar 7401. The digital signage 7400 includes the display unit 7000 provided along a curved surface of the pillar 7401.

The display unit of one embodiment of the present invention can be used as the display unit 7000 in FIGS. 29(A) and 29(B).

A larger area of the display unit 7000 can increase the amount of information that can be provided at a time. In addition, the larger display unit 7000 attracts more attention, so that the effectiveness of the advertisement can be increased, for example.

It is preferable to use a touch panel for the display unit 7000 because not only an image or a moving image is displayed on the display unit 7000 but also users can operate intuitively. Moreover, for an application for providing information such as route information or traffic information, usability can be enhanced by intuitive operation.

Furthermore, as illustrated in FIGS. 29(A) and 29(B), it is preferable that the digital signage 7300 or the digital signage 7400 work with an information terminal 7311 or an information terminal 7411 such as a user's smartphone through wireless communication. For example, information of an advertisement displayed on the display unit 7000 can be displayed on a screen of the information terminal 7311 or the information terminal 7411. Moreover, by operation of the information terminal 7311 or the information terminal 7411, display on the display unit 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 30:
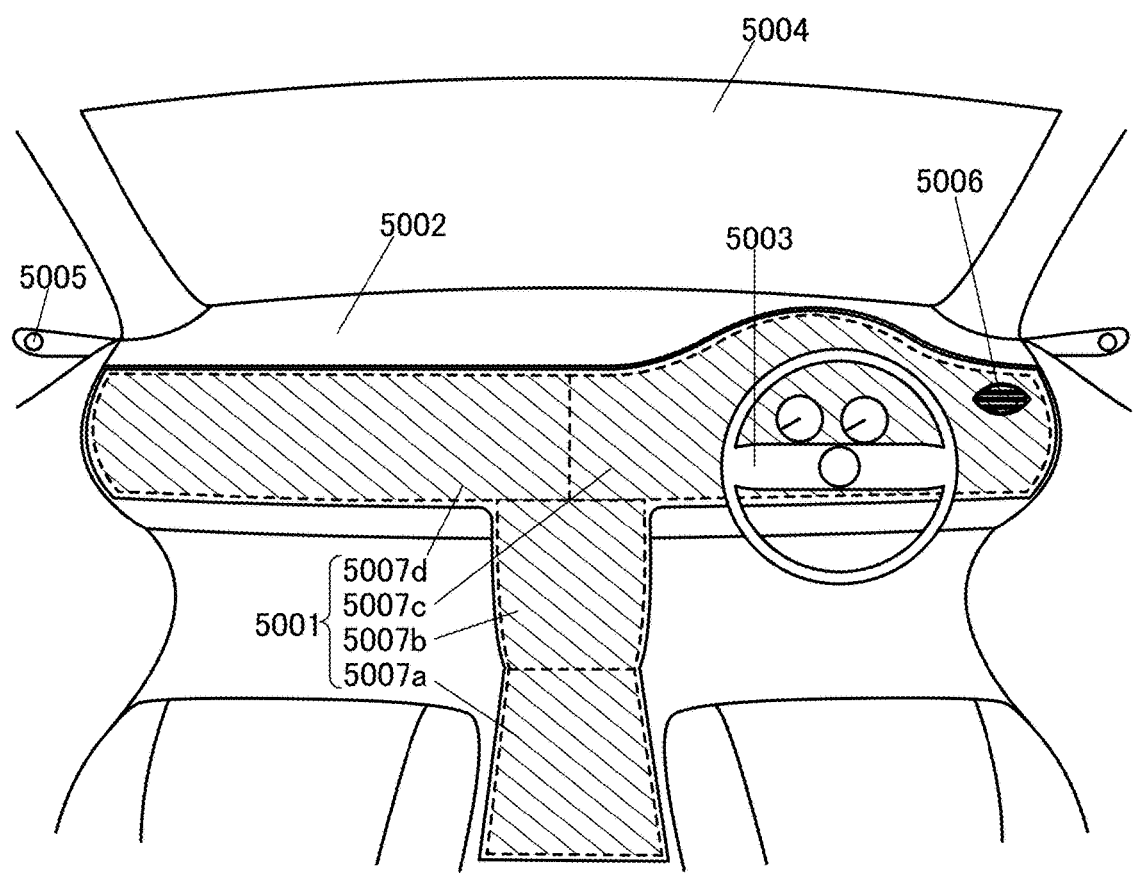
FIG. 30 A diagram illustrating a structure example of a vehicle.

The display system of one embodiment of the present invention can be incorporated along a curved surface of an inside wall or an outside wall of a house or a building or the interior or the exterior of a vehicle. FIG. 30 illustrates an example of installation of the display system of one embodiment of the present invention in a vehicle.

FIG. 30 illustrates a structure example of a vehicle equipped with a display unit 5001. As the display unit 5001, a display unit in the display system of one embodiment of the present invention can be used. Note that although in the example illustrated in FIG. 30, the display unit 5001 is installed in, but not limited to, a right-hand drive vehicle; installation in a left-hand drive vehicle is possible. In that case, the left and right of the components arranged in FIG. 30 are reversed.

FIG. 30 illustrates a dashboard 5002, a steering wheel 5003, a windshield 5004, and the like that are arranged around a driver's seat and a front passenger's seat. The display unit 5001 is placed in a predetermined position in the dashboard 5002, specifically, around the driver, and has a substantially T shape. Although one display unit 5001 formed of a plurality of display panels 5007 (display panels 5007a, 5007b, 5007c, and 5007d) is provided along the dashboard 5002 in the example illustrated in FIG. 30, the display unit 5001 may be divided and placed in a plurality of places.

Note that the plurality of display panels 5007 may have flexibility. In this case, the display unit 5001 can be processed into a complicated shape; for example, a structure in which the display unit 5001 is provided along a curved surface of the dashboard 5002 or the like or a structure in which a display region of the display unit 5001 is not provided at a connection portion of the steering wheel, display units of meters, a ventilation duct 5006, or the like can easily be achieved.

In addition, a plurality of cameras 5005 that take pictures of the situations at the rear side may be provided outside the vehicle. Although the camera 5005 is provided instead of a side mirror in the example in FIG. 30, both the side mirror and the camera may be provided.

As the camera 5005, a CCD camera, a CMOS camera, or the like can be used. In addition, an infrared camera may be used in combination with such a camera. The infrared camera whose output level increases as the temperature of the object increases can detect or extract a living body such as a human or an animal.

An image captured with the camera 5005 can be output to any one or more of the display panels 5007. This display unit 5001 is mainly used for supporting driving of the vehicle. An image of the situation on the rear side is taken at a wide angle of view by the camera 5005, and the image is displayed on the display panels 5007 so that the driver can see a blind area for avoiding an accident.

Furthermore, a distance image sensor may be provided over a roof of the vehicle, for example, so that an image obtained by the distance image sensor may be displayed on the display unit 5001. For the distance image sensor, an image sensor, LIDAR (Light Detection and Ranging), or the like can be used. An image obtained by the image sensor and the image obtained by the distance image sensor are displayed on the display unit 5001, whereby more information can be provided to the driver to support driving.

The display unit 5001 may also have a function of displaying map information, traffic information, television images, DVD images, and the like. For example, map information can be displayed on the display panels 5007a, 5007b, 5007c, and 5007d as a large display screen. Note that the number of display panels 5007 can be increased depending on the image to be displayed.

Furthermore, the image displayed on the display panels 5007a, 5007b, 5007c, and 5007d can be freely set to meet the driver's preference. For example, television images or DVD images are displayed on the display panel 5007d on the left, map information is displayed on the display panel 5007b at the center position, meters are displayed on the display panel 5007c on the right, and audio information and the like are displayed on the display panel 5007a near a transmission gear (between the driver's seat and the front passenger's seat). In addition, a combination of the plurality of display panels 5007 can add a fail-safe function to the display unit 5001. For example, even when any one of the display panels 5007 is broken for any reason, a display region can be changed so that display can be performed using another display panel 5007.

This embodiment can be combined with the description of the other embodiments as appropriate.

REFERENCE NUMERALS 10 display system
20 display unit
30 signal generation unit
40 arithmetic unit
100 arithmetic device
110 processing device
111 arithmetic unit
112 memory unit
113 transmission path
114 interface
120 input/output device
121 display unit
122 operation unit
123 input/output unit
124 communication unit
200 semiconductor device
210 memory circuit
220 reference memory circuit
230 circuit
240 circuit
250 current supply circuit
300 display device
301 substrate
302 insulating layer
303 insulating layer
304 wiring
305 insulating layer
306 insulating layer
307 insulating layer
308 electrode
309 FPC
310 anisotropic conductive layer
311 sealant
312 substrate
331 electrode
332 semiconductor layer
333 electrode
334 electrode
335 electrode
336 electrode
341 electrode layer
342 light-emitting layer
343 electrode layer
344 partition wall
345 filler
350A display device
350B display device
350C display device
350D display device
351 electrode
353 electrode
355 insulating layer
356 insulating layer
357 electrode
361 electrode
362 electrode
363 electrode
400 display device
401 pixel unit
402 driver circuit
403 driver circuit
410 display device
421 display region
422 region
423 region
424 FPC
425 display region
430 pillar
801 transistor
811 insulating layer
812 insulating layer 813 insulating layer
814 insulating layer
815 insulating layer
816 insulating layer
817 insulating layer
818 insulating layer
819 insulating layer
820 insulating layer
821 metal oxide film
822 metal oxide film
822n region
823 metal oxide film
824 metal oxide film
830 oxide layer
850 conductive layer
851 conductive layer
852 conductive layer
853 conductive layer
860 semiconductor device
870 single crystal silicon water
871 CMOS layer
872 transistor layer
873 gate electrode
874 electrode
875 electrode
5001 display unit
5002 dashboard
5003 steering wheel
5004 windshield
5005 camera
5006 ventilation duct
5007 display panel
7000 display unit
7100 television device
7101 housing
7103 stand
7111 remote controller
7200 laptop personal computer
7211 housing
7212 keyboard
7213 pointing device
7214 external connection port
7300 digital signage
7301 housing
7303 speaker
7311 information terminal
7400 digital signage
7401 pillar
7411 information terminal

The invention claimed is:

1. A semiconductor device comprising:
a first obtaining unit comprising a first circuit;
a second obtaining unit comprising a second circuit;
a selection unit; and
a correction unit comprising a third circuit,
wherein the first obtaining unit is configured to obtain first information on a scene of an image,
wherein the second obtaining unit is configured to obtain second information on a depth of an image,
wherein the selection unit is configured to select a depth map suitable for an emphasis of a stereoscopic effect of an image on a basis of the first information and the second information,
wherein the correction unit is configured to correct image data on a basis of the depth map,
wherein the selection unit comprises a neural network,
wherein the second information is input to an input layer of the neural network, and
wherein a selection result of the depth map is output from an output layer of the neural network.

2. The semiconductor device according to claim 1,
wherein the first obtaining unit is configured to obtain the first information using machine learning, and
wherein the second obtaining unit is configured to obtain the second information using machine learning.

3. The semiconductor device according to claim 1,
wherein the correction unit comprises a conversion unit and an emphasis unit,
wherein the conversion unit comprises a fourth circuit,
wherein the emphasis unit comprises a fifth circuit,
wherein the correction unit is configured to correct the image data, and
wherein the emphasis unit is configured to perform processing for emphasizing a stereoscopic effect on the image data corrected by the correction unit.

4. The semiconductor device according to claim 1,
wherein the neural network comprises a product-sum operation element,
wherein the product-sum operation element comprises a memory circuit comprising a first transistor, a second transistor, and a capacitor,
wherein one of a source and a drain of the first transistor is electrically connected to a gate of the second transistor and the capacitor, and
wherein the first transistor comprises a metal oxide in a channel formation region.

5. A display system comprising:
a signal generation unit comprising the semiconductor device according to claim 1; and
a display unit,
wherein the signal generation unit is configured to generate an image signal using the corrected image data, and
wherein the display unit is configured to display an image on a basis of the image signal.

6. The display system according to claim 5,
wherein the display unit comprises a display panel, and
wherein the display panel has flexibility.

7. An electronic device comprising the display system according to claim 6.

8. A display system comprising:
a display unit; and
a signal generation unit comprising a semiconductor device, the semiconductor device comprising:
a first obtaining unit comprising a first circuit;
a second obtaining unit comprising a second circuit; and
a selection unit,
wherein the first obtaining unit is configured to obtain first information on a scene of an image,
wherein the second obtaining unit is configured to obtain second information on a depth of an image,
wherein the selection unit is configured to select a depth map suitable for an emphasis of a stereoscopic effect of an image on a basis of the first information and the second information,
wherein the selection unit comprises a neural network,
wherein the display unit comprises a display panel,
wherein the display panel comprises a display element and a first transistor,
wherein the display element is electrically connected to the first transistor, wherein the display element comprises a micro light-emitting diode, wherein the first transistor comprises a metal oxide in a channel formation region, wherein the signal generation unit is configured to correct image data and generate an image signal using the corrected image data, and wherein the display unit is configured to display an image on a basis of the image signal.

9. The display system according to claim 8, wherein the semiconductor device further comprises a correction unit, wherein the correction unit comprising a third circuit, wherein the correction unit is configured to correct image data on a basis of the depth map, wherein the second information is input to an input layer of the neural network, and wherein a selection result of the depth map is output from an output layer of the neural network.

10. The display system according to claim 9, wherein the first obtaining unit is configured to obtain the first information using machine learning, and wherein the second obtaining unit is configured to obtain the second information using machine learning.

11. The display system according to claim 9, wherein the correction unit comprises a conversion unit and an emphasis unit, wherein the conversion unit comprises a fourth circuit, wherein the emphasis unit comprises a fifth circuit, and wherein the emphasis unit is configured to perform processing for emphasizing a stereoscopic effect on the image data corrected by the correction unit.

12. The display system according to claim 9, wherein the neural network comprises a product-sum operation element, wherein the product-sum operation element comprises a memory circuit comprising a third transistor, a fourth transistor, and a capacitor, wherein one of a source and a drain of the third transistor is electrically connected to a gate of the fourth transistor and the capacitor, and wherein the third transistor comprises a metal oxide in a channel formation region.

13. The display system according to claim 8, wherein the display panel has flexibility.

14. A display system comprising:

a display unit; and a signal generation unit comprising a semiconductor device, the semiconductor device comprising:

a first obtaining unit comprising a first circuit;

a second obtaining unit comprising a second circuit; and a selection unit, wherein the first obtaining unit is configured to obtain first information on a scene of an image, wherein the second obtaining unit is configured to obtain second information on a depth of an image, wherein the selection unit is configured to select a depth map suitable for an emphasis of a stereoscopic effect of an image on a basis of the first information and the second information, wherein the selection unit comprises a neural network, wherein the display unit comprises a display panel, wherein the display panel comprises a display element, wherein the display element comprises a micro light-emitting diode, wherein the signal generation unit comprises a first transistor, wherein the first transistor comprises a metal oxide in a channel formation region, wherein the signal generation unit is configured to correct image data and generate an image signal using the corrected image data, and wherein the display unit is configured to display an image on a basis of the image signal.

15. The display system according to claim 14, wherein the display panel further comprises a second transistor, wherein the display element is electrically connected to the first transistor, and wherein the first transistor comprises a metal oxide in a channel formation region.

* * * * *